US012717245B2

(12) United States Patent
Sugiyama et al.

(10) Patent No.: US 12,717,245 B2
(45) Date of Patent: Aug. 25, 2026

(54) INSPECTION METHOD, METHOD FOR PRODUCING COMPOSITION, AND METHOD FOR VERIFYING COMPOSITION

(71) Applicant: FUJIFILM Corporation, Tokyo (JP)

(72) Inventors: Shinichi Sugiyama, Haibara-gun (JP); Takashi Nakamura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 604 days.

(21) Appl. No.: 18/310,573

(22) Filed: May 2, 2023

(65) Prior Publication Data

US 2023/0266675 A1 Aug. 24, 2023

Related U.S. Application Data

(63) Continuation of application No. PCT/JP2021/039129, filed on Oct. 22, 2021.

(30) Foreign Application Priority Data

Nov. 11, 2020 (JP) ................................ 2020-188141
Feb. 26, 2021 (JP) ................................ 2021-030205
Jul. 1, 2021 (JP) ................................ 2021-109874

(51) Int. Cl.
*G03F 7/00* (2006.01)
*G03F 7/039* (2006.01)
*H10P 76/20* (2026.01)

(52) U.S. Cl.
CPC ........ *G03F 7/70608* (2013.01); *G03F 7/0397* (2013.01); *G03F 7/70681* (2023.05); *H10P 76/204* (2026.01)

(58) Field of Classification Search
CPC ........... G03F 7/42; G03F 7/70608; G03F 7/38
See application file for complete search history.

(56) References Cited

U.S. PATENT DOCUMENTS 6,420,076 B1 7/2002 Fukumto
2008/0085480 A1* 4/2008 Vereecke ................ G03F 7/428 430/329
2010/0118302 A1 5/2010 Moriya et al.
2013/0258330 A1 10/2013 Maekawa et al.
2021/0005473 A1 1/2021 Kamimura et al.
2021/0327678 A1 10/2021 Maas et al.

FOREIGN PATENT DOCUMENTS

JP 60-177624 A 9/1985
JP 7-280739 A 10/1995
JP 2003-031488 A 1/2003
JP 2010-118550 A 5/2010
JP 2013-117542 A 6/2013
JP WO2016153052 A1 9/2016
KR 10-2020-0125650 A 11/2020
TW 423091 B 2/2001
TW 202011114 A 3/2020
TW 202024802 A 7/2020

OTHER PUBLICATIONS

Communication issued Feb. 14, 2025 in Korean Patent Application No. 10-2023-7015638.
International Search Report dated Jan. 11, 2022, issued in International Application No. PCT/JP2021/039129.
Written Opinion dated Jan. 11, 2022, issued in International Application No. PCT/JP2021/039129.
International Preliminary Report on Patentability (with translation of Written Opinion) dated May 16, 2023, issued in International Application No. PCT/JP2021/039129.
Communication dated Jul. 31, 2025 in Taiwanese Application No. 110140135.
Communication dated Sep. 30, 2025 in Japanese Application No. 2022-561372.

* cited by examiner

*Primary Examiner* — Daborah Chacko-Davis
(74) *Attorney, Agent, or Firm* — Sughrue Mion, PLLC

(57) ABSTRACT

Provided is an inspection method for simply measuring an ultra-small foreign substance in a composition selected from the group consisting of an actinic ray-sensitive or radiation-sensitive composition and a thermosetting composition. In addition, provided are a method for producing a composition and a method for verifying a composition, using the inspection method. The inspection method is an inspection method for a composition selected from the group consisting of an actinic ray-sensitive or radiation-sensitive composition and a thermosetting composition, the inspection method including a step X1 for applying the composition to a substrate X to form a coating film, a step X2 for removing the coating film from the substrate X using a removal solvent including an organic solvent, and a step X3 for measuring the number of defects on the substrate X after the removal of the coating film using a defect inspection device. In a case where the composition is the actinic ray-sensitive or radiation-sensitive composition, the step X2 is applied in a state where the coating film has not been subjected to an exposure treatment by irradiation with actinic rays or radiation, and in a case where the composition is the thermosetting composition, the step X2 is applied in a state where the coating film has not been subjected to a thermosetting treatment.

21 Claims, No Drawings

INSPECTION METHOD, METHOD FOR PRODUCING COMPOSITION, AND METHOD FOR VERIFYING COMPOSITION

CROSS-REFERENCE TO RELATED APPLICATIONS

This application is a Continuation of PCT International Application No. PCT/JP2021/039129 filed on Oct. 22, 2021, which claims priority under 35 U.S.C. § 119(a) to Japanese Patent Application No. 2020-188141 filed on Nov. 11, 2020, Japanese Patent Application No. 2021-030205 filed on Feb. 26, 2021, and Japanese Patent Application No. 2021-109874 filed on Jul. 1, 2021. The above applications are hereby expressly incorporated by reference, in its entirety, into the present application.

BACKGROUND OF THE INVENTION

1. Field of the Invention

The present invention relates to an inspection method, a method for producing a composition, and a method for verifying a composition.

2. Description of the Related Art

It is known that a semiconductor device is manufactured by forming a fine electronic circuit pattern on a substrate using a photolithography technique.

Specifically, a patterned resist film can be obtained by forming a resist film obtained using an actinic ray-sensitive or radiation-sensitive composition (hereinafter also referred to as a "resist composition") on a substrate, and then subjecting the resist film to various treatments such as an exposure treatment, a development treatment using a developer, and to a rinsing treatment using a rinsing liquid, as necessary. Using the patterned resist film thus obtained as a mask, various treatments are performed to form an electronic circuit pattern.

In such a semiconductor device forming step, there is a demand for a pattern forming method capable of suppressing the occurrence of defects in order to further improve the yield of a semiconductor device manufactured. In recent years, the manufacture of a semiconductor device having a node of 10 nm or less has been studied and this tendency has become more remarkable.

By the way, one of the causes of defects in a pattern may be a foreign substance included in the resist composition.

In the related art, as a method for inspecting the presence or absence of foreign substances and the number of the foreign substances included in a resist composition, a method in which foreign substances in a resist composition (solution) are measured using a liquid-borne particle counter (for example, a liquid-borne particle counter KS-41B, a fine particle measuring instrument manufactured by Rion Co., Ltd.); a method in which a resist composition is applied onto a substrate to form a coating film and the coating film is observed with a defect inspection device (for example, Surfscan SP5 (registered trademark), a dark-field defect inspection device, manufactured by KLA-Tencor) to measure foreign substances on a surface of the film and in the film; and the like have been carried out.

However, in the method in which foreign substances in a resist composition (solution) are measured using a liquid-borne particle counter, a particle with a particle diameter of no more than 0.1 m (100 nm) is usually difficult to be a target to be detected in terms of a detection limit of the device. In addition, in the method in which foreign substances on a surface of a film and in the film are measured using a defect inspection device, defects with a size of 40 nm to 60 nm are usually targets to be detected. Therefore, it cannot be said that these inspection methods have a sufficient detection sensitivity in applications to a case of manufacturing a semiconductor device with a 10 nm or less node in recent years.

In addition, the inspection method in which a foreign substance in a resist composition is detected is not limited to the above-mentioned inspection methods, and various studies on the inspection method have been made so far.

For example, JP1995-280739A (JP-H07-280739A) discloses, as a method for detecting a gel-like foreign substance that induces a pattern defect, "a method for inspecting a foreign substance, including a step of rotationally coating a photoresist on a semiconductor substrate, a step of exposing the coated photoresist to light using ultraviolet rays, a step of removing the photosensitive photoresist exposed to light with an alkali developer, and a step of irradiating a surface of the semiconductor substrate from which the photoresist has been removed with laser light to perform an inspection on the presence or absence of a foreign substance from scattered light". In JP1995-280739A (JP-H07-280739A), specifically, a positive tone resist film formed from a positive tone resist composition is subjected to exposure and alkali development to expose a substrate, and a gel-like foreign substance adhered to the exposed substrate is measured to detect the presence or absence of the gel-like substance in the resist composition.

Furthermore, in the earlier section, the foreign substance included in the resist composition is mentioned as one of the causes of defects in a pattern, but the cause of the defects in the pattern can be not only the foreign substance included in the resist composition but also foreign substances included in various thermosetting compositions (for example, BARC (antireflection film), a spin-on carbon film (SOC), a spin-on glass film (SOG), TARC (antireflection film), and a topcoat material for liquid immersion) used in the formation of the pattern.

SUMMARY OF THE INVENTION

The present inventors have conducted studies on the method for inspecting a foreign substance described in JP1995-280739A (JP-H07-280739A), and have thus found that since defect inspection of a substrate is carried out after subjecting a positive tone resist film to exposure and alkali development in the method of JP1995-280739A (JP-H07-280739A), a reaction of components in a resist film occurs during the exposure and there is thus a possibility that defect components are also modified with the reaction. That is, it has been clarified that in an inspection method in which a defect inspection of a substrate is carried out after the exposure of a resist film is carried out, the detection accuracy may sometimes be insufficient for inspection on a foreign substance in a resist composition, and there is thus room for improvement.

In addition, as described above, the inspection method is also required to exhibit a sufficient detection sensitivity even in a case where the inspection method is applied to the manufacture of finer semiconductor devices in recent years (in other words, to be capable of measuring even ultra-small foreign substances).

Therefore, an object of the present invention is to provide an inspection method for simply measuring an ultra-small foreign substance in a composition selected from the group consisting of an actinic ray-sensitive or radiation-sensitive composition and a thermosetting composition.

In addition, another object of the present invention is to provide a method for producing a composition and a method for verifying a composition, using the inspection method.

The present inventors have found that the objects can be accomplished by the following configurations.

[1] An inspection method for a composition selected from the group consisting of an actinic ray-sensitive or radiation-sensitive composition and a thermosetting composition, the inspection method comprising:

a step X1 of applying the composition onto a substrate X to form a coating film;

a step X2 of removing the coating film from the substrate X using a removal solvent including an organic solvent; and a step X3 of measuring the number of defects on the substrate X after the removal of the coating film, using a defect inspection device, in which in a case where the composition is the actinic ray-sensitive or radiation-sensitive composition, the step X2 is applied in a state where the coating film has not been subjected to an exposure treatment by irradiation with actinic rays or radiation, and in a case where the composition is the thermosetting composition, the step X2 is applied in a state where the coating film has not been subjected to a thermosetting treatment.

[2] The inspection method as described in [1], further comprising a step Y1 before the step X1, in which the step Y1 is a step of measuring the number of defects on the substrate X using the defect inspection device with respect to the substrate X used in the step X1.

[3] The inspection method as described in [2], in which the substrate X is a silicon wafer and the number of defects measured in the step Y1 is 0.75 defects/cm$^2$ or less.

[4] The inspection method as described in [2] or [3], in which the substrate X is a silicon wafer and the number of defects with a size of 19 nm or more on the substrate X, measured in the step Y1, is 0.75 defects/cm$^2$ or less.

[5] The inspection method as described in [4], in which the number of defects with a size of 19 nm or more is 0.15 defects/cm$^2$ or less.

[6] The inspection method as described in any one of [1] to [5], further comprising:

a step Z1 of applying the removal solvent onto a substrate Z; and a step Z2 of measuring the number of defects on the substrate Z onto which the removal solvent has been applied, using the defect inspection device.

[7] The inspection method as described in [6], further comprising:

a step Z3 of measuring the number of defects on the substrate Z using the defect inspection device with respect to the substrate Z before the step Z1; and a step Z4 of calculating the number of defects derived from the removal solvent used in the step X2 by subtracting the number of the defects measured in the step Z3 from the number of the defects measured in the step Z2.

[8] The inspection method as described in any one of [1] to [7], in which the number of defects with a size of 19 nm or more, calculated in the following defect inspection R1, from the removal solvent used is 1.50 defects/cm$^2$ or less, defect inspection R1:

the defect inspection R1 has the following steps ZA1 to ZA4, step ZA1: a step of measuring the number of defects with a size of 19 nm or more on a substrate ZA using the defect inspection device, step ZA2: a step of applying the removal solvent onto the substrate ZA, step ZA3: a step of measuring the number of defects with a size of 19 nm or more on the substrate ZA onto which the removal solvent has been applied, using the defect inspection device, and step ZA4: a step of calculating the number of defects with a size of 19 nm or more derived from the removal solvent by subtracting the number of the defects measured in the step ZA1 from the number of the defects measured in the step ZA3.

[9] The inspection method as described in [8], in which the number of defects with a size of 19 nm or more is 0.75 defects/cm$^2$ or less.

[10] The inspection method as described in any one of [1] to [9], in which the organic solvent includes one or more selected from the group consisting of an ester-based organic solvent, an alcohol-based organic solvent, and a ketone-based organic solvent.

[11] The inspection method as described in any one of [1] to [10], in which the organic solvent includes one or more selected from the group consisting of propylene glycol monomethyl ether acetate, propylene glycol monomethyl ether, methyl amyl ketone, cyclohexanone, ethyl lactate, butyl acetate, and γ-butyrolactone.

[12] The inspection method as described in any one of [1] to [11], in which a removal time of the removal treatment using the removal solvent is 300 seconds or less in the step X2.

[13] The inspection method as described in [12], in which the removal time is 60 seconds or less.

[14] The inspection method as described in any one of [1] to [13], in which the removal solvent includes two or more organic solvents in the step X2.

[15] The inspection method for a composition selected from the group consisting of an actinic ray-sensitive or radiation-sensitive composition and a thermosetting composition as described in [1], the inspection method comprising:

the step X1 of applying the composition onto a substrate X to form a coating film;

the step X2 of removing the coating film from the substrate X using a removal solvent including an organic solvent;

a step X3A of measuring the number of defects on the substrate X after the removal of the coating film, using the defect inspection device;

a step Y1 and a step ZX before the step X1; and a step X3E for calculating the number of defects derived from the composition, in which in a case where the composition is the actinic ray-sensitive or radiation-sensitive composition, the step X2 is applied in a state where the coating film has not been subjected to an exposure treatment by irradiation with actinic rays or radiation, in a case where the composition is the thermosetting composition, the step X2 is applied in a state where the coating film has not been subjected to a thermosetting treatment, the step Y1 is a step of measuring the number of defects on the substrate X using the defect inspection device with respect to the substrate X, the step ZX has a step Z1 of applying the removal solvent onto a substrate ZX, a step Z2 of measuring the number of defects on the substrate ZX onto which the removal solvent has been applied, using the defect inspection device, a step Z3 of measuring the number of defects on the substrate ZX using the defect inspection device with respect to the substrate ZX, a step Z4 of calculating the number of defects derived from the removal solvent by subtracting the number of the defects measured in the step Z3 from the number of the defects measured in the step Z2, and the step X3E is carried out by subtracting the number of the defects measured in the step Y1 and the number of defects calculated in the step Z4 from the number of the defects measured in the step X3A.

[16] A method for producing a composition, comprising:

a step of preparing a composition selected from the group consisting of an actinic ray-sensitive or radiation-sensitive composition and a thermosetting composition; and a step of carrying out the inspection method as described in any one of [1] to [15].

[17] The method for producing a composition as described in [16], in which the composition is the actinic ray-sensitive or radiation-sensitive composition.

[18] A method for verifying a composition including the inspection method as described in any one of [1] to [14], comprising:

a step of acquiring the number of defects on the substrate after the removal of the coating film by the inspection method; and a step of comparing the number of acquired defects with reference data to determine whether or not the number of the defects is within an acceptable range.

[19] A method for verifying a composition, including the inspection method as described in [15], comprising:

a step of acquiring the number of defects derived from the composition by the inspection method; and a step of comparing the number of acquired defects with reference data to determine whether or not the number of the defects is within an acceptable range.

[20] The method for verifying a composition as described in [18] or [19], in which a reference value based on the reference data is 0.75 defects/$cm^2$ or less.

[21] A method for producing a composition, comprising:

a step of preparing a composition selected from the group consisting of an actinic ray-sensitive or radiation-sensitive composition and a thermosetting composition; and a step of carrying out the verifying method as described in any one of [18] to [20].

According to the present invention, it is possible to provide an inspection method for simply measuring an ultra-small foreign substance in a composition selected from the group consisting of an actinic ray-sensitive or radiation-sensitive composition and a thermosetting composition.

In addition, according to the present invention, it is possible to provide a method for producing a composition and a method for verifying a composition, using the inspection method.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

In notations for a group (atomic group) in the present specification, in a case where the group is noted without specifying whether it is substituted or unsubstituted, the group includes both a group having no substituent and a group having a substituent as long as this does not impair the spirit of the present invention. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

The substituent is preferably a monovalent substituent unless otherwise specified.

"Actinic rays" or "radiation" in the present specification means, for example, a bright line spectrum of a mercury lamp, far ultraviolet rays typified by an excimer laser, extreme ultraviolet rays (EUV light), X-rays, an electron beam (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays, X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups noted in the present specification is not limited unless otherwise specified. For example, in a case where Y in a compound represented by Formula "X—Y—Z" is —COO—, Y may be —CO—O— or —O—CO—. In addition, the compound may be "X—CO—O—Z" or "X—O—CO—Z".

In the present specification, (meth)acrylate represents acrylate and methacrylate, and (meth)acryl represents acryl and methacryl.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicate values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Examples of a specific method therefor include a method for performing calculation by computing $H^+$ dissociation free energy in an aqueous solution based on a thermodynamic cycle. With regard to a computation method for $H^+$ dissociation free energy, the $H^+$ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

In addition, the pKa in the present specification refers to a "pKa in an aqueous solution" as described above, but in a case where the pKa in an aqueous solution cannot be calculated, a "pKa in a dimethyl sulfoxide (DMSO) solution" shall be adopted.

In the present specification, examples of the halogen atom include a fluorine atom, a chlorine atom, a bromine atom, and an iodine atom.

In the present specification, the solid content means all components other than the solvent. Furthermore, even in a case where the properties of a solid content are liquid, the solid content is used for the computation.

[Inspection Method]

The inspection method of an embodiment of the present invention is an inspection method for a composition (hereinafter also referred to as an "inspection composition") selected from the group consisting of an actinic ray-sensitive or radiation-sensitive composition (hereinafter also referred to as a "resist composition") and a thermosetting composition, including the following steps X1 to X3.

Step X1: A step of applying the inspection composition onto a substrate X to form a coating film Step X2: A step of removing the coating film from the substrate X using a removal solvent including an organic solvent (hereinafter also referred to as a "removal solvent") without performing an exposure treatment by irradiation with actinic rays or radiation in a case where the composition is the actinic ray-sensitive or radiation-sensitive composition; or a step of removing the coating film from the substrate X using the removal solvent including an organic solvent (hereinafter also referred to as a "removal solvent") without performing a thermosetting treatment in a case where the composition is the thermosetting composition Step X3: A step of measuring the number of defects on the substrate X after the removal of the coating film, using the defect inspection device One of the features of the inspection method may be that detection of a foreign substance included in the inspection composition is carried out on a substrate. Hereinafter, a mechanism of action thereof will be described.

In the inspection method, in the step X1, an inspection composition is first formed on a substrate X as a coating film, and in a subsequent step X2, a removal treatment of removing the coating film from the substrate X is carried out using a removal solvent. As a result of the removal treatment, adhesion of an ultra-small foreign substance (a foreign substance that may cause defects after pattern formation) included in the coating film can occur on a surface of the substrate X having undergone the step X2 due to elution of the coating film into a solvent for removing the coating film, and the like. In the inspection method of the embodiment of the present invention, the number of defects existing on the surface of the substrate X having undergone the step X2 is measured in the step X3. That is, in the inspection method of the embodiment of the present invention, the foreign substance included in the inspection composition is detected as a defect on the substrate X. For defects existing on a surface of a substrate such as a silicon wafer for manufacturing a semiconductor, it is possible to measure a defect with a size of about 19 nm, for example, by using a commercially available defect inspection device (for example, a dark-field defect inspection device: Surfscan (registered trademark) SP5 manufactured by KLA-Tencor). Therefore, a more ultra-small foreign substance can be detected, as compared with a method for measuring a foreign substance in a resist composition (solution) using a liquid-borne particle counter (detection limit/measurement target: defects with a particle diameter of usually 0.1 m (100 nm) or more), and a method of measuring a foreign substance on a film surface and in a film, using a defect inspection device (detection limit/measurement target: defects with a size of usually 40 nm to 60 nm), as described above.

Hereinafter, the number of defects measured by the defect device in each step is also referred to as the "number of defects" or the "defect count".

Therefore, it is possible to simply measure an ultra-small foreign substance in a composition (inspection composition) selected from the group consisting of an actinic ray-sensitive or radiation-sensitive composition and a thermosetting composition by the inspection method. In addition, the inspection composition can be referred to as a method capable of further capturing defects actually included in an inspection composition (with a more excellent detection accuracy), as compared with the inspection method of JP1995-280739A (JP-H07-280739A) since the inspection method does not involve a deterioration of the inspection composition due to exposure or thermosetting (specifically a deterioration of a compound and a defect in the inspection composition).

Hereinafter, the inspection method of the embodiment of the present invention will be described with reference to an example of a specific embodiment. Furthermore, in the following description of the inspection method, an aspect in which the size of the defect measured using a defect inspection device is a size of 19 nm or more will be described as an example, but the size of the defect is not limited thereto. Defects smaller than 19 nm may be included in the inspection as long as the detection limit of the device is acceptable.

First Embodiment of Inspection Method

A first embodiment of the inspection method is an inspection method for a composition selected from the group consisting of a resist composition and a thermosetting composition (inspection composition), and has the following steps X1 to X3.

Step X1: A step of applying the inspection composition onto a substrate X to form a coating film Step X2: A step of removing the coating film from the substrate X using a removal solvent including an organic solvent (removal solvent) without performing an exposure treatment by irradiation with actinic rays or radiation in a case where the inspection composition is the resist composition; or a step of removing the coating film from the substrate X using the removal solvent including an organic solvent without performing a thermosetting treatment in a case where the inspection composition is the thermosetting composition Step X3: A step of measuring the number of defects on the substrate X after the removal of the coating film, using a defect inspection device.

Hereinafter, each procedure will first be described.

<<Step X1>>

The step X1 is a step of forming a coating film on the substrate X using a composition (inspection composition) to be inspected in the present inspection method. Here, the inspection composition is a resist composition or a thermosetting composition.

Hereinafter, various materials used in the step X1 and the procedure of the step X1 will be described.

<Various Materials>

(Inspection Composition)

As the inspection composition, the resist composition and the thermosetting composition, which can be suitably applied to the present inspection method, will be described later.

(Substrate X, Substrate Z, and Substrate ZA)

Examples of the substrate X include substrates such as a substrate to be used for manufacturing an integrated circuit element, and a silicon wafer is preferable.

From the viewpoint that the inspection accuracy is further improved, in the substrate X used in the step X1, the number of defects existing on the substrate X before application to the step X1 (the original defect count on the substrate) is preferably 1.20 defects/$cm^2$ or less, more preferably 0.75 defects/$cm^2$ or less, and still more preferably 0.15 defects/$cm^2$ or less. Furthermore, the lower limit value is, for example, 0.00 defect/$cm^2$ or more.

Above all, from the viewpoint that the inspection accuracy is further improved, in the substrate X used in the step X1, the number of defects with a size of 19 nm or more existing on the substrate X before application to the step X1 is preferably 1.20 defects/$cm^2$ or less, more preferably 0.75 defects/$cm^2$ or less, and still more preferably 0.15 defects/$cm^2$ or less. Furthermore, the lower limit value is, for example, 0.00 defect/$cm^2$ or more. The upper limit of the size of the defect is not particularly limited, but is, for example, 5 m or less, and the same applies to the defects described in each step which will be described later. In a case where the number of defects on the substrate X used in the step X1 is large, scattering may sometimes occur during the defect inspection on the substrate, carried out in the step X3, thus inhibiting an accurate measurement of the number of defects. Therefore, from the viewpoint that the accuracy of the defect inspection on the substrate in the step X3 is more excellent (from the viewpoint that the inspection accuracy of the present inspection method is further improved), it is preferable that a substrate having a high degree of cleanliness (a substrate having a small original defect count on the substrate) is used as the substrate X used in the step X1.

In the defect inspection on the substrate X, measurement can be made with a defect inspection device (for example, a dark-field defect inspection device: Surfscan (registered trademark) SP5 manufactured by KLA-Tencor).

Furthermore, the specifications of the substrate Z and the substrate ZA are also the same as those of the above-mentioned substrate X. In addition, preferred forms of the substrate Z and the substrate ZA and preferred forms in each step which will be described later are the same as those of the substrate X. From the viewpoint that the accuracy of defect inspection on the substrate is more excellent (furthermore, from the viewpoint that the inspection accuracy of the present inspection method is further improved), preferred examples of the substrate X, the substrate Z, and the substrate ZA include the following forms.

A wafer in which the substrate X, the substrate Z, and the substrate ZA consist of the same material.

A wafer in which the substrate X, the substrate Z, and the substrate ZA consist of ingots manufactured using the same method.

A wafer in which the substrate X, the substrate Z, and the substrate ZA consist of ingots of the same production lot.

<Step X1>

Examples of a method of forming the coating film on the substrate X using the inspection composition include a method of applying the inspection composition onto the substrate X. In addition, other examples of the coating method include a coating method using a coater cup and a coating method using an organic development unit. Moreover, a coating method using a spin coating method using a spinner is also preferable. A rotation speed upon the spin coating using a spinner is preferably 500 to 3000 rpm.

It is preferable that the substrate X is dried after the inspection composition is applied onto the substrate X.

Examples of the drying method include a method of heating and drying. The heating can be carried out using a unit included in an ordinary exposure machine and/or an ordinary development machine, and may also be carried out using a hot plate or the like. The heating temperature is preferably 80° C. to 150° C., more preferably 80° C. to 140° C., and still more preferably 80° C. to 130° C. The heating time is preferably 30 to 1000 seconds, more preferably 60 to 800 seconds, and still more preferably 60 to 600 seconds. In one aspect, it is preferable to carry out heating at 100° C. for 60 seconds.

The film thickness of the coating film is not particularly limited, but is preferably 10 to 1000 nm, and more preferably 10 to 120 nm. Among those, it is preferable to consider the film thickness for each use of the inspection composition, and for example, in a case where the inspection composition is a resist composition and is provided for pattern formation by EUV exposure or EB exposure, the film thickness of the coating film is more preferably 10 to 100 nm, and still more preferably 15 to 70 nm. In addition, for example, in a case where the inspection composition is a resist composition and is provided for pattern formation by ArF immersion exposure, the film thickness of the coating film is more preferably 10 to 120 nm, and still more preferably 15 to 90 nm.

<Step X2>

The step X2 is a step of removing the coating film formed in the step X1 from the substrate X using a removal solvent including an organic solvent (removal solvent). It should be noted that in the step X2, in a case where the inspection composition is a resist composition, the coating film is removed from the substrate X without performing an exposure (that is, without causing deterioration of components in the coating film due to exposure). In addition, in a case where the inspection composition is a thermosetting composition, the coating film is removed from the substrate X without performing a thermosetting treatment (that is, without causing deterioration of components in the coating film due to the thermosetting treatment). Furthermore, "in a case where the inspection composition is a resist composition, . . . without performing an exposure" is intended to mean that an exposure treatment is not performed at no less than a minimum exposure amount at which a residual film is observed. In addition, the expression, "in the case where the composition is a thermosetting composition, . . . without performing a thermosetting treatment", is intended to mean that an intentional heat treatment is not carried out.

Hereinafter, various materials used in the step X2 and the procedure of the step X2 will be described.

(Removal Solvent Including Organic Solvent (Removal Solvent))

The removal solvent used in the step X2 includes an organic solvent.

The organic solvent may be used alone or in a mixture of a plurality of kinds thereof.

The content of the organic solvent (a total of the contents in the case of mixing a plurality of kinds of organic solvents) in the removal solvent is preferably 60% to 100% by mass, more preferably 85% to 100% by mass, still more preferably 90% to 100% by mass, particularly preferably 95% to 100% by mass, and most preferably 98% to 100% by mass with respect to the total amount of the removal solvent.

Above all, it is preferable that the removal solvent does not substantially include water from the viewpoint of improving the inspection accuracy. The expression, "the removal solvent does not substantially include water", is intended to mean that the moisture content in the removal solvent is 10% by mass or less, and the moisture content is preferably 5% by mass or less, more preferably 1% by mass or less, and still more preferably the removal solvent does not include water.

The organic solvent is not particularly limited as long as it can remove the coating film formed in the step X1 from the substrate X, but is preferably, among those, an organic solvent included in an inspection composition (for example, in a case where the inspection composition is a resist composition, the organic solvent corresponds to an organic solvent that dilutes the resist component), preferably an organic solvent including one or more selected from the group consisting of an ester-based organic solvent, an alcohol-based organic solvent, and a ketone-based organic solvent, and more preferably an organic solvent consisting of such the group.

Examples of the ester-based organic solvent include a propylene glycol monoalkyl ether carboxylate, a lactic acid ester, acetate, a lactone, and an alkoxypropionic acid ester.

As the propylene glycol monoalkyl ether carboxylate, for example, propylene glycol monomethyl ether acetate (PGMEA), propylene glycol monomethyl ether propionate, or propylene glycol monoethyl ether acetate is preferable, and propylene glycol monomethyl ether acetate (PGMEA) is more preferable.

As the lactic acid ester, ethyl lactate, butyl lactate, or propyl lactate is preferable.

As the acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionic acid ester, methyl 3-methoxypropionate (MMP) or ethyl 3-ethoxypropionate (EEP) is preferable.

As the lactone, γ-butyrolactone is preferable.

Examples of the alcohol-based organic solvent include propylene glycol monoalkyl ether.

As the propylene glycol monoalkyl ether, propylene glycol monomethyl ether (PGME) or propylene glycol monoethyl ether (PGEE) is preferable.

Examples of the ketone-based organic solvent include a chain ketone and a cyclic ketone.

As the chain ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the organic solvent, among those, one or more selected from the group consisting of propylene glycol monomethyl ether acetate (PGMEA), propylene glycol monomethyl ether (PGME), methyl amyl ketone, cyclohexanone, ethyl lactate, butyl acetate, and γ-butyrolactone is preferably included, and more preferably an organic solvent consisting of such the group is more preferable.

The organic solvent may be used alone or in a mixture of two or more kinds thereof.

It is also preferable that the organic solvent in the removal solvent is a mixed solvent of PGMEA/PGME (for example, a mixed solvent having a mixing mass ratio of 15/85 to 85/15).

From the viewpoint that the inspection accuracy is further improved, the defect count of the removal solvent used in the step X2 is preferably 4.00 defects/$cm^2$ or less in a case where the following defect inspection R1 is carried out. In other words, from the viewpoint that the accuracy of the defect inspection is further improved, the removal solvent used in the step X2 is preferably a solvent from which the number of defects calculated in the following defect inspection R1 is 4.00 defects/$cm^2$ or less.

From the viewpoint that the inspection accuracy is further improved, the defect count of the removal solvent used in the step X2 is more preferably 2.30 defects/$cm^2$ or less, still more preferably 1.50 defects/$cm^2$ or less, and particularly preferably 0.75 defects/$cm^2$ or less in a case where the following defect inspection R1 is carried out. Furthermore, the lower limit value is, for example, 0.00 defect/$cm^2$ or more.

From the viewpoint that the inspection accuracy is further improved, the number of defects with a size of 19 nm or more of the removal solvent used in the step X2 is preferably 4.00 defects/$cm^2$ or less in a case where the following defect inspection R1 is carried out. In other words, from the viewpoint that the accuracy of the defect inspection is further improved, the removal solvent used in the step X2 is preferably a solvent from which the number of defects with a size of 19 nm or more calculated in the following defect inspection R1 is 4.00 defects/$cm^2$ or less.

From the viewpoint that the inspection accuracy is further improved, the number of defects with a size of 19 nm or more of the removal solvent used in the step X2 is more preferably 2.30 defects/$cm^2$ or less, still more preferably 1.50 defects/$cm^2$ or less, and particularly preferably 0.75 defects/$cm^2$ or less in a case where the following defect inspection R1 is carried out. Furthermore, the lower limit value is, for example, 0.00 defect/$cm^2$ or more.

Defect Inspection R1

The defect inspection R1 has the following steps ZA1 to ZA4.

Step ZA1: A step of measuring the number of defects on a substrate ZA using a defect inspection device Step ZA2: A step of applying a removal solvent to the substrate ZA Step ZA3: A step of measuring the number of defects on the substrate ZA onto which the removal solvent has been applied, using a defect inspection device Step ZA4: A step of calculating the number of defects derived from the removal solvent by subtracting the number of the defects measured in the step ZA1 from the number of the defects measured in the step ZA3

Furthermore, in the defect inspection on the substrate ZA in the step ZA1 and the step ZA3, measurement can be made with a defect inspection device (for example, a dark-field defect inspection device: Surfscan (registered trademark) SP5 manufactured by KLA-Tencor).

The defect inspection R1 will be described below.

Step ZA1

The step ZA1 is a step of measuring the number of defects on the substrate ZA using a defect inspection device. Specifically, the number of defects existing on the substrate ZA (preferably the number of defects with a size of 19 nm or more) is measured.

The substrate ZA used in the step ZA1 is not particularly limited, and examples thereof include a substrate used for manufacturing an integrated circuit element, and a silicon wafer is preferable.

The defect inspection on the substrate ZA in the step ZA1 can be measured by a defect inspection device (for example, a dark-field defect inspection device: Surfscan (registered trademark) SP5 manufactured by KLA-Tencor).

The number of defects (preferably the number of defects with a size of 19 nm or more) existing on the substrate ZA before application to the step ZA2 (the original defect count on the substrate) is measured by carrying out the step ZA1.

Step ZA2:

The step ZA2 is a step of applying a removal solvent to the substrate ZA.

The method of applying the removal solvent onto the substrate ZA is not particularly limited, but the coating method is preferably spin coating using a spinner. A rotation speed upon the spin coating using a spinner is preferably 500 to 3000 rpm. In addition, the supply flow rate of the removal solvent is preferably 0.2 to 10.0 mL/s, and more preferably 0.5 to 3.0 mL/s. The supply time is preferably 3 to 300 seconds, and more preferably 5 to 60 seconds.

It is preferable that the substrate ZA is dried after applying the removal solvent onto the substrate ZA.

Examples of the drying method include a method of heating and drying. The heating can be carried out using a unit included in an ordinary exposure machine and/or an ordinary development machine, and may also be carried out using a hot plate or the like. The heating temperature is preferably 80° C. to 250° C., more preferably 80° C. to 140° C., and still more preferably 80° C. to 130° C. The heating time is preferably 30 to 1000 seconds, more preferably 60 to 800 seconds, and still more preferably 60 to 600 seconds. In one aspect, it is preferable to carry out heating at 100° C. for 60 seconds.

Step ZA3

The step ZA3 is a step of measuring the number of defects on the substrate ZA onto which the removal solvent has been applied, using a defect inspection device. Specifically, the number of defects existing on the substrate ZA (preferably the number of defects with a size of 19 nm or more) is measured.

The defect inspection on the substrate ZA in the step ZA3 can be measured by a defect inspection device (for example, a dark-field defect inspection device: Surfscan (registered trademark) SP5 manufactured by KLA-Tencor).

The number of defects (preferably the number of defects with a size of 19 nm or more) existing on the substrate ZA after application of the removal solvent (the defect count after application of the removal solvent) is measured by carrying out the step ZA3.

Step Z4

The step ZA4 is a step of calculating the number of defects derived from the removal solvent (the defect count of the removal solvent) by subtracting the number of the defects measured in the step ZA1 (the original defect count on the substrate) from the number of the defects measured in the step ZA3 (the defect count after application of the removal solvent).

As described above, the number of defects obtained by carrying out the step ZA4 is preferably 4.00 defects/$cm^2$ or less, more preferably 2.30 defects/$cm^2$ or less, still more preferably 1.50 defects/$cm^2$ or less, and particularly preferably 0.75 defects/$cm^2$ or less. Furthermore, the lower limit value is, for example, 0.00 defects/$cm^2$ or more.

As described above, the number of defects with a size of 19 nm or more obtained by carrying out the step ZA4 is preferably 4.00 defects/$cm^2$ or less, more preferably 2.30 defects/$cm^2$ or less, still more preferably 1.50 defects/$cm^2$ or less, and particularly preferably 0.75 defects/$cm^2$ or less. Furthermore, the lower limit value is, for example, 0.00 defects/$cm^2$ or more.

In a case where the number of defects derived from the removal solvent used in the step X2 is large, scattering may sometimes occur during the defect inspection on the substrate ZA carried out in the step X3 to inhibit an accurate measurement of the number of defects. Therefore, from the viewpoint that the accuracy of the defect inspection in the step X3 is more excellent (furthermore, from the viewpoint that the inspection accuracy of the present inspection method is further improved), it is preferable that a removal solvent having a high accuracy is used as the removal solvent used in the step X2.

Examples of a method for improving the cleanliness of the removal solvent include filtration using a filter. The pore diameter of the filter and the material of the filter are not particularly limited and can be appropriately adjusted according to the composition. As the filter, a filter which has been cleaned with an organic solvent in advance may be used. In the step of filter filtration, a plurality of kinds of filters connected in series or in parallel may be used. In a case of using the plural kinds of filters, a combination of filters with at least one of pore diameters or materials being different from each other may be used. In addition, various materials may be filtered plural times, and the step of filtering plural times may be a circulation-filtration step. As the filter, a filter having a reduced amount of elutes as disclosed in JP2016-201426A is preferable.

In addition to the filter filtration, removal of impurities by an adsorbing material may be performed, or a combination of filter filtration and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbing agent include those disclosed in JP2016-206500A.

In addition, examples of a method for removing impurities such as a metal include a method of performing distillation under a condition in which the contamination is suppressed as much as possible, for example, involving selecting a raw material having a low metal content as the raw material, filtering the raw material through a filter, or lining the inside of a device with Teflon (registered trademark). Preferred conditions for the filtration using a filter performed on the raw materials are the same ones as the above-mentioned conditions.

In order to prevent impurities from being incorporated, it is preferable that the removal solvent is stored in the container described in the specification of US2015/0227049A, JP2015-123351A, JP2017-13804A, or the like.

(Procedure of Step X2)

A method for removing the coating film formed in the step X1 from the substrate X using a removal solvent is not particularly limited.

Examples of the removal method include a method in which a substrate is immersed in a tank filled with a removal solvent for a certain period of time, a method in which a removal solvent on a surface of a substrate is raised by surface tension and left to stand for a certain period of time to perform the removal, a method in which a removal solvent is sprayed onto a surface of a substrate, and a method in which a removal solvent is continuously discharged while scanning removal solvent discharge nozzles at a constant speed on a substrate rotating at a constant speed. The removal by the method can be carried out by an organic development unit.

In addition, other examples of the removal method include a removal method using a coater cup and a removal method using an organic development unit. Furthermore, a removal method using a spin coating method using a spinner is also preferable. The rotation speed in carrying out the removing method using a spin coating method using a spinner is preferably 500 to 3000 rpm. In addition, the supply flow rate of the removal solvent is preferably 0.2 to 10.0 mL/s, and more preferably 0.5 to 3.0 mL/s. The supply time is preferably 3 to 300 seconds, and more preferably 5 to 60 seconds.

The temperature of the removal solvent is not particularly limited, and is preferably 0° C. to 50° C., and more preferably 15° C. to 35° C.

From the viewpoint that the inspection accuracy is more excellent, the removal time of the removal treatment using the removal solvent is, for example, 800 seconds or less, preferably 300 seconds or less, and more preferably 60 seconds or less. The lower limit value is, for example, 5 seconds or more. In a case where the removal time in the step X2 is too long, not only the coating film but also the ultra-small components (foreign substances) are easily removed from the substrate, and therefore, in the defect inspection in the step X3, an accurate measurement of the number of defects may not be possible. For this reason, from the viewpoint that the accuracy of the defect inspection in the step X3 is more excellent (the inspection accuracy of the present inspection method is further improved), it is preferable that the removal time used in the step X1 is short.

Furthermore, the removal time can be appropriately adjusted by a device used in the production, such as a coater, by setting a moment at which the removal solvent comes into contact with the coating film as a starting point.

It is preferable that the substrate X is dried after the removal treatment is carried out. Examples of the drying method include a method of heating and drying. The heating can be carried out using a unit included in an ordinary exposure machine and/or an ordinary development machine, and may also be carried out using a hot plate or the like. The heating temperature is preferably 80° C. to 200° C., more preferably 80° C. to 140° C., and still more preferably 80° C. to 130° C. The heating time is preferably 30 to 1000 seconds, more preferably 60 to 800 seconds, and still more preferably 60 to 600 seconds. In one aspect, it is preferable to carry out heating at 100° C. for 60 seconds.

<Step X3>

The step X3 is a step of measuring the number of defects on the substrate X after the removal of the coating film by the step X2, using a defect inspection device. Specifically, the number of defects existing on the substrate X (preferably the number of defects with a size of 19 nm or more) is measured.

The defect inspection on the substrate X in the step X3 can be measured by a defect inspection device (for example, a dark-field defect inspection device: Surfscan (registered trademark) SP5 manufactured by KLA-Tencor).

The number of defects existing on the substrate X (preferably the number of defects with a size of 19 nm or more) after the removal with the removal solvent (the total defect count after a solvent removing treatment) is measured by carrying out the step X3.

Second Embodiment of Inspection Method

Hereinafter, a second embodiment of the inspection method will be described.

The second embodiment of the inspection method is an inspection method for a composition selected from the group consisting of a resist composition and a thermosetting composition (inspection composition), the inspection method having a step X1, a step X2, and a step X3 (a step X3A and a step X3B), and a step Y1 as necessary.

- Step X1: A step of applying the inspection composition onto a substrate X to form a coating film
- Step X2: A step of removing the coating film from the substrate X using a removal solvent including an organic solvent (removal solvent) without performing an exposure treatment by irradiation with actinic rays or radiation in a case where the inspection composition is the resist composition; or a step of removing the coating film from the substrate using the removal solvent including an organic solvent without performing a thermosetting treatment in a case where the inspection composition is the thermosetting composition
- Step X3: The step X3 includes a step X3A and a step X3B.
- Step X3A: A step of measuring the number of defects on the substrate X after the removal of the coating film (that is, after passing through the step X2), using a defect inspection device
- Step X3B: A step of calculating the number of defects derived from the inspection composition by subtracting the number of defects existing on the substrate X before application to the step X1 (the defect count derived from the substrate: the original defect count on the substrate) from the number of the defects measured in the step X3A. It should be noted that in a case where the number of defects derived from the substrate X (the original defect count on the substrate) is unknown, the second embodiment of the inspection method further includes a step Y1 and the number of defects measured by the step Y1 is taken as the number of defects derived from the substrate X (the original defect count on the substrate).

Step Y1: A step of measuring the number of defects on a substrate using a defect inspection device with respect to the substrate X used in the step X1 before the step X1

In the second embodiment of the inspection method, the step X3 has a step X3B of subtracting the number of defects derived from the substrate X (the original defect count on the substrate) from the number of the defects measured in the step X3A (the total defect count after a solvent removing treatment). With the configuration, the number of defects derived from the inspection composition can be inspected with a higher accuracy.

Hereinafter, each procedure will be described.

<Step X1 and Step X2>

In the second embodiment of the inspection method, the step X1 and the step X2 are the same as the step X1 and the step X2 in the above-mentioned first embodiment of the inspection method, respectively.

<Step X3 (Step X3A and Step X3B)>

The step X3 has a step X3A and a step X3B.

(Step X3A)

In the second embodiment of the inspection method, the step X3A is the same as the step X3 in the above-mentioned first embodiment of the inspection method.

(Step X3B)

The step X3B is a step of calculating the number of defects derived from the inspection composition by subtracting the number of defects existing on the substrate X before application to the step X1 (the defect count derived from the substrate: the original defect count on the substrate) from the number of the defects measured in the step X3A.

In a case where the number of defects derived from the substrate X (the original defect count on the substrate) is already known from the description in a catalog or the like, such a nominal value can be used. In a case where the number of defects derived from the substrate X is unknown, the second embodiment of the inspection method further has a step Y1, and a value measured by the step Y1 is taken as the number of defects derived from the substrate X (the original defect count on the substrate).

<Step Y1>

The step Y1 is a step of measuring the number of defects on the substrate X using a defect inspection device with respect to the substrate X used in the step X1 before the step X1.

The step Y corresponds to the step of carrying out the method of measuring the original defect count on the substrate described in the step X1 of the first embodiment of the inspection method, and a suitable aspect thereof is also the same.

Third Embodiment of Inspection Method

Hereinafter, a third embodiment of the inspection method will be described.

The third embodiment of the inspection method is an inspection method for a composition selected from the group consisting of a resist composition and a thermosetting composition (inspection composition), and the inspection method having a step X1, a step X2, and a step X3 (a step X3A and a step X3C), and a step ZX, as necessary.

Step X1: A step of applying the inspection composition onto a substrate X to form a coating film Step X2: A step of removing the coating film from the substrate using a removal solvent including an organic solvent (removal solvent) without performing an exposure treatment by irradiation with actinic rays or radiation in a case where the inspection composition is the resist composition; or a step of removing the coating film from the substrate using the removal solvent including an organic solvent without performing a thermosetting treatment in a case where the inspection composition is the thermosetting composition Step X3: The step X3 includes a step X3A and a step X3C.

Step X3A: A step of measuring the number of defects on the substrate X after the removal of the coating film (that is, after passing through the step X2), using a defect inspection device Step X3C: A step of calculating the number of defects derived from the inspection composition by subtracting the number of defects derived from the removal solvent (the defect count of the removal solvent) from the number of the defects measured in the step X3A. It should be noted that in a case where the number of defects derived from the removal solvent (the defect count of the removal solvent) is unknown, the third embodiment of the inspection method further has a step ZX, and the number of defects measured by the step ZX is taken as the number of defects derived from the removal solvent (the defect count of the removal solvent).

Step ZX: A step of carrying out steps Z1 to Z4 shown below (in addition, the steps Z1 to Z4 are carried out in the order of the step Z3, the step Z1, the step Z2, and the step Z4).

Step Z1: A step of applying the removal solvent used in the step X2 to a substrate Z Step Z2: A step of measuring the number of defects on the substrate Z onto which the removal solvent has been applied, using a defect inspection device Step Z3: A step of measuring the number of defects on the substrate Z using a defect inspection device with respect to the substrate Z used in the step Z1

Step Z4: A step of calculating the number of defects derived from the removal solvent used in the step X2 by subtracting the number of the defects measured in the step Z3 from the number of the defects measured in the step Z2

In the third embodiment of the inspection method, the step X3 has a step X3C of subtracting the number of defects derived from the removal solvent (the defect count of the removal solvent) from the number of the defects measured in the step X3A (the total defect count after a solvent removing treatment). With the configuration, the number of defects derived from the inspection composition can be inspected with a higher accuracy.

Hereinafter, each procedure will be described.

<Step X1 and Step X2>

In the second embodiment of the inspection method, the step X1 and the step X2 are the same as the step X1 and the step X2 in the above-mentioned first embodiment of the inspection method, respectively.

<Step X3 (Step X3A and Step X3C)>

The step X3 has a step X3A and a step X3C.

(Step X3A)

In the third embodiment of the inspection method, the step X3A is the same as the step X3 in the above-mentioned first embodiment of the inspection method.

(Step X3C)

The step X3C is a step of calculating the number of defects derived from the inspection composition by subtracting the number of defects derived from the removal solvent (the defect count of the removal solvent) from the number of the defects measured in the step X3A.

In a case where the number of defects derived from the removal solvent (the defect count of the removal solvent) is already known from the description in the catalog or the like, such a nominal value can be used. In a case where the number of defects derived from the removal solvent (the defect count of the removal solvent) is unknown, the third embodiment of the inspection method further has a step ZX, and the value measured by the step ZX is taken as the number of defects derived from the removal solvent (the defect count of the removal solvent).

<Step ZX (Step Z1 to Step Z4)>

The step ZX is a step of determining the number of defects (the defect count of the removal solvent) derived from the removal solvent used in the step X2.

In the step ZX, the steps Z1, the step Z2, the step Z3, and the step Z4 correspond to the step ZA2, the step ZA3, the step ZA1, and the step ZA4 in the defect inspection R1 described in the step X2 of the first embodiment of the inspection method, respectively, and preferred embodiments thereof are also the same.

Fourth Embodiment of Inspection Method

Hereinafter, a fourth embodiment of the inspection method will be described.

The fourth embodiment of the inspection method is an inspection method for a composition selected from the group consisting of a resist composition and a thermosetting composition (inspection composition), the inspection method having a step X1, a step X2, and a step X3 (a step X3A and a step X3D), and a step Y1 and a step ZX, as necessary.

Step X1: A step of applying the inspection composition onto a substrate X to form a coating film Step X2: A step of removing the coating film from the substrate using a removal solvent including an organic solvent (removal solvent) without performing an exposure treatment by irradiation with actinic rays or radiation in a case where the inspection composition is the actinic ray-sensitive or radiation-sensitive composition; or a step of removing the coating film from the substrate using the removal solvent including an organic solvent without performing a thermosetting treatment in a case where the inspection composition is the thermosetting composition Step X3: The step X3 includes a step X3A and a step X3D.

Step X3A: A step of measuring the number of defects on the substrate X after the removal of the coating film (that is, after passing through the step X2), using a defect inspection device Step X3D: A step of calculating the number of defects derived from the inspection composition (the defect count of the composition) by subtracting the number of defects existing on the substrate X before application to the step X1 (the defect count derived from the substrate: the original defect count on the substrate) and the number of defects derived from the removal solvent (the defect count of the removal solvent) from the number of the defects measured in the step X3A. It should be noted that in a case where the number of defects derived from the substrate X (the original defect count on the substrate) is unknown, the fourth embodiment of the inspection method further includes a step Y1 and the number of defects measured by the step Y1 is taken as the number of defects derived from the substrate (the original defect count on the substrate). In addition, it should be noted that in a case where the number of defects derived from the removal solvent (the defect count of the removal solvent) is unknown, the fourth embodiment of the inspection method further has a step ZX, and the number of defects measured by the step ZX is taken as the number of defects derived from the removal solvent (the defect count of the removal solvent).

Step Y1: A step of measuring the number of defects on a substrate X using a defect inspection device with respect to the substrate X used in the step X1 before the step X1

Step ZX: A step having steps Z1 to Z4 in this order, which is carried out before the step X2 (incidentally, the steps Z1 to Z4 are carried out in the order of the step Z3, the step Z1, the step Z2, and the step Z4)

Step Z1: A step of applying the removal solvent used in the step X2 to a substrate Z Step Z2: A step of measuring the number of defects on the substrate Z onto which the removal solvent has been applied, using a defect inspection device Step Z3: A step of measuring the number of defects on the substrate Z using a defect inspection device with respect to the substrate Z used in the step Z1

Step Z4: A step of calculating the number of defects derived from the removal solvent used in the step X2 by subtracting the number of the defects measured in the step Z3 from the number of the defects measured in the step Z2

In the fourth embodiment of the inspection method, the step X3 has a step X3D of subtracting the number of defects derived from the substrate X (the original defect count on the substrate) and the number of defects derived from the removal solvent (the defect count of the removal solvent) from the number of the defects measured in the step X3A (the total defect count after a solvent removing treatment). With the configuration, the number of defects derived from the inspection composition (the defect count of the composition) can be inspected with a higher accuracy.

Hereinafter, each procedure will be described.

<Step X1 and Step X2>

In the fourth embodiment of the inspection method, the step X1 and the step X2 are the same as the step X1 and the step X2 in the above-mentioned first embodiment of the inspection method, respectively.

<Step X3 (Step X3A and Step X3D)>

The step X3 has a step X3A and a step X3D.

(Step X3A)

In the fourth embodiment of the inspection method, the step X3A is the same as the step X3 in the above-mentioned first embodiment of the inspection method.

(Step X3D)

The step X3B is a step of calculating the number of defects derived from the inspection composition (the defect count of the composition) by subtracting the number of defects existing on the substrate X before application to the step X1 (the defect count derived from the substrate X: the original defect count on the substrate) and the number of defects derived from the removal solvent (the defect count of the removal solvent) from the number of the defects measured in the step X3A.

In a case where the number of defects derived from the substrate X (the original defect count on the substrate) is already known from the description in a catalog or the like, such a nominal value can be used. In a case where the defect count derived from the substrate X is unknown, the fourth embodiment of the inspection method further has a step Y1, and a value measured by the step Y1 is taken as the number of defects derived from the substrate X (the original defect count on the substrate).

In addition, in a case where the number of defects derived from the removal solvent (the defect count of the removal solvent) is already known from the description in the catalog or the like, such a nominal value can be used. In a case where the number of defects derived from the removal solvent (the defect count of the removal solvent) is unknown, the fourth embodiment of the inspection method further has a step ZX, and the value measured by the step ZX is taken as the number of defects derived from the removal solvent (the defect count of the removal solvent).

<Step Y1>

In the fourth embodiment of the inspection method, the step Y1 is the same as the step Y1 in the above-mentioned second embodiment of the inspection method.

<Step ZX>

In the fourth embodiment of the inspection method, the step ZX is the same as the step ZX in the third embodiment of the above-mentioned inspection method.

Fifth Embodiment of Inspection Method

A fifth embodiment of the inspection method is an inspection method for a composition selected from the group consisting of a resist composition and a thermosetting composition (inspection composition), the inspection composition having a step X1, a step X2, and a step X3 (a step X3A and a step X3E), a step Y1, and a step Z.

- Step X1: A step of applying the inspection composition onto a substrate X to form a coating film
- Step X2: a step of removing the coating film from the substrate using a removal solvent including an organic solvent (removal solvent) without performing an exposure treatment by irradiation with actinic rays or radiation in a case where the inspection composition is the resist composition; or a step of removing the coating film from the substrate X using the removal solvent including an organic solvent without performing a thermosetting treatment in a case where the inspection composition is the thermosetting composition
- Step X3A: A step of measuring the number of defects on the substrate X after the removal of the coating film, using a defect inspection device
- Step Y1: A step of measuring the number of defects on the substrate X using a defect inspection device with respect to the substrate X used in the step X1 before the step X1
- Step ZX: A step having steps Z1 to Z4 in this order, which is carried out before the step X2 (incidentally, the steps Z1 to Z4 are carried out in the order of the step Z3, the step Z1, the step Z2, and the step Z4).
- Step Z1: A step of applying the removal solvent used in the step X2 to a substrate Z
- Step Z2: A step of measuring the number of defects on the substrate Z onto which the removal solvent has been applied, using a defect inspection device
- Step Z3: A step of measuring the number of defects on the substrate Z using a defect inspection device with respect to the substrate Z used in the step Z1
- Step Z4: A step of calculating the number of defects derived from the removal solvent used in the step X2 by subtracting the number of the defects measured in the step Z3 from the number of the defects measured in the step Z2
- Step 3E: A step of calculating the number of defects derived from the inspection composition by subtracting the number of defects calculated in the step Y1 and the number of defects calculated in the step Z4 from the number of the defects measured in the step X3A Hereinafter, each procedure will be described.

<Step X1 and Step X2>

In the fourth embodiment of the inspection method, the step X1 and the step X2 are the same as the step X1 and the step X2 in the above-mentioned first embodiment of the inspection method, respectively.

<Step X3 (Step X3A and Step X3E)>

The step X3 has a step X3A and a step X3E.

(Step X3A)

In the fifth embodiment of the inspection method, the step X3A is the same as the step X3 in the above-mentioned first embodiment of the inspection method.

(Step X3E)

The step 3E is a step of calculating the number of defects derived from the inspection composition (the defect count of the composition) by subtracting the number of defects calculated in the step Y1 (the original defect count on the substrate) and the defects calculated in the step Z4 (the defect count of the removal solvent) from the number of the defects measured in the step X3A (the total defect count after a solvent removing treatment).

<Step Y1>

In the fifth embodiment of the inspection method, the step Y1 is the same as the step Y1 in the above-mentioned second embodiment of the inspection method.

<Step ZX>

In the fifth embodiment of the inspection method, the step ZX is the same as the step ZX in the above-mentioned third embodiment of the inspection method.

[Inspection Composition]

The inspection composition in the inspection method of the embodiment of the present invention is selected from the group consisting of a resist composition and a thermosetting composition. Hereinafter, examples of aspects of the resist composition and the thermosetting composition that are suitable as the inspection composition will be described.

Resist Composition>>

The resist composition is not particularly limited as long as the coating film of the resist composition can be removed with a removal solvent, and a known resist composition such as a chemically amplified resist composition can be used. Hereinafter, an example of an aspect of the resist composition that is suitable as the inspection composition will be described.

<Resist Composition (CR)>

The resist composition is preferably a composition including a resin having a polarity that increases by the action of an acid, a photoacid generator, and a solvent (hereinafter also referred to as a "composition (CR)").

Hereinafter, the composition (CR) will be described.

(Resin of Which Polarity Increases by Action of Acid)

Repeating Unit Having Acid-Decomposable Group (A-a)>>

The resin of which polarity increases by the action of an acid (hereinafter also simply described as a "resin (A)") preferably has a repeating unit (A-a) having an acid-decomposable group (hereinafter simply a "repeating unit (A-a)").

The acid-decomposable group refers to a group that decomposes by the action of an acid to generate a polar group. The acid-decomposable group preferably has a structure in which the polar group is protected by a leaving group that leaves by the action of an acid. That is, the resin (A) has a repeating unit (A-a) having a group that decomposes by the action of an acid to produce a polar group. A resin having this repeating unit (A-a) has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl)(alkylcarbonyl) methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

$$—C(Rx_1)(Rx_2)(Rx_3) \qquad \text{Formula (Y1):}$$

$$—C(=O)OC(Rx_1)(Rx_2)(Rx_3) \qquad \text{Formula (Y2):}$$

$$—C(R_{36})(R_{37})(OR_{38}) \qquad \text{Formula (Y3):}$$

$$—C(Rn)(H)(Ar) \qquad \text{Formula (Y4):}$$

In Formulae (Y1) and (Y2), $Rx_1$ to $Rx_3$ each independently represent an (linear or branched) alkyl group or (monocyclic or polycyclic) cycloalkyl group, an (linear or branched) alkenyl group, or an (monocyclic or polycyclic) aryl group. Furthermore, in a case where all of $Rx_1$ to $Rx_3$ are (linear or branched) alkyl groups, it is preferable that at least two of $Rx_1$, $Rx_2$, or $Rx_3$ are methyl groups.

Above all, it is preferable that $Rx_1$ to $Rx_3$ each independently represent a linear or branched alkyl group, and it is more preferable that $Rx_1$ to $Rx_3$ each independently represent a linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 5 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the aryl group as each of $Rx_1$ to $Rx_3$, an aryl group having 6 to 10 carbon atoms is preferable, and examples thereof include a phenyl group, a naphthyl group, and an anthryl group.

As the alkenyl group of each of $Rx_1$ to $Rx_3$, a vinyl group is preferable.

As a ring formed by the bonding of two of $Rx_1$ to $Rx_3$, a cycloalkyl group is preferable. As the cycloalkyl group formed by the bonding of two of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, a group having a heteroatom, such as a carbonyl group, or a vinylidene group. In addition, in such the cycloalkyl group, one or more of the ethylene groups constituting the cycloalkane ring may be substituted with a vinylene group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In a case where the resist composition is, for example, a resist composition for EUV exposure, it is preferable that the alkyl group, the cycloalkyl group, the alkenyl group, or the aryl group represented by each of $Rx_1$ to $Rx_3$, and a ring formed by the bonding of two of $Rx_1$ to $Rx_3$ further has a fluorine atom or an iodine atom as a substituent.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

Furthermore, the alkyl group, the cycloalkyl group, the aryl group, and the aralkyl group may include a heteroatom such as an oxygen atom, and/or a group having a heteroatom, such as a carbonyl group. For example, in the alkyl group, the cycloalkyl group, the aryl group, and the aralkyl group, one or more of the methylene groups may be substituted with a heteroatom such as an oxygen atom, and/or a group having a heteroatom, such as a carbonyl group.

In addition, in a repeating unit having an acid-decomposable group which will be described later, $R_{38}$ and another substituent contained in the main chain of the repeating unit may be bonded to each other to form a ring. A group formed by the mutual bonding of $R_{38}$ and another substituent in the main chain of the repeating unit is preferably an alkylene group such as a methylene group.

In a case where the resist composition is, for example, a resist composition for EUV exposure, it is preferable that the monovalent organic group represented by each of $R_{36}$ to $R_{38}$ and the ring formed by the mutual bonding of $R_{37}$ and $R_{38}$ further have a fluorine atom or an iodine atom as a substituent.

As Formula (Y3), a group represented by Formula (Y3-1) is preferable.

(Y3-1)

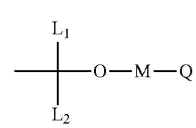

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination of these groups (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy of the resin (A) are increased in a repeating unit having an acid-decomposable group which will be described later, and thus, it is possible to suppress fogging, in addition to ensuring film hardness.

In a case where the resist composition is, for example, a resist composition for EUV exposure, it is also preferable that the alkyl group, the cycloalkyl group, an aryl group, or the group formed by combination of these groups, represented by each of $L_1$ and $L_2$, further has a fluorine atom or an iodine atom as a substituent. In addition, it is also preferable that the alkyl group, the cycloalkyl group, the aryl group, and the aralkyl group include a heteroatom such as an oxygen atom, in addition to the fluorine atom and the iodine atom (that is, in the alkyl group, the cycloalkyl group, the aryl group, and the aralkyl group, for example, one of the methylene groups is substituted with a heteroatom such as an oxygen atom, or a group having a heteroatom, such as a carbonyl group).

In addition, in a case where the resist composition is, for example, a resist composition for EUV exposure, it is also preferable that in an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination of these groups, represented by Q, the heteroatom is a heteroatom selected from the group consisting of a fluorine atom, an iodine atom, and an oxygen atom.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

In a case where the resist composition is, for example, a resist composition for EUV exposure, it is also preferable that the aromatic ring group represented by Ar, and the alkyl group, the cycloalkyl group, and the aryl group, represented by Rn, have a fluorine atom and an iodine atom as a substituent.

From the viewpoint that the acid decomposability is further improved, in a case where a non-aromatic ring is directly bonded to a polar group (or a residue thereof) in a leaving group that protects the polar group, it is also preferable that a ring member atom adjacent to the ring member atom directly bonded to the polar group (or a residue thereof) in the non-aromatic ring has no halogen atom such as a fluorine atom as a substituent.

In addition, the leaving group that leaves by the action of an acid may be a 2-cyclopentenyl group having a substituent (an alkyl group and the like), such as a 3-methyl-2-cyclopentenyl group, and a cyclohexyl group having a substituent (an alkyl group and the like), such as a 1,1,4,4-tetramethylcyclohexyl group.

As the repeating unit (A-a), a repeating unit represented by Formula (A) is also preferable.

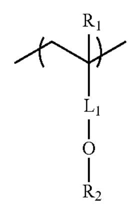

(A)

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom.

Furthermore, examples of a suitable aspect of the repeating unit represented by Formula (A) also include an aspect in which at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, as $L_1$, —CO—, an arylene group, or -arylene group-alkylene group which may have a fluorine atom or an iodine atom—is preferable, and —CO—, an arylene group, or -arylene group-alkylene group which may have a fluorine atom or an iodine atom—is more preferable.

As the arylene group, a phenylene group is preferable.

The alkylene group may be linear or branched. The number of carbon atoms of the alkylene group is not particularly limited, but is preferably 1 to 10, and more preferably 1 to 3.

In a case where the alkylene group has fluorine atoms or iodine atoms, the total number of fluorine atoms and iodine atoms included in the alkylene group is not particularly limited, but is preferably 2 or more, more preferably 2 to 10, and still more preferably 3 to 6.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3.

The alkyl group may include a heteroatom such as an oxygen atom, other than a halogen atom.

$R_2$ represents a leaving group that leaves by the action of an acid and may have a fluorine atom or an iodine atom. Examples of the leaving group which may have a fluorine atom or an iodine atom include a leaving group represented by any of Formulae (Y1) to (Y4) mentioned above and having a fluorine atom or an iodine atom, and suitable aspects thereof are also the same.

As the repeating unit (A-a), a repeating unit represented by General Formula (AI) is also preferable.

(AI)

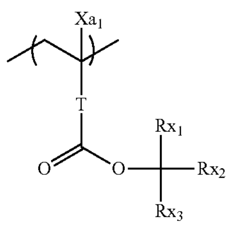

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group, a (monocyclic or polycyclic) cycloalkyl group, an aryl group, or an alkenyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —$CH_2$—$R_{11}$. $R_{11}$ represents a halogen atom (a fluorine atom or the like), a hydroxyl group, or a monovalent organic group, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt-group, Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

Examples of the alkenyl group of each of $Rx_1$ to $Rx_3$ include a vinyl group.

Examples of the aryl group of each of $Rx_1$ to $Rx_3$ include a phenyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may have one kind of the repeating unit (A-a) alone or may have two or more kinds thereof.

A content of the repeating unit (A-a) (a total content in a case where two or more kinds of the repeating units (A-a) are present) is preferably 15% to 80% by mole, and more preferably 20% to 70% by mole with respect to all the repeating units in the resin (A).

The resin (A) preferably has at least one repeating unit selected from the group consisting of repeating units represented by General Formulae (A-VIII) to (A-XII) as the repeating unit (A-a).

(A-VIII)

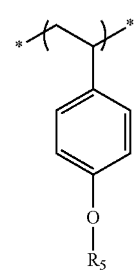

-continued (A-IX)

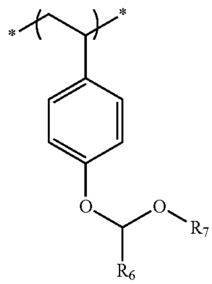

(A-X)

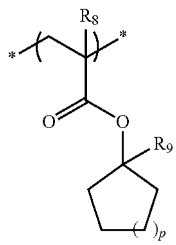

(A-XI)

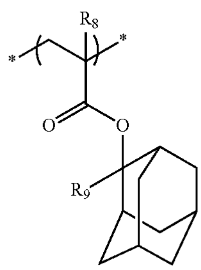

(A-XII)

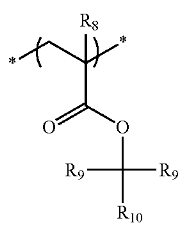

In General Formula (A-VIII), $R_5$ represents a tert-butyl group or a —CO—O-(tert-butyl) group.

In General Formula (A-IX), $R_6$ and $R_7$ each independently represent a monovalent organic group. Examples of the monovalent organic group include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

Repeating Unit (A-1) Having Acid Group>>

The resin (A) may have a repeating unit (A-1) having an acid group.

As the acid group, an acid group having a pKa of 13 or less is preferable. The acid dissociation constant of the acid group is preferably 13 or less, more preferably 3 to 13, and still more preferably 5 to 10, as described above.

In a case where the resin (A) has an acid group having a pKa of 13 or less, the content of the acid group in the resin (A) is not particularly limited, but is 0.2 to 6.0 mmol/g in many cases. Among those, the content of the acid group is preferably 0.8 to 6.0 mmol/g, more preferably 1.2 to 5.0 mmol/g, and still more preferably 1.6 to 4.0 mmol/g. In a case where the content of the acid group is within the range, the progress of development is improved, and thus, the shape of a pattern thus formed is more excellent and the resolution is also more excellent.

As the acid group, for example, a carboxyl group, a hydroxyl group, a phenolic hydroxyl group, a fluorinated alcohol group (preferably a hexafluoroisopropanol group), a sulfonic acid group, a sulfonamide group, or an isopropanol group is preferable.

In addition, in the hexafluoroisopropanol group, one or more (preferably one or two) fluorine atoms may be substituted with a group (an alkoxycarbonyl group and the like) other than a fluorine atom. $—C(CF_3)(OH)—CF_2—$ formed as above is also preferable as the acid group. In addition, one or more fluorine atoms may be substituted with a group other than a fluorine atom to form a ring including $—C(CF_3)(OH)—CF_2—$.

The repeating unit (A-1) having an acid group is preferably a repeating unit different from a repeating unit having the structure in which a polar group is protected by the above-mentioned leaving group that leaves by the action of an acid, and a repeating unit (A-2) having a lactone group, a sultone group, or a carbonate group which will be described later.

A repeating unit having an acid group may have a fluorine atom or an iodine atom.

As the repeating unit having an acid group, for example, the repeating unit having a phenolic hydroxyl group described in paragraphs 0089 to 0100 of JP2018-189758A can be preferably used.

In a case where the resin (A) includes the repeating unit (A-1) having an acid group, the composition (CR) including the resin (A) is preferable for KrF exposure, EB exposure, or EUV exposure. In such an aspect, the content of the repeating unit having an acid group in the resin (A) is preferably 30% to 100% by mole, more preferably 40% to 100% by mole, and still more preferably 50% to 100% by mole with respect to all the repeating units in the resin (A).

Repeating Unit (A-2) Having at Least One Selected from Group Consisting of Lactone Structure, Sultone Structure, Carbonate Structure, and Hydroxyadamantane Structure>>

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs 0094 to 0107 of WO2016/136354.

The resin (A) may have a repeating unit having a carbonate structure. The carbonate structure is preferably a cyclic carbonic acid ester structure.

Examples of the repeating unit having a carbonate structure include the repeating unit described in paragraphs 0106 to 0108 of WO2019/054311A.

The resin (A) may have a repeating unit having a hydroxyadamantane structure. Examples of the repeating unit having a hydroxyadamantane structure include a repeating unit represented by General Formula (AIIa).

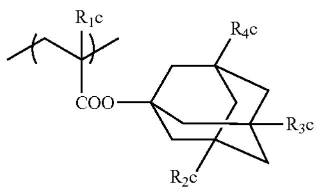

(AIIa)

In General Formula (AIIa), $R_1c$ represents a hydrogen atom, a methyl group, a trifluoromethyl group, or a hydroxymethyl group. $R_2c$ to $R_4c$ each independently represent a hydrogen atom or a hydroxyl group. It should be noted that at least one of $R_2c$, $R_3c$, or $R_4c$ represents a hydroxyl group. It is preferable that one or two of $R_2c$ to $R_4c$ are hydroxyl groups, and the rest are hydrogen atoms.

Repeating Unit Having Fluorine Atom or Iodine Atom>>

The resin (A) may have a repeating unit having a fluorine atom or an iodine atom.

Examples of the repeating unit having a fluorine atom or an iodine atom include the repeating units described in paragraphs 0080 and 0081 of JP2019-045864A.

Repeating Unit Having Photoacid Generating Group>>

The resin (A) may have, as a repeating unit other than those above, a repeating unit having a group that generates an acid upon irradiation with radiation.

Examples of the repeating unit having a fluorine atom or an iodine atom include the repeating units described in paragraphs 0092 to 0096 of JP2019-045864A.

Repeating Unit Having Alkali-Soluble Group>>

The resin (A) may have a repeating unit having an alkali-soluble group.

Examples of the alkali-soluble group include a carboxyl group, a sulfonamide group, a sulfonylimide group, a bissulfonylimide group, or an aliphatic alcohol group (for example, a hexafluoroisopropanol group) in which the α-position is substituted with an electron withdrawing group, and the carboxyl group is preferable. By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

Repeating Unit Having Neither Acid-Decomposable Group nor Polar Group>>

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs 0236 and 0237 of the specification of US2016/0026083A and the repeating units described in paragraph 0433 of the specification of US2016/0070167A.

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

(Characteristics of Resin (A))

In the resin (A), all repeating units are preferably composed of repeating units derived from a (meth)acrylate-based monomer. In this case, any of a resin in which all the repeating units are derived from a methacrylate-based monomer, a resin in which all the repeating units are derived from an acrylate-based monomer, and a resin in which all the repeating units are derived from a methacrylate-based monomer and an acrylate-based monomer may be used. The repeating units derived from the acrylate-based monomer are preferably 50% by mole or less with respect to all the repeating units in the resin (A).

In a case where the composition (CR) is for argon fluoride (ArF) exposure, it is preferable that the resin (A) does not substantially have an aromatic group from the viewpoint of the transmittance of ArF light. More specifically, the repeating unit having an aromatic group is preferably 5% by mole or less, more preferably 3% by mole or less, and ideally 0% by mole with respect to all the repeating units in the resin (A), that is, it is still more preferable that the repeating unit having an aromatic group is not included.

In addition, in a case where the composition (CR) is for ArF exposure, the resin (A) preferably has a monocyclic or polycyclic alicyclic hydrocarbon structure, and preferably does not include either a fluorine atom or a silicon atom.

In a case where the composition (CR) is for krypton fluoride (KrF) exposure, EB exposure, or EUV exposure, the resin (A) preferably has a repeating unit having an aromatic hydrocarbon group, and more preferably has a repeating unit having a phenolic hydroxyl group.

Examples of the repeating unit having a phenolic hydroxyl group include the repeating units exemplified as the above-mentioned repeating unit (A-1) having an acid group and a repeating unit derived from hydroxystyreneC (meth)acrylate.

In addition, in a case where the composition (CR) is for KrF exposure, EB exposure, or EUV exposure, it is also preferable that the resin (A) has a repeating unit having a structure in which a hydrogen atom of the phenolic hydroxyl group is protected by a group (leaving group) that leaves through decomposition by the action of an acid.

In a case where the composition (CR) is for KrF exposure, EB exposure, or EUV exposure, a content of the repeating unit having an aromatic hydrocarbon group included in the resin (A) is preferably 30% to 100% by mole, more preferably 40% to 100% by mole, and still more preferably 50% to 100% by mole, with respect to all the repeating units in the resin (A).

The resin (A) can be synthesized in accordance with an ordinary method (for example, radical polymerization).

The weight-average molecular weight (Mw) of the resin (A) is preferably 1000 to 200000, more preferably 3000 to 20000, and still more preferably 5000 to 15000. By setting the weight-average molecular weight (Mw) of the resin (A) to 1000 to 200000, it is possible to prevent deterioration of heat resistance and dry etching resistance, and it is also possible to prevent deterioration of the film forming property due to deterioration of developability and an increase in the viscosity. Incidentally, the weight-average molecular weight (Mw) of the resin (A) is a value expressed in terms of polystyrene as measured by the above-mentioned GPC method.

The dispersity (molecular weight distribution) of the resin (A) is usually 1 to 5, preferably 1 to 3, and more preferably 1.1 to 2.0. The smaller the dispersity, the better the resolution and the resist shape, the smoother the side wall of a pattern, and the more excellent the roughness.

The content of the resin (A) in the composition (CR) is preferably 50% to 99.9% by mass, and more preferably 60% to 99.0% by mass with respect to the total solid content of the composition (CR).

In addition, the resin (A) may be used alone or in combination of two or more kinds thereof.

Furthermore, in the present specification, the solid content means a component that can form a resist film excluding the solvent. Even in a case where the properties of the components are liquid, they are treated as solid contents.

(Photoacid Generator (P))

The composition (CR) includes a photoacid generator (P). The photoacid generator (P) is not particularly limited as long as it is a compound that generates an acid upon irradiation with radiation.

The photoacid generator (P) may be in a form of a low-molecular-weight compound or a form incorporated into a part of a polymer. In addition, a combination of the form of a low-molecular-weight compound and the form incorporated into a part of a polymer may also be used.

In a case where the photoacid generator (P) is in the form of the low-molecular-weight compound, the weight-average molecular weight (Mw) is preferably 3000 or less, more preferably 2000 or less, and still more preferably 1000 or less.

In a case where the photoacid generator (P) is in the form incorporated into a part of a polymer, it may be incorporated into the part of the resin (A) or into a resin that is different from the resin (A).

In the present invention, the photoacid generator (P) is preferably in the form of a low-molecular-weight compound.

The photoacid generator (P) is not particularly limited as long as it is a known one, but a compound that generates an organic acid upon irradiation with radiation is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

The volume of an acid generated from the photoacid generator (P) is not particularly limited, but from the viewpoint of suppressing the diffusion of the acid generated upon exposure into the unexposed area and improving the resolution, the volume is preferably 240 Å$^3$ or more, more preferably 305 Å$^3$ or more, still more preferably 350 Å$^3$ or more, and particularly preferably 400 Å$^3$ or more. Incidentally, from the viewpoint of the sensitivity or the solubility in an application solvent, the volume of the acid generated from the photoacid generator (P) is preferably 1500 Å$^3$ or less, more preferably 1000 Å$^3$ or less, and still more preferably 700 Å$^3$ or less.

The value of the volume is obtained using "WinMOPAC" manufactured by Fujitsu Limited. For the computation of the value of the volume, first, the chemical structure of the acid according to each example is input, next, using this structure as the initial structure, the most stable conformation of each acid is determined by molecular force field computation using a Molecular Mechanics (MM) 3 method, and thereafter, with respect to the most stable conformation, molecular orbital computation using a parameterized model number (PM) 3 method is performed, whereby the "accessible volume" of each acid can be computed.

The structure of an acid generated from the photoacid generator (P) is not particularly limited, but from the viewpoint that the diffusion of the acid is suppressed and the resolution is improved, it is preferable that the interaction between the acid generated from the photoacid generator (P) and the resin (A) is strong. From this viewpoint, in a case where the acid generated from the photoacid generator (P) is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

Among those, the photoacid generator (P) is preferably a photoacid generator consisting of an anionic moiety and a cationic moiety from the viewpoint that the effect of the present invention is more excellent.

Examples of the photoacid generator (P) include the photoacid generators described in paragraphs 0144 to 0173 of JP2019-045864A.

The content of the photoacid generator (P) is not particularly limited, but from the viewpoint that the effect of the present invention is more excellent, the content is preferably 5% to 50% by mass, more preferably 5% to 40% by mass, and still more preferably 5% to 35% by mass with respect to the total solid content of the composition (CR).

The photoacid generators (P) may be used alone or in combination of two or more kinds thereof. In a case where two or more kinds of the photoacid generators (P) are used in combination, the total amount thereof is preferably within the range.

(Acid Diffusion Control Agent (Q))

The composition (CR) may include an acid diffusion control agent (Q).

The acid diffusion control agent (Q) acts as a quencher that suppresses a reaction of an acid-decomposable resin in the unexposed portion by excessive generated acids by trapping the acids generated from a photoacid generator (Q) and the like upon exposure. For example, as the acid diffusion control agent (Q), a basic compound (DA), a basic compound (DB) having basicity reduced or lost upon irradiation with radiation, an onium salt (DC) which serves as a weak acid relative to a photoacid generator (P), a low-molecular-weight compound (DD) having a nitrogen atom and a group that leaves by the action of an acid, an onium salt compound (DE) having a nitrogen atom in a cationic moiety, and the like can be used.

In the composition (CR), a known acid diffusion control agent can be appropriately used. For example, the known compounds disclosed in paragraphs [0627] to [0664] of US2016/0070167A, paragraphs [0095] to [0187] of US2015/0004544A, paragraphs [0403] to [0423] of US2016/0237190A, and paragraphs [0259] to [0328] of US2016/0274458A can be suitably used as the acid diffusion control agent (Q).

Examples of the basic compound (DA) include the repeating units described in paragraphs 0188 to 0208 of JP2019-045864A.

In the composition (CR), the onium salt (DC) which is a relatively weak acid with respect to the photoacid generator (P) can be used as the acid diffusion control agent (Q).

In a case where the photoacid generator (P) and the onium salt generating an acid that is a weak acid relative to an acid generated from the photoacid generator (P) are mixed and used, an acid generated from the photoacid generator (P) upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

Examples of the onium salt which serves as a weak acid relative to the photoacid generator (P) include the onium salts described in paragraphs 0226 to 0233 of JP2019-070676A.

In a case where the composition (CR) includes an acid diffusion control agent (Q), a content of the acid diffusion control agent (Q) (a total content in a case where a plurality of kinds of the acid diffusion control agents are present) is preferably 0.1% to 10.0% by mass, and more preferably 0.1% to 5.0% by mass, with respect to the total solid content of the composition (CR).

In the composition (CR), the acid diffusion control agents (Q) may be used alone or in combination of two or more kinds thereof.

(Hydrophobic Resin (E))

The composition (CR) may include a hydrophobic resin different from the resin (A) as the hydrophobic resin (E).

Although it is preferable that the hydrophobic resin (E) is designed to be present at a higher density on a surface of the resist film, it does not necessarily need to have a hydrophilic group in the molecule as different from the surfactant, and may not contribute to uniform mixing of polar materials and non-polar materials.

Examples of the effect of addition of the hydrophobic resin (E) include a control of static and dynamic contact angles of a surface of the resist film with respect to water and suppression of out gas.

The hydrophobic resin (E) preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. Incidentally, the hydrophobic resin (E) preferably has a hydrocarbon group having 5 or more carbon atoms. These groups may be contained in the main chain of the resin or may be substituted in a side chain.

In a case where hydrophobic resin (E) includes a fluorine atom and/or a silicon atom, the fluorine atom and/or the silicon atom in the hydrophobic resin may be included in the main chain or a side chain of the resin.

In a case where the hydrophobic resin (E) contains a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and the alkyl group may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group such as a phenyl group and a naphthyl group, in which at least one hydrogen atom is substituted with a fluorine atom, and the aryl group may further have a substituent other than a fluorine atom.

Examples of the repeating unit having a fluorine atom or a silicon atom include those exemplified in paragraph 0519 of US2012/0251948.

In addition, as described above, it is also preferable that the hydrophobic resin (E) has a $CH_3$ partial structure in a side chain moiety.

Here, the $CH_3$ partial structure contained in the side chain moiety in the hydrophobic resin includes a $CH_3$ partial structure contained in an ethyl group, a propyl group, and the like. On the other hand, a methyl group bonded directly to the main chain of the hydrophobic resin (E) (for example, an $\alpha$-methyl group in the repeating unit having a methacrylic acid structure) makes only a small contribution to uneven distribution on the surface of the hydrophobic resin (E) due to the effect of the main chain, and it is therefore not included in the $CH_3$ partial structure in the present invention.

With regard to the hydrophobic resin (E), reference can be made to the description in paragraphs [0348] to [0415] of JP2014-010245A, the contents of which are incorporated herein by reference.

Furthermore, the resins described in JP2011-248019A, JP2010-175859A, and JP2012-032544A can also be preferably used as the hydrophobic resin (E).

In a case where the composition (CR) includes the hydrophobic resin (E), a content of the hydrophobic resin (E) is preferably 0.01% to 20% by mass, and more preferably 0.1% to 15% by mass with respect to the total solid content of the composition (CR).

(Solvent (F))

The composition (CR) may include a solvent (F).

In a case where the composition (CR) is a radiation-sensitive resin composition for EUV, it is preferable that the solvent (F) includes at least one solvent of (M1) propylene glycol monoalkyl ether carboxylate or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as the solvent. The solvent in this case may further include components other than the components (M1) and (M2).

The solvent including the components (M1) and (M2) is preferable since a use of the solvent in combination with the above-mentioned resin (A) makes it possible to form a pattern having a small development defect count can be formed while improving the coating property of the composition (CR).

In a case where the composition (CR) is a radiation-sensitive resin composition for ArF, examples of the solvent (F) include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may include a ring, alkylene carbonate, alkyl alkoxyacetate, and alkyl pyruvate.

A content of the solvent (F) in the composition (CR) is preferably set such that the concentration of solid contents is 0.5% to 40% by mass.

As one aspect of the composition (CR), it is also preferable that the concentration of solid contents is 10% by mass or more.

(Surfactant (H))

The composition (CR) may include a surfactant (H). By allowing the composition (CR) to include the surfactant (H), it is possible to form a pattern having more excellent adhesiveness and fewer development defects.

As the surfactant (H), fluorine-based and/or silicon-based surfactants are preferable.

Examples of the fluorine-based and/or silicon-based surfactant include the surfactants described in paragraph [0276] of the specification of US2008/0248425A. In addition, EFTOP EF301 or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS Co., Ltd.) may be used. In addition, Polysiloxane Polymer KP-341 (manufactured by Shin-Etsu Chemical Co., Ltd.), can also be used as the silicon-based surfactant.

Moreover, the surfactant (H) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant (H). This fluoroaliphatic compound can be synthesized, for example, by the method described in JP2002-90991A.

As the polymer having a fluoroaliphatic group, a copolymer of a monomer having a fluoroaliphatic group and (poly(oxyalkylene))acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene))acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F-178, F-470, F-473, F-475, F-476, and F-472 (manufactured by DIC Corporation), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly (oxypropylene))acrylate (or methacrylate).

In addition, a surfactant other than the fluorine-based surfactant and/or the silicon-based surfactants described in paragraph [0280] of US2008/0248425A may be used.

These surfactants (H) may be used alone or in combination of two or more kinds thereof.

The content of the surfactant (H) is preferably 0.0001% to 2% by mass and more preferably 0.0005% to 1% by mass with respect to the total solid content of the composition (CR).

(Other Additives)

The composition (CR) may further include a crosslinking agent, an alkali-soluble resin, a dissolution inhibiting compound, a dye, a plasticizer, a photosensitizer, a light absorber, and/or a compound that accelerates solubility in a developer.

<Negative Tone Resist Composition (NR)>

The resist composition may be a negative tone resist composition.

The negative tone resist composition is preferably a composition including a resin having a phenolic hydroxyl group, a photoacid generator, a crosslinking agent, and a solvent (hereinafter also referred to as a "negative tone resist composition (NR)").

The negative tone resist composition (NR) is not particularly limited, but examples thereof include the actinic ray-sensitive or radiation-sensitive resin composition disclosed in WO2016/072169A and the actinic ray-sensitive or radiation-sensitive resin composition disclosed in WO2019/039290A.

Thermosetting Composition>>

The thermosetting composition is not particularly limited as long as the coating film of the thermosetting composition can be removed with a removal solvent, and a thermosetting composition that can be used in the manufacture of a semiconductor can be used.

Examples of the thermosetting composition that can be used in the manufacture of a semiconductor include thermosetting compositions for forming BARC (antireflection film), SOC (spin on carbon film), SOG (spin on glass film), TARC (antireflection film), a topcoat material for liquid immersion, and the like.

Hereinafter, an example of an aspect of an antireflection film composition (thermosetting composition for forming an antireflection film), which is one of the thermosetting compositions suitable as the inspection composition, will be described.

<Antireflection Film Composition (HC)>

(Suitable Aspect of Antireflection Film Composition (HC))

As a preferred aspect of the antireflection film composition (HC), a composition including a film constituent material of the antireflection film and an organic solvent component is preferable.

The film constituent material may be either an organic material, or an inorganic material including a silicon atom, and main examples thereof include a binder component such as a resin and/or a crosslinking agent, and an absorbent component that absorbs a specific wavelength such as ultraviolet rays. Each of these components may be used alone as the film constituent material, or in combination of two or more kinds thereof (that is, a resin and a crosslinking agent, a crosslinking agent and an absorbent component, a resin and an absorbent component, and a resin, a crosslinking agent and an absorbent component) as the film constituent material. In addition, a surfactant, an acid compound, an acid generator, a crosslinking accelerator, a rheology adjuster, an adhesion aid, or the like may be added to the antireflection film composition, as necessary.

(Another Preferred Aspect of Antireflection Film Composition (HC)

In addition, as another suitable aspect of the antireflection film composition (HC), for example, a composition including a polyfunctional epoxy compound that has a plurality of epoxy moieties in a side chain of the core unit and one or more crosslinkable chromophores bonded thereto, a vinyl ether crosslinking agent, and an organic solvent component is also preferable. The "epoxy moiety" refers to at least one of a closed epoxide ring or a ring-opened (reacted) epoxy group, such as a reacted or unreacted glycidyl group or glycidyl ether group.

In addition, the "crosslinkable chromophore" refers to a light-damaged portion having a crosslinkable group which is in a free state (that is, unreacted) after the chromophore is bonded to the polyfunctional epoxy compound.

Examples of a monomer that induces the core unit include those including polyfunctional glycidyl, such as tris(2,3-epoxypropyl)isocyanurate, tris(4-hydroxylphenyl)methane triglycidyl ether, trimethylolpropane triglycidyl ether, poly(ethylene glycol)diglycidyl ether, bis[4-(glycidyloxy)phenyl]methane, bisphenol A diglycidyl ether, 1,4-butanediol diglycidyl ether, resorcinol diglycidyl ether, 4-hydroxybenzoic acid diglycidyl ether, glycerol diglycidyl ether, 4,4'-methylenebis(N,N-diglycidyl aniline), monoaryl diglycidyl isocyanurate, tetrakis(oxiranylmethyl)benzene-1,2,4,5-tetracarboxylate, bis(2,3-epoxypropyl)terephthalate, and tris(oxiranylmethyl)benzene-1,2,4-tricarboxylate; 1,3-bis(2,4-bis(glycidyloxy)phenyl)adamantane, 1,3-bis(1-adamantyl)-4,6-bis(glycidyloxy)benzene, 1-(2',4'-bis(glycidyloxy)phenyl)adamantane, and 1,3-bis(4'-glycidyloxyphenyl)adamantane; and polymers such as poly[(phenyl glycidyl ether)-co-formaldehyde], poly[(o-cresyl glycidyl ether)-co-formaldehyde], poly(glycidyl methacrylate), poly(bisphenol A-co-epichlorohydrin)-glycidyl end-capped, poly(styrene-co-glycidyl methacrylate), and poly(tert-butyl methacrylate-co-glycidyl methacrylate).

Examples of a precursor (compound before the bonding) of the chromophore include 1-hydroxy-2-naphthoic acid, 2-hydroxy-1-naphthoic acid, 6-hydroxy-2-naphthoic acid 3-hydroxy-2-naphthoic acid, 1,4-dihydroxy-2-naphthoic acid, 3,5-dihydroxy-2-naphthoic acid, 3,7-dihydroxy-2-naphthoic acid, 1,1'-methylene-bis(2-hydroxy-3-naphthoic acid), 2,3-dihydroxybenzoic acid, 2,4-dihydroxybenzoic acid, 2,6-dihydroxybenzoic acid, 3,4-dihydroxybenzoic acid, 3,5-dihydroxybenzoic acid, 3,5-dihydroxy-4-methylbenzoic acid, 3-hydroxy-2-anthracenecarboxylic acid, 1-hydroxy-2-anthracenecarboxylic acid, 3-hydroxy-4-methoxymandelic acid, gallic acid, and 4-hydroxybenzoic acid.

(Another Preferred Aspect of Antireflection Film Composition (HC))

Moreover, as another suitable aspect of the antireflection film composition (HC), a composition including a monomer including an aromatic ring or a polymer including an aromatic ring, and a halogen-based organic solvent having one or more carbon atoms (also simply referred to as a halogen-based organic solvent), in which a content of the halogen-based organic solvent is 0.001 to 50 ppm by mass with respect to the total mass of the composition, is preferable.

The aromatic ring in the monomer including an aromatic ring or the polymer including an aromatic ring may be a monocycle or a polycycle. The aromatic ring may be an aromatic hydrocarbon ring or an aromatic heterocyclic ring. The number of ring member atoms in the aromatic ring is preferably 5 to 25, and more preferably 6 to 20.

The number of aromatic rings contained in one repeating unit containing aromatic rings in the polymer including an aromatic ring, or the monomer including aromatic rings is 1 or more, preferably 1 to 10, and more preferably 1 to 4.

Usually, the polymer including an aromatic ring is a polymer (resin) having a repeating unit derived from a monomer including an aromatic ring.

That is, the monomer including an aromatic ring may be a monomer from which (a part or all of) repeating units contained in the polymer including an aromatic ring is derived.

The composition may include only the monomer including an aromatic ring, may include only the polymer including an aromatic ring, or may include both the monomer including an aromatic ring and the polymer including an aromatic ring.

The polymer including an aromatic ring is not particularly limited as long as it has an aromatic ring, and examples thereof include a novolac resin, a (meth)acrylic resin, a styrene resin, a cellulose resin, an aromatic polyester resin, an aromatic polyimide resin, a polybenzoxazole-based resin, an aromatic polyamide resin, an acenaphthylene-based resin, and an isocyanuric acid-based resin.

In addition, the polymer including an aromatic ring may be, where possible, a copolymer having a plurality of kinds of repeating units in the above-mentioned resin (a styrene-(meth)acrylic copolymer resin, a styrene-acenaphthylene-based copolymer resin, and the like).

As the aromatic polyamide resin and the aromatic polyimide resin, for example, the resin compounds described in JP4120584B, the resin compounds described in paragraphs [0021] to [0053] of JP4466877B, or the resin compounds described in paragraphs [0025] to [0050] of JP4525940B can be used.

In addition, as the novolac resin, the resin compounds described in paragraphs [0015] to [0058] of JP5215825B and paragraphs [0023] to [0041] of JP5257009B can be used. As the acenaphthylene-based resin, for example, the resin compounds described in paragraphs [0032] to [0052] of JP4666166B, the resin compounds described in paragraphs [0037] to [0043] of JP04388429B, the polymers described in paragraphs [0026] to [0065] of JP5040839B, and the resin compounds described in paragraphs [0015] to [0032] of JP4892670B can be used.

It is also preferable that the monomer including an aromatic ring and the polymer including an aromatic ring include a crosslinking reactive group, or include a hydroxyl group (preferably an aromatic hydroxyl group, and more preferably a phenolic hydroxyl group).

In addition, it is also preferable that the monomer including an aromatic ring includes a lactone structure. Furthermore, it is also preferable that the polymer including an aromatic ring includes a repeating unit containing a lactone structure.

In the polymer including an aromatic ring, the content of the repeating unit including an aromatic ring (preferably a repeating unit having an aromatic hydroxyl group) is preferably 30% to 100% by mass, more preferably 50% to 100% by mass, and still more preferably 75% to 100% by mass with respect to all the repeating units of the polymer including an aromatic ring.

The weight-average molecular weight of the polymer including an aromatic ring is preferably 250 to 30000, and more preferably 1000 to 7000.

The halogen-based organic solvent preferably includes, for example, one or more selected from the group consisting of methylene chloride, chloroform, trichloroethylene, o-dichlorobenzene, and benzotrifluoride.

[Use of Inspection Method for Composition]

The inspection method can be used for quality control of the produced composition. For example, a composition in which the number of defects obtained by the inspection using the inspection method of the embodiment of the present invention is equal to or less than a predetermined value can be shipped as an acceptable product. In addition, in the case of disqualification, the necessity of a further purification treatment can be detected.

[Method for Verifying Composition]

The method for verifying a composition according to an embodiment of the present invention relates to a method for verifying a composition selected from the group consisting of a resist composition and a thermosetting composition, in which the method includes the above-mentioned inspection method according to the embodiment of the present invention, and the method for verifying a composition has a defect count acquisition step and a determination step.

Defect count acquisition step: A step of acquiring the number of defects on a substrate by the above-mentioned inspection method of the embodiment of the present invention Determination step: A step of comparing the number of acquired defects with reference data to determine whether or not the number is within an acceptable range Furthermore, the method for preparing the composition (inspection composition) and the inspection method are as described above, and preferred embodiments thereof are also the same.

The number of defects acquired in the defect count acquisition step is, for example, the number of defects obtained by the step X3 in the above-mentioned first embodiment of the inspection method; the number of defects measured in the step X3C in the above-mentioned third embodiment of the inspection method; the number of defects measured in the step X3D in the above-mentioned fourth embodiment of the inspection method; and the number of defects measured in the step 3E in the above-mentioned fifth embodiment of the inspection method.

In the determination step, the number of defects obtained in the defect count acquisition step is compared with reference data to determine whether or not the amount of a foreign substance in the composition (inspection composition) is within an acceptable range.

The reference data is, for example, a reference value (for example, an upper limit value) of the number of defects set in advance by a user, based on a correlation between a desired performance and the defect count, and is determined to be "acceptable" and "not acceptable" based on the reference value.

Examples of a suitable aspect of the reference value based on the reference data include an aspect in which the number of defects is 0.75 defects/cm$^2$ or less.

The above-described verification method can be used for quality control of the produced composition. For example, a composition in which the number of defects obtained by a verification using the verification method of the embodiment of the present invention is equal to or less than a predetermined value can be shipped as an acceptable product.

[Method for Producing Composition]

First Embodiment of Method for Producing Composition

A first embodiment of the method for producing a composition of the present invention is a method for producing a composition selected from the group consisting of a resist composition and a thermosetting composition, in which the method has the following composition preparation step and inspection step.

- Composition preparation step: A step of preparing a composition selected from the group consisting of a resist composition and a thermosetting composition (inspection composition)
- Inspection step: A step of subjecting the composition (inspection composition) obtained by the composition preparation step to an inspection based on the inspection method of the embodiment of the present invention Furthermore, the method for preparing the composition (inspection composition) and the inspection method are as described above, and preferred embodiments thereof are also the same.

In a case where it is detected by the inspection step that the number of defects derived from the composition is larger than a predetermined value, it is preferable that the inspection composition having undergone the inspection step is further subjected to a purification treatment. In addition, the inspection step may be carried out only once or a plurality of times after the composition is prepared.

A preferred aspect of the production method of the present invention includes a production method including the following composition preparation step, inspection step, purification step, and re-inspection step. The production method may further have a repeating step (once or more times for the repeating step), as necessary.

- Composition preparation step: A step of preparing a composition selected from the group consisting of a resist composition and a thermosetting composition (inspection composition)

Inspection step: A step of subjecting the composition (inspection composition) obtained by the composition preparation step to an inspection based on the inspection method of the embodiment of the present invention Purification step: A step of further subjecting the composition having undergone the defect inspection step to a purification treatment (for example, a filtration treatment)

Re-inspection step: A step of subjecting the composition (inspection composition) having undergone the purification step to an inspection based on the inspection method of the embodiment of the present invention again Repeating step: A step of carrying out the purification step and the subsequent re-inspection step again in a case where the number of defects derived from the composition, detected in the re-inspection step, does not satisfy a predetermined value.

Second Embodiment of Method for Producing Composition

A second embodiment of the method for producing a composition of the present invention is a method for producing a composition selected from the group consisting of a resist composition and a thermosetting composition, in which the method has the following composition preparation step and verification step.

Composition preparation step: A step of preparing a composition selected from the group consisting of a resist composition and a thermosetting composition (inspection composition)

Verification implementation step: A step of subjecting the composition (inspection composition) obtained by the composition preparation step to a verification based on the verification method of the embodiment of the present invention (verification implementation step)

Furthermore, the method for preparing the composition (inspection composition) and the verification method are as described above, and preferred embodiments thereof are also the same.

In the second embodiment of the production method of the present invention, a composition determined to be "acceptable" in the verification implementation step is produced. In other words, in the second embodiment of the production method of the present invention, a high-purity composition determined to be "acceptable" in the verification implementation step can be obtained.

[Method for Manufacturing Electronic Device]

In addition, the present invention further relates to a method for manufacturing an electronic device, having a step of carrying out inspection based on the above-mentioned inspection method of the embodiment of the present invention, and an electronic device manufactured by this manufacturing method.

In a specific aspect of the method for manufacturing an electronic device, it is preferable to have a step based on the above-mentioned method for producing a composition of the embodiment of the present invention.

The electronic device is not particularly limited, and is, for example, suitably mounted on electric and electronic equipment (for example, home appliances, office automation (OA)-related equipment, media-related equipment, optical equipment, telecommunication equipment, and the like).

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

Furthermore, in the tables, for "Defect count per unit area (unit: defects/cm$^2$)", values up to the third digit of the decimal point are calculated using the "Defect count (unit: defects)" and values obtained by rounding off to the third decimal place value are shown.

[Preparation of Removal Solvent (Removal Solvent Used in Step X2)]

[Types of Removal Solvents]

The following organic solvents were prepared as the removal solvent.

nBA: Butyl acetate

PGMEA: Propylene glycol monomethyl ether acetate

PGME: Propylene glycol monomethyl ether

CyHx: Cyclohexanone gBL: γ-Butyrolactone

MAK: Methyl amyl ketone

PP3/7: Mixed solvent of PGMEA/PGME=30/70 (mass ratio)

[Filtration of Removal Solvent]

The filters shown below were prepared, each removal solvent was filtered according to the description in Table 1, and a liquid after the filtration was filled in a gallon bottle. Furthermore, for the filtration procedure, reference was made to the methods described in paragraphs 205 to 208 of JP2016-075920A. It should be noted that the number of filters was one stage.

<Types of Filters>

A: 20 nm Nylon filter manufactured by PALL Corporation

B: 2 nm Nylon filter manufactured by PALL Corporation

C: PhotoKleen NTD filter manufactured by PALL Corporation

D: 50 nm Polyethylene filter manufactured by Entegris

E: 10 nm Polyethylene filter manufactured by Entegris

F: 3 nm Polyethylene filter manufactured by Entegris

G: Azora Photochemical filter manufactured by Entegris

[Defect Inspection of Inspection Wafer]

A 12 inch (diameter: 300 mm) silicon wafer used for an inspection was subjected to a defect inspection using a dark-field defect inspection device (Surfscan (registered trademark) SP5 manufactured by KLA-Tencor), and the number of defects (defect count) with a size of 19 nm or more existing on a surface of the silicon wafer was measured. The results are shown in Table 1 as "EX: Original defect count on substrate".

Furthermore, in the measurement of the number of defects with a size of 19 nm or more existing on the surface of the 12 inch silicon wafer using the dark-field defect inspection device, the investigation region is a concentric circle of the 12 inch silicon wafer, which is an in-circle region having an area of 660 $cm^2$. In other words, an in-circle region of the circle having the same center as the center of the 12 inch silicon wafer and having an area of 660 $cm^2$ was defined as the inspection region.

In addition, in each table which will be described later, the defect count in the in-circle region (unit: defects) and the defect count per unit area (unit: defects/$cm^2$) are shown as a measurement result of the number of defects with a size of 19 nm or more existing on a surface of the 12 inch silicon wafer using the dark-field defect inspection device.

[Evaluation of Degree of Cleanliness of Removal Solvent (Measurement of Defect Count Derived from Removal Solvent Used in Step X2)]

The above-described removal solvents after filtration were each connected to a resist line of a coater (Tokyo Electron Limited, CLEAN TRACK (registered trademark), ACT (registered trademark) 12) (incidentally, at the time of the connection, a dummy capsule was used without connecting a filter to a connection pipe). Subsequently, the removal solvent connected by the above-described method was applied onto the 12 inch (diameter: 300 mm) silicon wafer in which the defect count had been inspected in advance in [Defect Inspection of Inspection Wafer] mentioned above with the coater (discharged at a flow rate of 1 mL/S for 10 seconds), and then baked at 100° C. for 60 seconds.

With regard to the wafer after the application of the removal solvent obtained by the procedure, the number of defects (defect count) with a size of 19 nm or more existing on a surface of the silicon wafer was measured using a dark-field defect inspection device (Surfscan (registered trademark) SP5 manufactured by KLA-Tencor). The results are shown in Table 1 as "F: Defect count after application of removal solvent".

Next, "C: Defect count of removal solvent" was determined by the following calculation expression, based on the results of "EX: Original defect count on substrate" and "F: Defect count after application of removal solvent" obtained by the various inspections.

The results are shown in Table 1.

[C: Defect count of removal solvent]=[F: Defect count after application of removal solvent]−[EX: Original defect count on substrate]  Expression (A1):

Table 1 is shown below.

In addition, in Table 1, the solvents obtained by different filtration methods even though they are the same solvent are represented by notations of -A, -B, and -C. For example, although "nBA-A" and "nBA-B" are each butyl acetate (nBA), they are obtained by different filtration methods. Here, "nBA-A" means one obtained by filtering nBA by C described in the column of "Filter" (that is, "C: PhotoKleen NTD filter manufactured by PALL Corporation" described in <Type of Filter> described above).

Furthermore, the above-mentioned notation of each removal solvent in Table 1 has the same definition as the notation in Table 2 or later or Table 1.

TABLE 1

| | | [C: Defect count of removal solvent] (Defect count derived from removal solvent used in step X2) | | | | | | | | | | |
|---|---|---|---|---|---|---|---|---|---|---|---|---|
| | | nBA-A | nBA-B | PGMEA-A | PGME-A | CyHx-A | CyHx-B | CyHx-C | gBL-A | MAK-A | PP3/7-A | PP3/7-B |
| Filter | | C | A | F | B | C | E | D | B | F | G | A |
| [EX: Original defect count on substrate] | Unit: defects/$cm^2$ | 0.02 | 0.02 | 0.02 | 0.03 | 0.02 | 0.02 | 0.02 | 0.02 | 0.03 | 0.03 | 0.03 |
| | Unit: defects | 12 | 15 | 16 | 20 | 11 | 16 | 16 | 16 | 22 | 23 | 19 |
| [F: Defect count after application of removal solvent] | Unit: defects/$cm^2$ | 0.19 | 2.30 | 0.25 | 0.33 | 0.18 | 1.04 | 2.96 | 0.30 | 0.49 | 0.25 | 3.58 |
| | Unit: defects | 125 | 1515 | 162 | 220 | 116 | 685 | 1955 | 198 | 324 | 162 | 2360 |
| [C: Defect count of removal solvent] | Unit: defects/$cm^2$ | 0.17 | 2.27 | 0.22 | 0.30 | 0.16 | 1.01 | 2.94 | 0.28 | 0.46 | 0.21 | 3.55 |
| | Unit: defects | 113 | 1500 | 146 | 200 | 105 | 669 | 1939 | 182 | 302 | 139 | 2341 |

[Preparation of Resist Composition (for ArF)]

As the resist composition, a resist composition ArF-1 was prepared by the following procedure.

In addition, three types of resist compositions, ArF-1A, ArF-1B, and ArF-1C, were prepared by subjecting the resist composition ArF-1 prepared by the following procedure to different three types of filtration treatments, as shown in the latter section.

[Preparation of Resist Composition ArF-1]

Synthesis Example (Synthesis of Resin A-1)

Under a nitrogen stream, 102.3 parts by mass of cyclohexanone was heated to 80° C. While stirring this liquid, a mixed solution of 22.2 parts by mass of a monomer represented by Structural Formula M-1, 22.8 parts by mass of a monomer represented by Structural Formula M-2, 6.6 parts by mass of a monomer represented by Structural Formula M-3, 189.9 parts by mass of cyclohexanone, and 2.40 parts by mass of dimethyl 2,2'-azobisisobutyrate [V-601 manufactured by FUJIFILM Wako Pure Chemical Corporation] was added dropwise thereto over 5 hours. After the completion of dropwise addition, the mixture was further stirred at 80° C. for 2 hours. The reaction solution was left to be cooled, then reprecipitated with a large amount of hexane/ethyl acetate (mass ratio: 9:1), and filtered, and the obtained solid was vacuum-dried to obtain 41.1 parts by mass of an acid-decomposable resin (A-1).

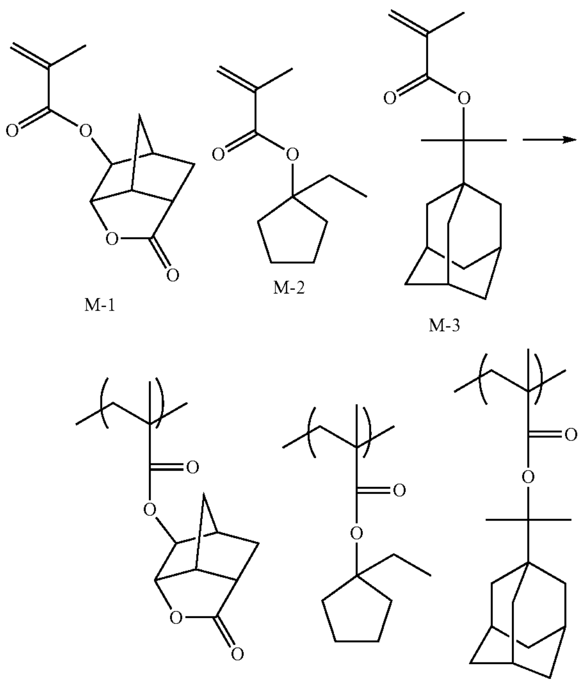

M-1 M-2 M-3

A-1

The obtained resin had a weight-average molecular weight (Mw: expressed in terms of polystyrene) of Mw=9500 and a dispersity Mw/Mn=1.60, as determined from GPC (carrier: tetrahydrofuran (THF)). The compositional ratio (molar ratio) measured by $^{13}C$-NMR was (Structure derived from M-1)/(Structure derived from M-2)/(Structure derived from M-3)=40/50/10.

<Preparation of Resist Composition ArF-1>

A resist composition ArF-1 was prepared by mixing each of components shown below.

Furthermore, the compositional ratio of each repeating unit in a hydrophobic resin (P'-5) is intended to be a molar ratio.

| | |
|---|---|
| Acid-decomposable resin (the above-mentioned resin A-1) | 1,267 g |
| Photoacid generator (PAG-7 shown below) | 101 g |
| Quencher (C-1 shown below) | 22 g |
| Hydrophobic resin (P'-5 shown below) | 10 g |
| PGMEA | 38,600 g |

-continued

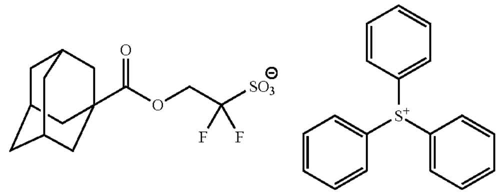

PAG-7

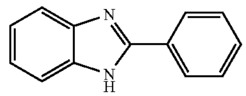

C-1

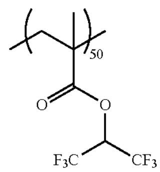

(P'-5)

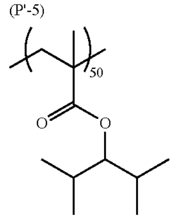

Mw: 15000
Mw/Mn: 1.5

<Filtration of Resist Solution>

In addition, three types of resist compositions, ArF-1A, ArF-1B, and ArF-1C, were prepared by subjecting the resist composition ArF-1 prepared by the procedure to different three types of filtration treatments.

(Resist Composition ArF-1A)

12,000 g of the resist composition ArF-1 was filtered through a polyethylene filter with a pore size of 10 nm, manufactured by Entegris, to obtain a resist composition ArF-1A.

(Resist Composition ArF-1B)

12,000 g of the resist composition ArF-1 was filtered through the following two-stage filter to obtain a resist composition ArF-1B.

First stage: Nylon filter with a pore size of 5 nm, manufactured by PALL Corporation Second stage: Polyethylene filter with a pore size of 1 nm, manufactured by Entegris (Resist Composition ArF-1C)

12,000 g of the resist composition ArF-1 was circulation-filtered 15 times with the following two-stage filter to obtain a resist composition ArF-1C (incidentally, the circulation filtration performed 15 times means that the flow rate was measured and the number of passages of an amount 15 times the input amount of 12,000 g was 15).

First stage: Nylon filter with a pore size of 5 nm, manufactured by PALL Corporation Second stage: Polyethylene filter with a pore size of 1 nm, manufactured by Entegris

[Inspection of Resist Composition: Examples 1 to 11]

[Defect Inspection of Inspection Wafer (Corresponding to Step Y1)]

Prior to the defect evaluation of the resist film, a defect inspection was carried out using a 12 inch (diameter: 300 mm) silicon wafer (inspection wafer) used for an inspection using a dark-field defect inspection device (Surfscan (registered trademark) SP5 manufactured by KLA-Tencor), and the number of defects (defect count) with a size of 19 nm or more existing on a surface of the silicon wafer was measured ("E: Original defect count on substrate").

[Formation of Resist Film (Corresponding to Step X1)]

The prepared resist compositions ArF-1A to ArF-1C were each connected to a resist line (provided that the line is a different line from that of the solvent) of a coater (ACT (registered trademark) 12 from Tokyo Electron Limited, CLEAN TRACK (registered trademark)) (incidentally, at the time of the connection, a dummy capsule was used without connecting a filter to a connection pipe).

manufactured by KLA-Tencor), and the number of defects (defect count) with a size of 19 nm or more existing on a surface of the silicon wafer was measured ([D: Total defect count after solvent removing treatment]).

Next, "B: Defect count after the removal" was determined by the following calculation expression, based on the results of "E: Original defect count on substrate" and [D: Total defect count after solvent removing treatment] obtained by the various inspections.

The results are shown in Table 2.

[*B*: Defect count after the removal]=[*D*: Total defect count after solvent removing treatment]−[*E*: Original defect count on substrate] Expression (A2):

TABLE 2

| ([B: Defect count after removal]) | Removal solvent (Removal solvent used in step X2) | ArF-1A [10 nm UPE] Defect count | | ArF-1B [5 nm N + 1 nm U] Defect count | | ArF-1C [Circulation filtration performed 15 times] Defect count | |
|---|---|---|---|---|---|---|---|
| | | Unit: defects/cm² | Unit: defects | Unit: defects/cm² | Unit: defects | Unit: defects/cm² | Unit: defects |
| Example 1 | nBA-A | 2.34 | 1542 | 0.34 | 226 | 0.24 | 159 |
| Example 2 | nBA-B | 4.31 | 2842 | 2.97 | 1957 | 3.12 | 2059 |
| Example 3 | PGMEA-A | 2.26 | 1489 | 0.56 | 367 | 0.30 | 195 |
| Example 4 | PGME-A | 2.61 | 1724 | 0.39 | 259 | 0.36 | 239 |
| Example 5 | CyHx-A | 2.35 | 1549 | 0.27 | 179 | 0.20 | 135 |
| Example 6 | CyHx-B | 2.54 | 1679 | 1.28 | 845 | 1.55 | 1024 |
| Example 7 | CyHx-C | 6.45 | 4255 | 4.78 | 3156 | 4.77 | 3145 |
| Example 8 | gBL-A | 2.34 | 1544 | 0.42 | 275 | 0.39 | 256 |
| Example 9 | MAK-A | 2.64 | 1745 | 0.58 | 380 | 0.54 | 359 |
| Example 10 | PP3/7-A | 2.51 | 1654 | 0.41 | 268 | 0.30 | 195 |
| Example 11 | PP3/7-B | 4.97 | 3278 | 4.06 | 2680 | 4.53 | 2989 |

Subsequently, the resist composition connected by the above-described method was applied onto the 12 inch (diameter: 300 mm) silicon wafer in which the defect count had been inspected in advance in [Defect Inspection of Inspection Wafer (Corresponding to Step Y1)] mentioned above with the coater, and then baked at 100° C. for 60 seconds to form a coating film. The film thickness of the resist film (coating film) at this time was adjusted to 100 nm.

[Step of Removing Resist Film (Corresponding to Step X2)]

Next, the resist film is removed from the silicon wafer with the resist film obtained by carrying out the above-described procedure of [Formation of Resist Film (Corresponding to Step X1)], using a removal solvent. Incidentally, the removal solvents as used herein are various organic solvents prepared in [Preparation of Removal Solvent (Removal Solvent Used in Step X2)] mentioned above.

The removal was carried out by a coater (CLEAN TRACK (registered trademark) ACT (registered trademark) 12 manufactured by Tokyo Electron Limited) to which the removal solvent after filtration had been connected by the same method as in [Evaluation of Cleanliness of Removal Solvent (Measurement of Defect Count Derived from Removal Solvent Used in Step X2)]. Specifically, the removal solvent connected to the resist line of the coater by the above-mentioned method was applied onto a silicon wafer with a resist film by the coater (discharged at a flow rate of 1 mL/S for 10 seconds), and then baked at 100° C. for 60 seconds.

[Defect Inspection of Substrate after Removal (Corresponding to Step X3)]

<Calculation of [B: Defect Count after Removal]>

The wafer after the step of removing the resist film was subjected to a defect inspection using a dark-field defect inspection device (Surfscan (registered trademark) SP5

<Evaluation of Defect Count of Resist (Calculation of [A: Defect Count of Resist])>

[B: Defect count after the removal] shown in Table 2 also includes the defect count derived from the removal solvent since the values are the results after the removal using the removal solvent. Therefore, as the defect count of the resist, a value obtained by subtracting the defect count derived from the removal solvent ([C: Defect count of removal solvent]) from the defect count after the removal was taken as "A: Defect count of resist".

Specifically, "A: Defect count of resist" was determined by the following calculation expression. Furthermore, [C: Defect count of removal solvent] is based on the numerical value shown in Table 1.

[*A*: Defect count of resist]=[*B*: Defect count after the removal]−[*C*: Defect count of removal solvent] Expression (A3):

The results are shown in Table 3.

Inspection of Resist Composition: Comparative Example 1

[Formation of Resist Film]

The prepared resist compositions ArF-1A to ArF-1C were each connected to a resist line of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the resist composition connected by the above-mentioned method was applied onto a 12 inch (diameter: 300 mm) silicon wafer with the coater, and then baked at 100° C. for 60 seconds to form a coating film. The film thickness of the resist film (coating film) at this time was adjusted to 100 nm.

The wafer with a resist film was subjected to a defect inspection using a dark-field defect inspection device (Surfscan (registered trademark) SP5 manufactured by KLA-Tencor). As a result, since the inspection target was the resist film, defects smaller than 40 nm could not be evaluated. Instead, the number of defects (defect count) with a size of 40 nm or more was measured on the surface of the resist film and in the film. The results are shown in Table 3.

Inspection of Resist Composition: Comparative Example 2

The number of particles (LPC) with a particle diameter of 0.15 m or more included in 1 mL of the resist compositions ArF-1A to ArF-1C prepared was measured using a particle counter (fine particle measuring instrument manufactured by Rion Co., Ltd., liquid-borne particle counter KS-41B).

[Evaluation of Accuracy of Inspection Method]

In addition, the accuracy of the present inspection method was evaluated by the following method.

It is known that the number of defects generated on the substrate caused by a foreign substance in the resist composition can be reduced by reducing the diameter of a filter or the number of circulations, and thus, it is considered that a potential defect count is ArF-1A (10 nm UPE filtered product)>ArF-1B (5 nm N+1 nm U filtered product)>ArF-1C (a product after circulation filtration performed 15 times). Therefore, in the evaluation of the inspection methods of Examples and Comparative Examples, in a case where the numerical value of [A: Defect count of resist] is consistent with the order of the potential defect count and the difference is clear, it can be considered that even an ultra-small foreign substance in the resist composition can be evaluated.

From the viewpoint, each inspection result of Examples and Comparative Examples was evaluated according to the following evaluation standard based on the defect count.

"A": The results are in the order of ArF-1A (10 nm UPE filtered product)>ArF-1B (5 nm N+1 nm U filtered product)>ArF-1C (a product after circulation filtration performed 15 times), and the defect count between the samples is twice or more different.

"B": The results are in the order of ArF-1A (10 nm UPE filtered product)>ArF-1B (5 nm N+1 nm U filtered product)>ArF-1C (a product after circulation filtration performed 15 times).

"C": The results are in the order of ArF-1A (10 nm UPE filtered product)>ArF-1B (5 nm N+1 nm U filtered product) and ArF-1C (a product after circulation filtration performed 15 times) (that is, the difference among ArF-1A, ArF-1B, and ArF-1C is clear, but the difference between ArF-1B and ArF-1C cannot be determined).

"D": Not corresponding to any of "A" to "C" above.

Table 3 is shown below.

In Table 3, "19 nm Defect" in the "Target to be measured" column is intended to be a defect with a size of 19 nm or more, "40 nm Coating defect" is intended to be a coating defect with a size of 40 nm or more, and "0.15 m LPC" is intended to be LPC with a particle diameter of 0.15 m or more.

In addition, in Table 3, the unit of the defect count in Comparative Example 2 is "defects/mL", and the unit of the defect count in each of Examples and Comparative Example 1 is "defects/cm$^2$" or "defects".

TABLE 3

| ([A: Defect count of resist]) | Removal solvent (Removal solvent used in step X2) | Target to be measured | ArF-1A [10 nm UPE] Defect count Unit: defects/cm$^2$ | ArF-1A Unit: defects | ArF-1B [5 nm N + 1 nm U] Defect count Unit: defects/cm$^2$ | ArF-1B Unit: defects | ArF-1C [Circulation filtration performed 15 times] Defect count Unit: defects/cm$^2$ | ArF-1C Unit: defects | Evaluation |
|---|---|---|---|---|---|---|---|---|---|
| Example 1 | nBA-A | 19 nm Defects | 2.17 | 1429 | 0.17 | 113 | 0.07 | 46 | A |
| Example 2 | nBA-B | 19 nm Defects | 2.03 | 1342 | 0.69 | 457 | 0.85 | 559 | C |
| Example 3 | PGMEA-A | 19 nm Defects | 2.03 | 1343 | 0.33 | 221 | 0.07 | 49 | A |
| Example 4 | PGME-A | 19 nm Defects | 2.31 | 1524 | 0.09 | 59 | 0.06 | 3 | B |
| Example 5 | *Cy*H*x*-A | 19 nm Defects | 2.19 | 1444 | 0.11 | 74 | 0.05 | 30 | A |
| Example 6 | *Cy*H*x*-B | 19 nm Defects | 1.53 | 1010 | 0.27 | 176 | 0.54 | 355 | C |
| Example 7 | *Cy*H*x*-C | 19 nm Defects | 3.51 | 2316 | 1.84 | 1217 | 1.85 | 1221 | C |
| Example 8 | gBL-A | 19 nm Defects | 2.06 | 1362 | 0.14 | 93 | 0.11 | 74 | B |
| Example 9 | MAK-A | 19 nm Defects | 2.19 | 1443 | 0.12 | 78 | 0.09 | 57 | B |
| Example 10 | PP3/7-A | 19 nm Defects | 2.30 | 1515 | 0.20 | 129 | 0.08 | 56 | A |
| Example 11 | PP3/7-B | 19 nm Defects | 1.42 | 937 | 0.51 | 339 | 0.98 | 648 | C |
| Comparative Example 1 | — | 40 nm Coating defects | 0.06 | 42 | 0.07 | 48 | 0.07 | 43 | D |
| Comparative Example 2 | — | 0.15 μm LPC | 2 defects/mL | | 1 defect/mL | | 2 defects/mL | | D |

[Discussion of Results]

As described above, it is known that the number of defects generated on the substrate caused by a foreign substance in the resist composition can be reduced by reducing the diameter of a filter or the number of circulations, and thus, it is considered that a potential defect count is ArF-1A (10 nm UPE filtered product)>ArF-1B (5 nm N+1 nm U filtered product)>ArF-1C (a product after circulation filtration performed 15 times). Therefore, in the evaluation of the inspection methods of Examples and Comparative Examples, in a case where the numerical value of [A: Defect count of resist] is consistent with the order of the potential defect count and the difference is clear, it can be considered that even an ultra-small foreign substance in the resist composition can be evaluated.

It can be seen that even an ultra-small foreign substance can be evaluated by the inspection method of Examples. In particular, it is known that in the inspection method of Examples, the cleanliness of the removal solvent used in the step of removing the resist film is higher (the defect count derived from the removal solvent is smaller), the numerical value of [A: Defect count of resist] is consistent with the potential defect count and the difference is clear, and even an ultra-small foreign substance in the resist composition can be evaluated (in particular, refer to the results of Examples 2, 6, 7, and 11).

On the other hand, in Comparative Example 1, since only large defects with a size of 40 nm or more could be evaluated, it was not possible to evaluate a minute difference in the defect count between the three types of resist compositions having different filtration methods.

In addition, in Comparative Example 2 (Evaluation of LPC (Liquid-Borne Particles)), since only large defects with a size of 0.15 m (150 nm) or more could be evaluated, it was not possible to evaluate a minute difference in the defect count between the three types of resist compositions having different filtration methods.

Verification of Substrate: Examples 12 and 13

Using three types of silicon wafers (a silicon wafer-A, a silicon wafer-B, and a silicon wafer-C) with a size of 19 nm or more and different defect counts, the influence of the number of defects existing on the substrate on the inspection was verified.

Specifically, the inspection methods of Examples 12 and 13 were carried out by the same method as the above-mentioned inspection method of Example 1, except that the silicon wafers used were different.

Furthermore, the removal solvent used in the inspection methods of Examples 12 and 13 is the same as the removal solvent used in the inspection method of Example 1.

The types of silicon wafers and [E: Original defect count on substrate] used in Examples 1, 12, and 13 are as follows.

Example 1: Silicon Wafer-A ([E: Original defect count on substrate] of the silicon wafer-A is 0.02 to 0.03 defects/cm$^2$)

Example 12: Silicon Wafer-B ([E: Original defect count on substrate] of the silicon wafer-B is 0.21 to 0.24 defects/cm$^2$)

Example 13: Silicon Wafer-C ([E: Original defect count on substrate] of the silicon wafer-C is 0.78 to 1.02 defects/cm$^2$)

Hereinafter, [A: Defect count of resist], [B: Defect count after the removal], [C: Defect count of removal solvent], [D: Total defect count after solvent removing treatment], and [E: Original defect count on substrate] obtained by the inspection methods of Examples of 1, 12, and 13 are shown in Tables 4 to 6.

Furthermore, from the viewpoint that the relationship among [A: Defect count of resist], [B: Defect count after the removal], [C: Defect count of removal solvent], [D: Total defect count after solvent removing treatment], and [E: Original defect count on substrate] satisfies Expression (A2) and Expression (A3) as described above, Expression (A4) is also satisfied.

[*B*: Defect count after the removal]=[*D*: Total defect count after solvent removing treatment]−[*E*: Original defect count on substrate]  Expression (A2):

[*A*: Defect count of resist]=[*B*: Defect count after the removal]−[*C*: Defect count of removal solvent]  Expression (A3):

[*A*: Defect count of resist]=[*D*: Total defect count after solvent removing treatment]−[*E*: Original defect count on substrate]−[*C*: Defect count of removal solvent]  Expression (A4):

TABLE 4

| Table 4 Removal solvent: nBA-A | Example 1 (Substrate: Silicon wafer-A) [A: Defect count of resist] Unit: defects/cm$^2$ | [A: Defect count of resist] Unit: defects | [B: Defect count after removal] Unit: defects/cm$^2$ | [B: Defect count after removal] Unit: defects | [D: Total defect count after solvent removing treatment] Unit: defects/cm$^2$ | [D: Total defect count after solvent removing treatment] Unit: defects | [C: Defect count of removal solvent] Unit: defects/cm$^2$ | [C: Defect count of removal solvent] Unit: defects | [E: Original defect count on substrate] Unit: defects/cm$^2$ | [E: Original defect count on substrate] Unit: defects |
|---|---|---|---|---|---|---|---|---|---|---|
| ArF-1A [10 nm UPE] | 2.17 | 1429 | 2.34 | 1542 | 2.36 | 1557 | 0.17 | 113 | 0.02 | 15 |
| ArF-1B [5 nm N + 1 nm U] | 0.17 | 113 | 0.34 | 226 | 0.37 | 245 | 0.17 | 113 | 0.03 | 19 |
| ArF-1C [Circulation filtration performed 15 times] | 0.07 | 46 | 0.24 | 159 | 0.27 | 176 | 0.17 | 113 | 0.03 | 17 |

| Table 5 Removal solvent: nBA-A | Example 12 (Substrate: Silicon wafer-B) [A: Defect count of resist] Unit: defects/cm$^2$ | [A: Defect count of resist] Unit: defects | [B: Defect count after removal] Unit: defects/cm$^2$ | [B: Defect count after removal] Unit: defects | [D: Total defect count after solvent removing treatment] Unit: defects/cm$^2$ | [D: Total defect count after solvent removing treatment] Unit: defects | [C: Defect count of removal solvent] Unit: defects/cm$^2$ | [C: Defect count of removal solvent] Unit: defects | [E: Original defect count on substrate] Unit: defects/cm$^2$ | [E: Original defect count on substrate] Unit: defects |
|---|---|---|---|---|---|---|---|---|---|---|
| ArF-1A [10 nm UPE] | 2.12 | 1400 | 2.29 | 1513 | 2.51 | 1658 | 0.17 | 113 | 0.22 | 145 |
| ArF-1B [5 nm N + 1 nm U] | 0.13 | 83 | 0.30 | 196 | 0.54 | 354 | 0.17 | 113 | 0.24 | 158 |
| ArF-1C [Circulation filtration performed 15 times] | 0.13 | 87 | 0.30 | 200 | 0.51 | 338 | 0.17 | 113 | 0.21 | 138 |

TABLE 4-continued

| | Example 13 (Substrate: Silicon wafer-C) | | | | | | | | | |
|---|---|---|---|---|---|---|---|---|---|---|
| Table 6 Removal | [A: Defect count of resist] | | [B: Defect count after removal] | | [D: Total defect count after solvent removing treatment] | | [C: Defect count of removal solvent] | | [E: Original defect count on substrate] | |
| solvent: nBA-A | Unit: defects/cm$^2$ | Unit: defects | Unit: defects/cm$^2$ | Unit: defects | Unit: defects/cm$^2$ | Unit: defects | Unit: defects/cm$^2$ | Unit: defects | Unit: defects/cm$^2$ | Unit: defects |
| ArF-1A [10 nm UPE] | 2.41 | 1589 | 2.58 | 1702 | 3.35 | 2214 | 0.17 | 113 | 0.78 | 512 |
| ArF-1B [5 nm N + 1 nm U] | 2.08 | 1374 | 2.25 | 1487 | 3.27 | 2159 | 0.17 | 113 | 1.02 | 672 |
| ArF-1C [Circulation filtration performed 15 times] | 2.03 | 1341 | 2.20 | 1454 | 3.00 | 1982 | 0.17 | 113 | 0.80 | 528 |

[Discussion of Results]

In Example 12 in which the silicon wafer-B was used, a significant difference in [A: Defect count of resist] between ArF-1A (10 nm UPE filtered product) and ArF-1B (5 nm N+1 nm U filtered product) was observed, but a significant difference between ArF-1B (5 nm N+1 nm U filtered product) and ArF-1C (a product after circulation filtration performed 15 times) could not be observed.

In addition, in Example 13 in which the silicon wafer-C was used, for any of ArF-1A (10 nm UPE filtered product), ArF-1B (5 nm N+1 nm U filtered product), and ArF-1C (a product after circulation filtration performed 15 times), [A: Defect count of resist] was 1.50 defects/cm$^2$ or more, and results that no difference between each of the resist with that in Example 12 was not seen were obtained.

From the results, it was confirmed that in a case where the numerical value of [E: Original defect count on substrate] of the inspection wafer used for the inspection was such that the number of defects with a size of 19 nm or more was 0.75 defects/cm$^2$ or less (preferably, the number of defects with a size of 19 nm or more was 0.15 defects/cm$^2$ or less), the accuracy of the inspection was further improved.

Verification of Removal Time: Examples 14 to 16

The defect inspection was carried out by changing the removal time in the resist film removing step and the influence of the removal time in the resist film removing step on the inspection was verified.

Specifically, the inspection methods in Examples 14 to 16 were carried out in the same manner as the above-mentioned inspection method of Example 1, except that the removal time in the resist film removing step was different.

Furthermore, the removal time in the step of removing the resist film in each of Examples 1 and 14 to 16 (the removal time in the removal treatment using the removal solvent) is as follows.

Example 1: The removal time with the removal solvent is 10 seconds

Example 14: The removal time with the removal solvent is 60 seconds

Example 15: The removal time with the removal solvent is 300 seconds

Example 16: The removal time with the removal solvent is 600 seconds

Hereinafter, [A: Defect count of resist], [B: Defect count after the removal], [C: Defect count of removal solvent], [D: Total defect count after solvent removing treatment], and [E: Original defect count on substrate] obtained by the inspection methods of Example 1 and Examples 14 to 16 are shown in Tables 7 to 10.

Furthermore, from the viewpoint that the relationship among [A: Defect count of resist], [B: Defect count after the removal], [C: Defect count of removal solvent], [D: Total defect count after solvent removing treatment], and [E: Original defect count on substrate] satisfies Expression (A2) and Expression (A3) as described above, Expression (A4) is also satisfied.

[*B*: Defect count after the removal]=[*D*: Total defect count after solvent removing treatment]−[*E*: Original defect count on substrate] Expression (A2):

[*A*: Defect count of resist]=[*B*: Defect count after the removal]−[*C*: Defect count of removal solvent] Expression (A3):

[*A*: Defect count of resist]=[*D*: Total defect count after solvent removing treatment]−[*E*: Original defect count on substrate]−[*C*: Defect count of removal solvent] Expression (A4):

TABLE 5

| | Example 1 (Substrate: Silicon wafer-A, Removal time with removal solvent: 10 seconds) | | | | | | | | | |
|---|---|---|---|---|---|---|---|---|---|---|
| Table 7 Removal | [A: Defect count of resist] | | [B: Defect count after removal] | | [D: Total defect count after solvent removing treatment] | | [C: Defect count of removal solvent] | | [E: Original defect count on substrate] | |
| solvent: nBA-A | Unit: defects/cm$^2$ | Unit: defects | Unit: defects/cm$^2$ | Unit: defects | Unit: defects/cm$^2$ | Unit: defects/cm$^2$ | Unit: defects | Unit: defects/cm$^2$ | Unit: defects | Unit: defects/cm$^2$ |
| ArF-1A [10 nm UPE] | 2.17 | 1429 | 2.34 | 1542 | 2.36 | 1557 | 0.17 | 113 | 0.02 | 15 |
| ArF-1B [5 nm N + 1 nm U] | 0.17 | 113 | 0.34 | 226 | 0.37 | 245 | 0.17 | 113 | 0.03 | 19 |
| ArF-1C [Circulation filtration performed 15 times] | 0.07 | 46 | 0.24 | 159 | 0.27 | 176 | 0.17 | 113 | 0.03 | 17 |

TABLE 5-continued

| Table 8 Removal solvent: nBA-A | [A: Defect count of resist] | | [B: Defect count after removal] | | [D: Total defect count after solvent removing treatment] | | [C: Defect count of removal solvent] | | [E: Original defect count on substrate] | |
|---|---|---|---|---|---|---|---|---|---|---|
| | Example 14 (Substrate: Silicon wafer-A, Removal time with removal solvent: 60 seconds) | | | | | | | | | |
| | Unit: defects/cm$^2$ | Unit: defects | Unit: defects/cm$^2$ | Unit: defects | Unit: defects/cm$^2$ | Unit: defects/cm$^2$ | Unit: defects | Unit: defects/cm$^2$ | Unit: defects | Unit: defects/cm$^2$ |
| ArF-1A [10 nm UPE] | 1.87 | 1237 | 2.05 | 1350 | 2.07 | 1369 | 0.17 | 113 | 0.03 | 19 |
| ArF-1B [5 nm N + 1 nm U] | 0.14 | 91 | 0.31 | 204 | 0.34 | 226 | 0.17 | 113 | 0.03 | 22 |
| ArF-1C [Circulation filtration performed 15 times] | 0.09 | 58 | 0.26 | 171 | 0.29 | 189 | 0.17 | 113 | 0.03 | 18 |

| Table 9 Removal solvent: nBA-A | [A: Defect count of resist] | | [B: Defect count after removal] | | [D: Total defect count after solvent removing treatment] | | [C: Defect count of removal solvent] | | [E: Original defect count on substrate] | |
|---|---|---|---|---|---|---|---|---|---|---|
| | Example 15 (Substrate: Silicon wafer-A, Removal time with removal solvent: 300 seconds) | | | | | | | | | |
| | Unit: defects/cm$^2$ | Unit: defects | Unit: defects/cm$^2$ | Unit: defects | Unit: defects/cm$^2$ | Unit: defects/cm$^2$ | Unit: defects | Unit: defects/cm$^2$ | Unit: defects | Unit: defects/cm$^2$ |
| ArF-1A [10 nm UPE] | 0.50 | 333 | 0.68 | 446 | 0.69 | 458 | 0.17 | 113 | 0.02 | 12 |
| ArF-1B [5 nm N + 1 nm U] | 0.11 | 75 | 0.28 | 188 | 0.33 | 216 | 0.17 | 113 | 0.04 | 28 |
| ArF-1C [Circulation filtration performed 15 times] | 0.10 | 66 | 0.27 | 179 | 0.30 | 199 | 0.17 | 113 | 0.03 | 20 |

| Table 10 Removal solvent: nBA-A | [A: Defect count of resist] | | [B: Defect count after removal] | | [D: Total defect count after solvent removing treatment] | | [C: Defect count of removal solvent] | | [E: Original defect count on substrate] | |
|---|---|---|---|---|---|---|---|---|---|---|
| | Unit: defects/cm$^2$ | Unit: defects | Unit: defects/cm$^2$ | Unit: defects | Unit: defects/cm$^2$ | Unit: defects/cm$^2$ | Unit: defects | Unit: defects/cm$^2$ | Unit: defects | Unit: defects/cm$^2$ |
| ArF-1A [10 nm UPE] | 0.27 | 178 | 0.29 | 191 | 0.31 | 207 | 0.17 | 113 | 0.02 | 16 |
| ArF-1B [5 nm N + 1 nm U] | 0.09 | 60 | 0.26 | 173 | 0.28 | 188 | 0.17 | 113 | 0.02 | 15 |
| ArF-1C [Circulation filtration performed 15 times] | 0.10 | 66 | 0.27 | 179 | 0.30 | 198 | 0.17 | 113 | 0.03 | 19 |

[Discussion of Results]

As the removal time was extended in the order of Example 1<Example 14<Example 15<Example 16, results that a difference among ArF-1A (10 nm UPE filtered product), ArF-1B (5 nm N+1 nm U filtered product), and ArF-1C (a product after circulation filtration performed 15 times) was not observed were obtained.

From the results, it was confirmed that the accuracy of the inspection was further improved in a case where the removal time in the step of removing the resist film was 300 seconds or less. Above all, it was confirmed that in a case where the removal time in the resist film removing step was 60 seconds or less, the difference in the defect count between ArF-1A (10 nm UPE filtered product) and ArF-1B (5 nm N+1 nm U filtered product) was further widened.

[Inspection after Carrying out Exposure Treatment (ArF Exposure and Development): Comparative Example 9 and Comparative Example 10]

Comparative Example 9

<Formation of Resist Film>

The prepared resist compositions ArF-1A to ArF-1C were each connected to a resist line of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the resist composition connected by the above-mentioned method was applied onto a 12 inch (diameter: 300 mm) silicon wafer with the coater, and then baked at 100° C. for 60 seconds to form a coating film. The film thickness of the resist film (coating film) at this time was adjusted to 100 nm.

Next, the resist film was full-surface exposed with an exposure amount of 30 mJ/cm$^2$ in an open frame using an ArF excimer laser immersion scanner (manufactured by ASML; XT1700i).

Thereafter, after heating (PEB) at 100° C. for 60 seconds, the wafer was developed with an aqueous tetramethylammonium hydroxide solution (2.38% by mass) for 30 seconds, rinsed with pure water, and then spin-dried. Furthermore, the resist film was completely dissolved by the above-mentioned full-surface exposure and an alkali development treatment.

<Defect Inspection>

The wafer after the treatment was subjected to a defect inspection using a dark-field defect inspection device (Surfscan (registered trademark) SP5 manufactured by KLA-Tencor), the resist film was subjected to exposure and development, and rinsed, and then, the number of defects (defect count) with a size of 19 nm or more existing on a surface of the silicon wafer and within the film was measured.

At that time, the defect count after the exposure and development/rinsing was calculated by the following calculation expression.

[*B*': Defect count after exposure and development]=[*D*': Total defect count after exposure and development]−[*E*: Original defect count on substrate]−[*C*': Defect count from development+rinsing]

Furthermore, [C': Defect count from development+rinsing]: This is intended to be a total of the values of [C: Defect count of removal solvent] by the same method as described in [Evaluation of Cleanliness of Removal Solvent (Measurement of Defect Count Derived from Removal Solvent Used in Step X2)] in the section of [Preparation of Removal Solvent (Removal Solvent Used in Step X2)] for each of the development solvent and the rinsing solvent.

The results are shown in Table 11.

Comparative Example 10

<Formation of Resist Film>

The prepared resist compositions ArF-1A to ArF-1C were each connected to a resist line of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the resist composition connected by the above-mentioned method was applied onto a 12 inch (diameter: 300 mm) silicon wafer with the coater, and then baked at 100° C. for 60 seconds to form a coating film. The film thickness of the resist film (coating film) at this time was adjusted to 100 nm.

Next, the resist film was full-surface exposed with an exposure amount of 30 mJ/cm$^2$ in an open frame using an ArF excimer laser immersion scanner (manufactured by ASML; XT1700i). Then, the mixture was heated (PEB) at 100° C. for 60 seconds, developed with nBA-A (subjected to an organic solvent-based development with the removal solvent used in Example 1) for 30 seconds, and then spin-dried. Incidentally, in Comparative Example 10, since a full-surface exposure and an organic solvent-based development treatment were performed, the resist film was not dissolved in the solvent and remained as a residual film.

<Defect Inspection>

The wafer after the treatment was subjected to defect inspection with a size of 40 nm or more using a dark-field defect inspection device (Surfscan (registered trademark) SP5 manufactured by KLA-Tencor), and evaluation of the resist film after the exposure and the development was performed. As a result, since the inspection target was the resist film, defects smaller than 40 nm could not be evaluated. Instead, the number of defects (defect count) after the exposure and the development with a size of 40 nm or more was measured on the surface of the resist film and in the film. The results are shown in Table 11.

In addition, the inspection results of Comparative Examples 9 and 10 were evaluated according to the following evaluation standard. In addition, in Table 11, the results of Example 1 are also shown as a reference.

"A": The results are in the order of ArF-1A (10 nm UPE filtered product)>ArF-1B (5 nm N+1 nm U filtered product)>ArF-1C (a product after circulation filtration performed 15 times), and the defect count between the samples is twice or more different.

"B": The results are in the order of ArF-1A (10 nm UPE filtered product)>ArF-1B (5 nm N+1 nm U filtered product)>ArF-1C (a product after circulation filtration performed 15 times).

"C": The results are in the order of ArF-1A (10 nm UPE filtered product)>ArF-1B (5 nm N+1 nm U filtered product) and ArF-1C (a product after circulation filtration performed 15 times) (that is, the difference among ArF-1A, ArF-1B, and ArF-1C is clear, but the difference between ArF-1B and ArF-1C cannot be determined).

"D": Not corresponding to any of "A" to "C" above.

Table 11 is shown below.

In Table 11, "19 nm Defects" in the "Target to be measured" column and "40 nm Defects" are intended to be intended to be defects with a size of 19 nm or more and coating defects with a size of 40 nm or more, respectively.

TABLE 6

| Table 11 | Presence or absence of exposure | Time taken carrying out defect inspection | Target to be measured | ArF-1A [10 nm UPE] Unit: defects/cm$^2$ | ArF-1A [10 nm UPE] Unit: defects | ArF-1B [5 nm N + 1 nm U] Unit: defects/cm$^2$ | ArF-1B [5 nm N + 1 nm U] Unit: defects | ArF-1C [Circulation filtration performed 15 times] Unit: defects/cm$^2$ | ArF-1C [Circulation filtration performed 15 times] Unit: defects | Evaluation |
|---|---|---|---|---|---|---|---|---|---|---|
| Example 1 | Unexposed | After removal treatment with nBA-A | 19 nm Defects | 2.17 | 1429 | 0.17 | 113 | 0.07 | 46 | A |
| Comparative Example 9 | Exposed (Full-surface exposed) | After alkali development and rinsing | 19 nm Defects | 2.20 | 1452 | 2.38 | 1569 | 2.26 | 1492 | D |
| Comparative Example 10 | Exposed (Full-surface exposed) | After development with nBA-A | 40 nm Defects | 0.11 | 75 | 0.12 | 81 | 0.14 | 92 | D |

In Comparative Examples 9 and 10, no significant difference in the defect count from filtration was observed.

[Preparation of Resist Composition (for EUV)]

As the resist composition, a resist composition EUV-1 was prepared according to the following procedure.

In addition, three types of resist compositions, EUV-1A, EUV-1B, and EUV-1C, were prepared by subjecting the resist composition EUV-1 prepared by the following procedure to different three types of filtration treatments, as shown in the latter section.

[Preparation of Resist Composition EUV-1]

<Preparation of Resist Composition EUV-1>

A resist composition EUV-1 was prepared by mixing each of components shown below.

| | |
|---|---|
| Acid-decomposable resin (resin (A-35) shown below) | 460 g |
| Photoacid generator (PAG-37 shown below) | 47 g |
| Photoacid generator (PAG-38 shown below) | 47 g |
| Quencher (Q-4 shown below) | 6 g |
| PGMEA | 27,608 g |
| PGME | 11,832 g |

<Resin (A-35)>

The resin (A-35) is shown below. The resin (A-35) was synthesized based on a known technique.

The obtained resin had a weight-average molecular weight (Mw: expressed in terms of polystyrene) of Mw=8000 and a dispersity Mw/Mn=1.60, as determined from GPC (carrier: tetrahydrofuran (THF)). The compositional ratio (molar ratio; corresponding in order from the left of the repeating units shown below) measured by $^{13}$C-NMR was 30/50/20. Furthermore, the resin (A-35) corresponds to an acid-decomposable resin.

(A-35)

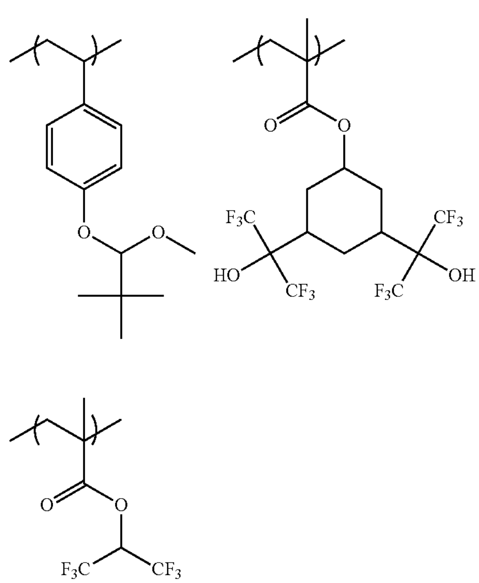

<Other Components>

Photoacid generators (P-37 and P-38) and a quencher (Q-4) are shown below.

(P-37)

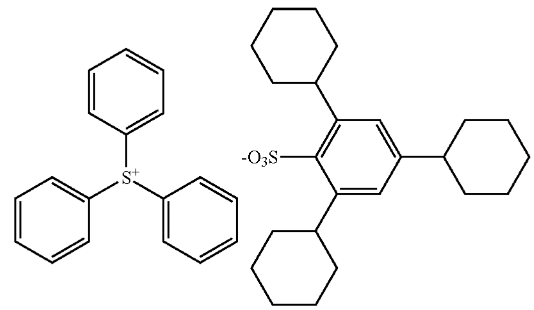

(P-38)

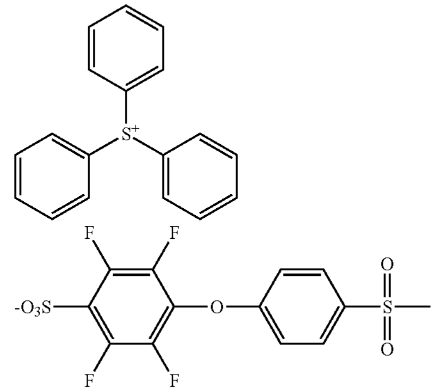

(Q-4)

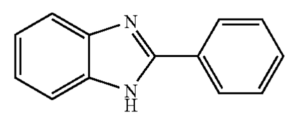 [SMILES: c1ccc(-c2nc3ccccc3[nH]2)cc1]

<Filtration of Resist Solution>

In addition, three types of resist compositions, EUV-1A, EUV-1B, and EUV-1C, were prepared by subjecting the resist composition EUV-1 prepared by the procedure to different three types of filtration treatments, as shown in the latter section.

(Resist Composition EUV-1A)

12,000 g of the resist composition EUV-1 was filtered through a nylon filter with a pore size of 20 nm, manufactured by PALL Corporation, to obtain a resist composition EUV-1A.

(Resist Composition EUV-1B)

12,000 g of the resist composition EUV-1 was filtered through the following two-stage filter to obtain a resist composition EUV-1B.

First stage: Azora photochemical filter manufactured by Entegris

Second stage: Polyethylene filter with a pore size of 1 nm, manufactured by Entegris (Resist Composition EUV-1C)

12,000 g of the resist composition EUV-1 was circulation-filtered 30 times with the following three-stage filter to obtain a resist composition EUV-1C (incidentally, the circulation filtration performed 30 times means that the flow rate was measured and the number of passages of an amount 30 times the input amount of 12,000 g was 30).

First stage: Nylon filter with a pore size of 2 nm, manufactured by PALL Corporation Second stage: Azora photochemical filter manufactured by Entegris Third stage: Pore size 1 nm, manufactured by Entegris

[Inspection of Resist Composition: Examples 17 to 23 and Comparative Example 11]

[Defect Inspection of Inspection Wafer (Corresponding to Step Y1)]

Prior to the defect evaluation of the resist film, a defect inspection was carried out using a 12 inch (diameter: 300 mm) silicon wafer (inspection wafer) used for an inspection using a dark-field defect inspection device (Surfscan (registered trademark) SP5 manufactured by KLA-Tencor), and the number of defects (defect count) with a size of 19 nm or more existing on a surface of the silicon wafer was measured ("E: Original defect count on substrate").

[Formation of Resist Film (Corresponding to Step X1)]

The prepared resist compositions EUV-1A to EUV-1C were each connected to a resist line (provided that the line is a different line from that of the solvent) of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the resist composition connected by the above-described method was applied onto the 12 inch (diameter: 300 mm) silicon wafer in which the defect count had been inspected in advance in [Defect Inspection of Inspection Wafer (Corresponding to Step Y1)] mentioned above with the coater, and then baked at 100° C. for 60 seconds to form a coating film. The film thickness of the resist film (coating film) at this time was adjusted to 30 nm.

[Step of Removing Resist Film (Corresponding to Step X2)]

Next, the resist film is removed from the silicon wafer with the resist film obtained by carrying out the above-described procedure of [Formation of Resist Film (Corresponding to Step X1)], using a removal solvent. Incidentally, the removal solvents as used herein are various organic solvents prepared in [Preparation of Removal Solvent (Removal Solvent Used in Step X2)] mentioned above.

The removal was carried out by a coater (Tokyo Electron Limited, CLEAN TRACK (registered trademark), ACT (registered trademark) 12) to which the removal solvent after filtration had been connected by the same method as in [Evaluation of Cleanliness of Removal Solvent (Measurement of Defect Count Derived from Removal Solvent Used in Step X2)] mentioned above. Specifically, the removal solvent connected to the resist line of the coater by the above-mentioned method was applied onto a silicon wafer with a resist film by the coater (discharged at a flow rate of 1 mL/S for 15 seconds), and then baked at 100° C. for 60 seconds.

[Defect Inspection of Substrate after Removal (Corresponding to Step X3)]

<Calculation of [B: Defect Count after Removal]>

The wafer after the treatment was subjected to a defect inspection using a dark-field defect inspection device (Surfscan (registered trademark) SP5 manufactured by KLA-Tencor), and the number of defects (defect count) with a size of 19 nm or more existing on a surface of the silicon wafer was measured ([D: Total defect count after solvent removing treatment]).

Next, "B: Defect count after the removal" was determined by the following calculation expression, based on the results of "E: Original defect count on substrate" and [D: Total defect count after solvent removing treatment] obtained by the various inspections.

[*B*: Defect count after the removal]=[*D*: Total defect count after solvent removing treatment]−[*E*: Original defect count on substrate] Expression (*A*2):

Further, [B: Defect count after the removal] also includes the defect count derived from the removal solvent since the values are the results after the removal using the removal solvent. Therefore, a value obtained by subtracting the defect count derived from the removal solvent ([C: Defect count of removal solvent]) from the defect count after the removal as the defect count of the resist was taken as "Defect count of resist".

The defect count of the resist was determined by the following calculation expression. Furthermore, [C: Defect count of removal solvent] is based on the numerical value shown in Table 1.

[*A*: Defect count of resist]=[*B*: Defect count after the removal]−[*C*: Defect count of removal solvent] Expression (*A*3):

The results are shown in Table 12.

[Inspection of Resist Composition: Comparative Example 11]

The number of particles (LPCs) with a particle diameter of 0.15 m or more included in 1 mL of the prepared resist compositions EUV-1A to EUV-1C was measured using a particle counter manufactured by Rion Corporation.

[Evaluation of Accuracy of Inspection Method]

In addition, the accuracy of the present inspection method was evaluated by the following method.

It is known that the number of defects generated on the substrate caused by a foreign substance in the resist composition can be reduced by reducing the diameter of a filter or the number of circulations, and thus, it is considered that a potential defect count is EUV-1A (20 nm Nylon filtered product)>EUV-1B (Azora+1 nm U filtered product)>EUV-1C (a product after circulation filtration performed 30 times). Therefore, in the evaluation of the inspection methods of Examples and Comparative Examples, in a case where the numerical value of [Defect count of resist] is consistent with the order of the potential defect count and the difference is clear, it can be considered that even an ultra-small foreign substance in the resist composition can be evaluated.

Therefore, the inspection results of Examples and Comparative Examples were evaluated according to the following evaluation standard.

"A": The results are in the order of EUV-1A (20 nm Nylon filtered product)>EUV-1B (Azora+1 nm U filtered product)>EUV-1C (ca product after circulation filtration performed 30 times), and the defect count between the samples is more than twice different.

"B": The results are in the order of EUV-1A (20 nm Nylon filtered product)>EUV-1B (Azora+1 nm U filtered product)>EUV-1C (ca product after circulation filtration performed 30 times).

"C": The results are in the order of EUV-1A (20 nm Nylon filtered product)>EUV-1B (Azora+1 nm U filtered product) and EUV-1C (a product after circulation filtration performed 30 times) (that is, the difference among EUV-1A, EUV-1B, and EUV-1C is clear, but the difference between EUV-1B and EUV-1C cannot be determined).

"D": Not corresponding to any of "A" to "C" above.

Table 12 is shown below.

In Table 12, "19 nm Defect" in the "Target to be measured" column is intended to be a defect with a size of 19 nm or more, and "0.15 m LPC" is intended to be an LPC with a particle diameter of 0.15 m or more.

In addition, in Table 12, the unit of the defect count in Comparative Example 11 is "defects/mL", and the unit of the defect count in each of Examples is "defects/cm$^2$" or "defects".

| | |
|---|---|
| Resin (resin shown below (Poly-2)) | 68.5 g |
| Photoacid generator (A-3 shown below) | 10 g |
| Quencher (B-5 shown below) | 1.5 g |
| Crosslinking agent (CL-4 shown below) | 20 g |
| PGMEA | 3,120 g |
| PGME | 7,800 g |

<Resin (Poly-2)>

The resin (Poly-2) will be shown below. The resin (Poly-2) was synthesized based on a known technique.

The obtained resin had a weight-average molecular weight (Mw: expressed in terms of polystyrene) of Mw=3,500 and a dispersity Mw/Mn=1.10, as determined from GPC (carrier: tetrahydrofuran (THF)). The compositional ratio (molar ratio) measured by $^{13}$C-NMR was 90/10.

TABLE 7

| Table 12 ([A: Defect count of resist]) | Removal solvent (Removal solvent used in step X2) | Target to be measured | EUV-1A [20 nm Nylon] Unit: defects/cm$^2$ | EUV-1A [20 nm Nylon] Unit: defects | EUV-1B [Azora + 1 nm U] Unit: defects/cm$^2$ | EUV-1B [Azora + 1 nm U] Unit: defects | EUV-1C [Circulation filtration performed 30 times] Defect count Unit: defects/cm$^2$ | EUV-1C [Circulation filtration performed 30 times] Defect count Unit: defects | Evaluation |
|---|---|---|---|---|---|---|---|---|---|
| Example 17 | nBA-A | 19 nm Defects | 2.92 | 1925 | 0.25 | 168 | 0.07 | 48 | A |
| Example 18 | nBA-B | 19 nm Defects | 3.42 | 2256 | 2.71 | 1788 | 2.72 | 1795 | C |
| Example 19 | PGMEA-A | 19 nm Defects | 2.50 | 1648 | 0.30 | 198 | 0.11 | 72 | A |
| Example 20 | CyHx-A | 19 nm Defects | 2.77 | 1825 | 0.34 | 223 | 0.15 | 102 | A |
| Example 21 | CyHx-C | 19 nm Defects | 4.17 | 2750 | 3.65 | 2411 | 3.35 | 2210 | B |
| Example 22 | PP3/7-A | 19 nm Defects | 2.80 | 1845 | 0.34 | 224 | 0.13 | 85 | A |
| Example 23 | PP3/7-B | 19 nm Defects | 3.96 | 2614 | 3.55 | 2345 | 3.50 | 2311 | B |
| Comparative | — | 0.15 μm LPC | 1 defect/mL | | 1 defect/mL | | 1 defect/mL | | D |

[Discussion of Results]

It can be seen that even an ultra-small foreign substance in the resist composition can be evaluated by the inspection method of Examples. In particular, it is known that in the inspection method of Examples, the cleanliness of the removal solvent used in the step of removing the resist film is higher (the defect count is smaller), the numerical value of [A: Defect count of resist] is consistent with the potential defect count and the difference is clear, and even an ultra-small foreign substance in the resist composition can be evaluated (in particular, refer to the results of Examples 18, 21, and 23).

On the other hand, in Comparative Example 11 (Evaluation of LPC (Liquid-Borne Particles)), since only large defects with a size of 0.15 m (150 nm) or more could be evaluated, it was not possible to evaluate a minute difference in the defect count between the three types of resist compositions having different filtration methods.

[Preparation of Resist Composition (Negative Tone Resist Composition)]

As the resist composition, a resist composition EBN-1 was prepared according to the following procedure.

In addition, as shown in the following section, a resist composition EBN-1A was prepared by subjecting the resist composition EBN-1 prepared by the following procedure to a filtration treatment.

[Preparation of Resist Composition EBN-1]

<Preparation of Resist Composition EBN-1>

A resist composition EBN-1 was prepared by mixing each of components shown below.

Poly-2

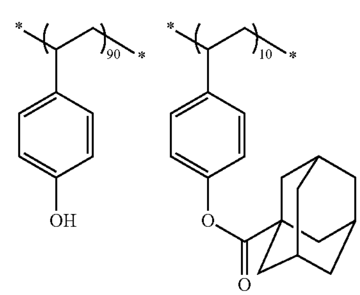

Mw: 3500
Mw/Mn = 1.1

<Other Components>

The photoacid generator (A-3), the quencher (B-5), and the crosslinking agent (CL-4) are shown below. Furthermore, in the photoacid generator (A-3), "Me" represents a methyl group.

A-3

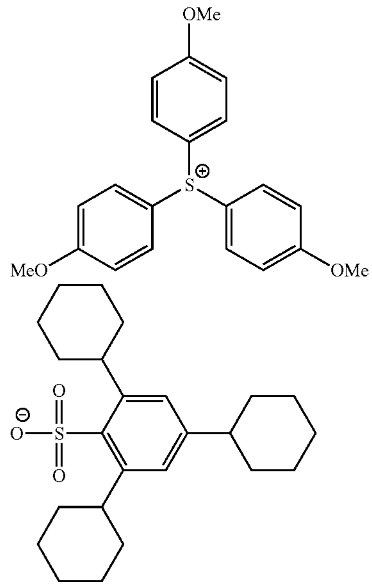

B-5

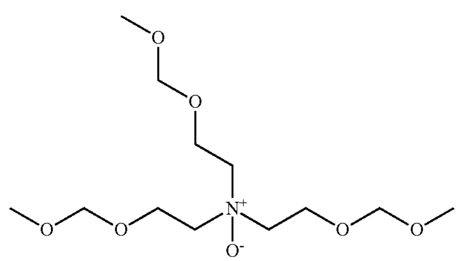

CL-4

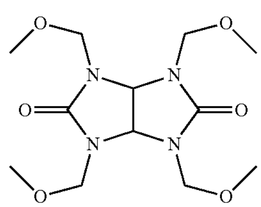

<Filtration of Resist Solution>

In addition, a resist composition EBN-1A was prepared by subjecting the resist composition EBN-1 prepared by the procedure to a filtration treatment shown below.

(Resist Composition EBN-1A)

4,000 g of the resist composition EBN-1 was circulation-filtered 15 times with the following two-stage filter to obtain a resist composition EBN-1A (incidentally, the circulation filtration performed 15 times means that the flow rate was measured and the number of passages of an amount 15 times the input amount of 4,000 g was 15).

First stage: Nylon filter with a pore size of 2 nm, manufactured by PALL Corporation Second stage: Polyethylene filter with a pore size of 1 nm, manufactured by Entegris

[Inspection of Resist Composition: Example 24]

[Defect Inspection of Inspection Wafer (Corresponding to Step Y1)]

Prior to the defect evaluation of the resist film, a defect inspection was carried out using a 12 inch (diameter: 300 mm) silicon wafer (inspection wafer) used for an inspection using a dark-field defect inspection device (Surfscan (registered trademark) SP5 manufactured by KLA-Tencor), and the number of defects (defect count) with a size of 19 nm or more existing on a surface of the silicon wafer was measured ("E: Original defect count on substrate").

[Formation of Resist Film (Corresponding to Step X1)]

The prepared resist composition EBN-1A was connected to a resist line (provided that the line is a different line from that of the solvent) of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the resist composition connected by the above-described method was applied onto the 12 inch (diameter: 300 mm) silicon wafer in which the defect count had been inspected in advance in [Defect Inspection of Inspection Wafer (Corresponding to Step Y1)] mentioned above with the coater, and then baked at 100° C. for 60 seconds to form a coating film. The film thickness of the resist film (coating film) at this time was adjusted to 50 nm.

[Step of Removing Resist Film (Corresponding to Step X2)]

Next, the resist film is removed from the silicon wafer with the resist film obtained by carrying out the above-described procedure of [Formation of Resist Film (Corresponding to Step X1)], using a removal solvent. Incidentally, the removal solvent as used herein is nBA-A prepared in [Preparation of Removal Solvent (Removal Solvent Used in Step X2)] mentioned above.

The removal was carried out by a coater (Tokyo Electron Limited, CLEAN TRACK (registered trademark), ACT (registered trademark) 12) to which the removal solvent after filtration had been connected by the same method as in [Evaluation of Cleanliness of Removal Solvent (Measurement of Defect Count Derived from Removal Solvent Used in Step X2)] mentioned above. Specifically, the removal solvent connected to the resist line of the coater by the above-mentioned method was applied onto a silicon wafer with a resist film by the coater (discharged at a flow rate of 1 mL/S for 15 seconds), and then baked at 100° C. for 60 seconds.

[Defect Inspection of Substrate after Removal (Corresponding to Step X3)]

<Calculation of [B: Defect Count after Removal]>

The wafer after the treatment was subjected to a defect inspection using a dark-field defect inspection device (Surfscan (registered trademark) SP5 manufactured by KLA-Tencor), and the number of defects (defect count) with a size of 19 nm or more existing on a surface of the silicon wafer was measured ([D: Total defect count after solvent removing treatment]).

Next, "B: Defect count after the removal" was determined by the following calculation expression, based on the results of "E: Original defect count on substrate" and [D: Total defect count after solvent removing treatment] obtained by the various inspections.

$$[B\text{: Defect count after the removal}]=[D\text{: Total defect count after solvent removing treatment}]-[E\text{: Original defect count on substrate}] \quad \text{Expression } (A2)\text{:}$$

Further, [B: Defect count after the removal] also includes the defect count derived from the removal solvent since the values are the results after the removal using the removal solvent. Therefore, as the defect count of the resist, a value obtained by subtracting the defect count derived from the removal solvent ([C: Defect count of removal solvent]) from the defect count after the removal was taken as "A: Defect count of resist".

The defect count of the resist was determined by the following calculation expression. Furthermore, [C: Defect count of removal solvent] is based on the numerical value shown in Table 1.

[*A*: Defect Count of Resist]=[*B*: Defect Count after the Removal]−[*C*: Defect count of removal solvent] Expression (*A*3):

As a result, [A: Defect count of resist] was 0.31 defects/$cm^2$ or less.

From the results, it was confirmed that the same evaluation as the evaluation with the ArF/EUV resist can be applied to a negative tone resist composition.

Inspection of Composition for Forming Organic Film (Composition for Forming Antireflection Film): Example 25

Next, a composition for forming an organic film was subjected to an inspection. The composition for forming an organic film as used herein is a composition for forming an antireflection film, AL412 (manufactured by Brewer Science, Inc.).

[Defect Inspection of Inspection Wafer (Corresponding to Step Y1)]

Prior to the defect evaluation of the organic antireflection film, a defect inspection was carried out using a 12 inch (diameter: 300 mm) silicon wafer (inspection wafer) used for an inspection using a dark-field defect inspection device (Surfscan (registered trademark) SP5 manufactured by KLA-Tencor), and the number of defects (defect count) with a size of 19 nm or more existing on a surface of the silicon wafer was measured ("E: Original defect count on substrate").

[Formation of Organic Antireflection Film (Corresponding to Step X1)]

The composition for forming an antireflection film, AL412, was connected to a resist line (provided that the line is a different line from that of the solvent) of a coater (Tokyo Electron Limited, CLEAN TRACK (registered trademark), ACT (registered trademark) 12) (incidentally, at the time of the connection, a dummy capsule was used without connecting a filter to a connection pipe).

Subsequently, the composition for forming an antireflection film, AL412, connected by the above-described method was applied onto the 12 inch (diameter: 300 mm) silicon wafer in which the defect count had been inspected in advance in [Defect Inspection of Inspection Wafer (Corresponding to Step Y1)] mentioned above with the coater, to form a coating film. The film thickness of the coating film was adjusted to 200 nm. In a case of carrying out the procedure, usually, the organic antireflection film is baked and hardened by a treatment such as baking at 200° C. for 60 seconds, but in the present investigations, spin drying was performed after the application without baking the film (for a reason that the hardening of the film by baking makes it impossible to remove with a removal solvent).

[Step of Removing Organic Antireflection Film (Corresponding to Step X2)]

Next, the organic antireflection film is removed from the silicon wafer with the organic antireflection film obtained by carrying out the above-described procedure of [Formation of Organic Antireflection Film (Corresponding to Step X1)], using a removal solvent. Incidentally, the removal solvent as used herein is nBA-A prepared in [Preparation of Removal Solvent (Removal Solvent Used in Step X2)] mentioned above.

The removal was carried out by a coater (Tokyo Electron Limited, CLEAN TRACK (registered trademark), ACT (registered trademark) 12) to which the removal solvent after filtration had been connected by the same method as in [Evaluation of Cleanliness of Removal Solvent (Measurement of Defect Count Derived from Removal Solvent Used in Step X2)] mentioned above. Specifically, the removal solvent connected to the resist line of the coater by the above-mentioned method was applied onto a silicon wafer with an organic antireflection film by the coater (discharged at a flow rate of 1 mL/S for 20 seconds), and then baked at 100° C. for 60 seconds.

[Defect Inspection of Substrate after Removal (Corresponding to Step X3)]

<Calculation of [B: Defect Count after Removal]>

The wafer after the treatment was subjected to a defect inspection using a dark-field defect inspection device (Surfscan (registered trademark) SP5 manufactured by KLA-Tencor), and the number of defects (defect count) with a size of 19 nm or more existing on a surface of the silicon wafer was measured ([D: Total defect count after solvent removing treatment]).

Next, "B: Defect count after the removal" was determined by the following calculation expression, based on the results of "E: Original defect count on substrate" and [D: Total defect count after solvent removing treatment] obtained by the various inspections.

[*B*: Defect count after the removal]=[*D*: Total defect count after solvent removing treatment]−[*E*: Original defect count on substrate] Expression (*A*2):

Further, [B: Defect count after the removal] also includes the defect count derived from the removal solvent since the values are the results after the removal using the removal solvent. Therefore, a value obtained by subtracting the defect count derived from the removal solvent ([C: Defect count of removal solvent]) from the defect count after the removal as the defect count of the organic antireflection film was taken as "G: Defect count of organic antireflection film".

"G: Defect count of organic antireflection film" was determined by the following calculation expression. Furthermore, [C: Defect count of removal solvent] is based on the numerical value shown in Table 1.

[*G*: Defect count of organic antireflection film]=[*B*: Defect count after the removal]−[*C*: Defect count of removal solvent] Expression (*A*4):

As a result, [G: Defect count of organic antireflection film] was 0.24 defects/$cm^2$ or less.

From the results, it was confirmed that the same evaluation as in the evaluation with the ArF/EUV resist can be applied to the composition for forming an organic film (composition for forming an antireflection film).

[Preparation of Resist Composition (for ArF)]

[Preparation of Resist Composition ArF—[N]]

As the resist composition, the following resist composition ArF—[N] was prepared. Here, [N] represents a number from 2 to 47. That is, it is intended that the resist compositions ArF-2 to ArF-47 were prepared.

In addition, three types of resist compositions, ArF—[N]A, ArF—[N]B, and ArF—[N]C, were prepared by subjecting the prepared resist composition ArF—[N] to different three types of filtration treatments, as shown in the latter section.

Therefore, for example, in a case where [N] is 2, it is intended to subject the resist composition ArF-2 to different filtration treatments to prepare three different types of resist compositions, ArF-2A, ArF-2B, and ArF-2C.

The compositions of the resist compositions ArF—[N] ([N]: 2 to 47) are shown in Tables 13 and 14. The type of each component constituting the resist composition ArF—[N] ([N]: 2 to 47) is shown in Table 13, and the content (0 by mass) of each component shown in Table 13 in the composition is shown in Table 14. Furthermore, in Table 14, the content of a component other than the solvent is intended to be a content (0 by mass) with respect to the total solid content of the composition. In addition, the "Concentration (00 by mass) of solid contents" in Table 14 is intended to be a content of a component other than the solvent with respect to the total mass of the composition. In addition, the numerical values in the "Solvent (mass ratio)" column in Table 14 correspond in order from the left of the solvents listed in the "Solvent" column in Table 13. Moreover, the film thickness (nm) in Table 14 indicates a film thickness of a resist film (coating film) formed in a case of carrying out [Formation of Resist Film (Corresponding to Step X1)] in the inspection on the resist composition in Examples 26 to 71 which will be described later.

TABLE 8

| | Blended components in resist composition ArF-[N] | | | | | |
|---|---|---|---|---|---|---|
| Table 13-1 | Acid-decomposable resin | Photoacid generator | Quencher | Hydrophobic resin | Surfactant | Solvent |
| ArF-2 | A-2 | F-3 | C-2 | E-1 | | F-1/F-2 |
| ArF-3 | A-3 | F-1 | C-10 | E-9 | H-5 | F-1/F-4 |
| ArF-4 | A-4 | F-2 | C-3 | | H-5 | F-1/F-2 |
| ArF-5 | A-5 | F-5 | C-9 | E-3 | | F-1/F-2 |
| ArF-6 | A-6 | F-1 | C-4 | E-4 | H-3 | F-1/F-2 |
| ArF-7 | A-7 | F-8 | C-8 | | H-2 | F-1/F-2 |
| ArF-8 | A-8 | F-1 | C-10 | E-9 | H-4 | F-1/F-3/F-8 |
| ArF-9 | A-9 | F-8 | C-8 | | H-2 | F-1/F-2 |
| ArF-10 | A-10 | F-6 | C-2 | E-2 | | F-1/F-4 |
| ArF-11 | A-11 | F-8 | C-6 | | H-2 | F-1/F-2 |
| ArF-12 | A-12 | F-8 | C-8 | | H-2 | F-1/F-2 |
| ArF-13 | A-13 | F-6 | C-2 | E-2 | | F-1/F-4 |
| ArF-14 | A-2 | F-7 | C-3 | E-13 | H-4 | F-1/F-4 |
| ArF-15 | A-3 | F-8 | C-6 | | H-2 | F-1/F-2 |
| ArF-16 | A-4 | F-4 | C-7 | E-3 | H-4 | F-1/F-5/F-8 |
| ArF-17 | A-5 | F-4 | C-5 | E-4 | H-4 | F-1/F-2/F-8 |
| ArF-18 | A-6 | F-5 | C-7 | E-14 | H-2 | F-1/F-5 |
| ArF-19 | A-7 | F-8 | C-6 | | H-2 | F-1/F-2 |
| ArF-20 | A-8 | F-9 | C-9 | E-4 | H-1 | F-1/F-4/F-8 |
| ArF-21 | A-9 | F-5 | C-10 | E-5 | | F-1/F-2/F-8 |
| ArF-22 | A-10 | F-1/F-3 | C-2 | E-12 | H-1 | F-1/F-5 |
| ArF-23 | A-11 | F-8 | C-8 | | H-2 | F-1/F-2 |
| ArF-24 | A-12 | F-1 | C-4 | E-4 | H-3 | F-1/F-2 |
| ArF-25 | A-13 | F-8 | C-8 | | H-2 | F-1/F-2 |
| ArF-26 | A-2 | F-9 | C-10 | E-6 | H-1 | F-1/F-7 |
| ArF-27 | A-3 | F-8 | C-8 | | H-2 | F-1/F-2 |
| ArF-28 | A-4 | F-9 | C-11 | E-15 | | F-1/F-4 |
| ArF-29 | A-5 | F-4/F-7 | C-9 | E-3 | | F-1/F-2/F-8 |
| ArF-30 | A-6 | F-9 | C-3 | E-11 | H-3 | F-1/F-4 |
| ArF-31 | A-7 | F-8 | C-6 | | H-2 | F-1/F-2 |
| ArF-32 | A-8 | F-10 | C-2 | E-7 | H-1 | F-1/F-6 |
| ArF-33 | A-9 | F-8 | C-6 | | H-2 | F-1/F-2 |
| ArF-34 | A-10 | F-9 | C-8 | E-8 | H-1 | F-1/F-3 |

TABLE 9

| | Blended components in resist composition ArF-[N] | | | | | |
|---|---|---|---|---|---|---|
| Table 13-2 | Acid-decomposable resin | Photoacid generator | Quencher | Hydrophobic resin | Surfactant | Solvent |
| ArF-35 | A-11 | F-8 | C-11 | E-10 | | F-1/F-4 |
| ArF-36 | A-12 | F-8 | C-6 | | H-2 | F-1/F-2 |
| ArF-37 | A-13 | F-8 | C-6 | | H-2 | F-1/F-2 |
| ArF-38 | A-14 | F-13/F-18 | | E-3 | | F-1/F-2 |
| ArF-39 | A-15 | F-11/F-9 | | E-1 | | F-1/F-2 |
| ArF-40 | A-16 | F-12 | C-6 | | H-1 | F-1/F-4 |
| ArF-41 | A-17 | F-17 | C-7 | | H-2 | F-1/F-4 |
| ArF-42 | A-18 | F-16/F-4 | | E-3 | | F-1/F-2/F-8 |
| ArF-43 | A-19 | F-15 | | E-3 | | F-1/F-4 |
| ArF-44 | A-20 | F-14/F-3 | | E-4 | | F-1/F-2 |
| ArF-45 | A-2 | F-18 | C-4 | E-5 | H-3 | F-1/F-8 |
| ArF-46 | A-4 | F-13 | | | H-4 | F-1/F-8 |
| ArF-47 | A-8 | F-14 | C-2 | E-6 | | F-1/F-4 |

TABLE 10

| Table 14-1 | Concentration (% by mass) of solid contents | Content (% by mass) with respect to total solid contents Acid-decomposable resin | Photoacid generator | Quencher | Hydrophobic resin | Surfactant | Solvent (mass ratio) | Film thickness (nm) |
|---|---|---|---|---|---|---|---|---|
| ArF-2 | 4 | 88.5 | 11.2 | 0.2 | 0.1 | | 70/30 | 120 |
| ArF-3 | 3 | 84 | 15 | 0.4 | 0.4 | 0.2 | 50/50 | 85 |
| ArF-4 | 4 | 93.7 | 5.3 | 0.5 | 0.2 | 0.3 | 80/20 | 120 |
| ArF-5 | 6 | 95.2 | 4.1 | 0.3 | 0.4 | | 70/30 | 200 |
| ArF-6 | 8 | 96.4 | 2.3 | 0.8 | 0.4 | 0.1 | 60/40 | 300 |
| ArF-7 | 12 | 92.6 | 7.2 | 0.1 | | 0.1 | 60/40 | 500 |
| ArF-8 | 7 | 79.1 | 20.1 | 0.5 | 0.1 | 0.2 | 72/25/3 | 250 |
| ArF-9 | 11 | 91.2 | 8.5 | 0.2 | | 0.1 | 60/40 | 600 |
| ArF-10 | 6 | 80.8 | 17.3 | 0.9 | 1 | | 60/40 | 200 |
| ArF-11 | 11 | 90.6 | 9.1 | 0.2 | | 0.1 | 60/40 | 500 |
| ArF-12 | 12 | 92.6 | 7.2 | 0.1 | | 0.1 | 60/40 | 500 |
| ArF-13 | 6 | 80.8 | 17.3 | 0.9 | 1 | | 60/40 | 200 |
| ArF-14 | 4 | 86.7 | 11 | 0.1 | 2 | 0.2 | 80/20 | 120 |
| ArF-15 | 12 | 89.7 | 10 | 0.2 | | 0.1 | 60/40 | 600 |
| ArF-16 | 7 | 80.2 | 14.5 | 1.2 | 4 | 0.1 | 70/20/10 | 250 |
| ArF-17 | 8 | 92.4 | 5 | 1.5 | 1 | 0.1 | 70/25/5 | 300 |
| ArF-18 | 11 | 92.5 | 6 | 0.9 | 0.5 | 0.1 | 70/30 | 580 |
| ArF-19 | 12 | 95 | 4.7 | 0.2 | | 0.1 | 60/40 | 600 |
| ArF-20 | 3 | 94.7 | 4 | 0.5 | 0.7 | 0.1 | 72/25/3 | 85 |
| ArF-21 | 4 | 95.3 | 4 | 0.6 | 0.1 | | 72/25/3 | 120 |
| ArF-22 | 4 | 85.3 | 3.2/9.8 | 0.8 | 0.7 | 0.2 | 70/30 | 120 |
| ArF-23 | 12 | 89.6 | 10 | 0.3 | | 0.1 | 60/40 | 500 |
| ArF-24 | 8 | 96.4 | 2.3 | 0.8 | 0.4 | 0.1 | 60/40 | 300 |
| ArF-25 | 12 | 89.6 | 10 | 0.3 | | 0.1 | 60/40 | 500 |
| ArF-26 | 3 | 93.6 | 3.2 | 0.5 | 2.5 | 0.2 | 80/20 | 85 |
| ArF-27 | 10 | 91.6 | 8 | 0.3 | | 0.1 | 60/40 | 500 |
| ArF-28 | 5 | 91.6 | 4.5 | 0.9 | 3 | | 60/40 | 150 |
| ArF-29 | 3 | 77.6 | 3.3/17.4 | 1.1 | 0.6 | | 80/15/5 | 85 |
| ArF-30 | 6 | 91.7 | 6 | 1.2 | 0.9 | 0.2 | 60/40 | 200 |
| ArF-31 | 12 | 90.2 | 9.4 | 0.3 | | 0.1 | 60/40 | 500 |
| ArF-32 | 8 | 95.6 | 2.6 | 1 | 0.7 | 0.1 | 70/30 | 300 |
| ArF-33 | 11 | 90.6 | 9.1 | 0.2 | | 0.1 | 60/40 | 600 |
| ArF-34 | 10 | 96.1 | 2.7 | 0.7 | 0.4 | 0.1 | 80/20 | 400 |

TABLE 11

| Table 14-2 | Concentration (% by mass) of solid contents | Content (% by mass) with respect to total solid contents Acid-decomposable resin | Photoacid generator | Quencher | Hydrophobic resin | Surfactant | Solvent (mass ratio) | Film thickness (nm) |
|---|---|---|---|---|---|---|---|---|
| ArF-35 | 4 | 90.7 | 8 | 0.8 | 0.5 | | 80/20 | 120 |
| ArF-36 | 12 | 90.2 | 9.4 | 0.3 | | 0.1 | 60/40 | 500 |
| ArF-37 | 11 | 90.6 | 9.1 | 0.2 | | 0.1 | 60/40 | 500 |
| ArF-38 | 3 | 92.6 | 4.9/2.4 | | 0.1 | | 60/40 | 90 |
| ArF-39 | 4 | 91.6 | 5.6/2.7 | | 0.1 | | 60/40 | 100 |
| ArF-40 | 4 | 85.7 | 14 | 0.2 | | 0.1 | 70/30 | 95 |
| ArF-41 | 3 | 84.9 | 12.5 | 2.4 | | 0.2 | 70/30 | 85 |
| ArF-42 | 3 | 88.9 | 9.3/1.7 | | 0.1 | | 70/28.5/1.5 | 90 |
| ArF-43 | 4 | 90.4 | 9.4 | | 0.2 | | 70/30 | 100 |
| ArF-44 | 5 | 88.4 | 6.8/3.8 | | 1 | | 70/30 | 120 |
| ArF-45 | 4 | 88.7 | 8.9 | 2.2 | 0.1 | 0.1 | 90/10 | 100 |
| ArF-46 | 3 | 93.8 | 5.2 | | | 1 | 95/5 | 90 |
| ArF-47 | 4 | 81.4 | 13.4 | 3.2 | 2 | | 80/20 | 90 |

[Each Component in Tables 13 and 14]

Hereinafter, each component in Tables 13 and 14 will be shown.

<Acid-Decomposable Resin>

The structures of the acid-decomposable resins A-2 to A-20 shown in Tables 13 and 14 are shown in Table 15.

TABLE 12

| | Composition (Molar ratio (% by mole), weight-average molecular weight (Mw), and dispersity (Mw/Mn) of acid-decomposable resin | | | | | | | | | | | |
|---|---|---|---|---|---|---|---|---|---|---|---|---|
| | Type of monomer constituting | | | | | Molar ratio (% by mole) of repeating unit derived from each monomer | | | | | | |
| Table 15 | M-1 | M-2 | M-3 | M-4 | M-5 | M-1 | M-2 | M-3 | M-4 | M-5 | Mw | Mw/Mn |
| A-2 | MB-1 | MA-7 | MA-2 | | | 50 | 40 | 10 | | | 10000 | 1.6 |
| A-3 | MB-3 | MC-2 | MA-2 | MC-4 | | 40 | 20 | 30 | 10 | | 8000 | 1.5 |
| A-4 | MB-4 | MC-1 | MA-7 | | | 30 | 55 | 15 | | | 10000 | 1.6 |
| A-5 | MB-3 | MA-8 | MA-2 | | | 40 | 50 | 10 | | | 17000 | 1.7 |
| A-6 | MB-2 | MA-6 | MA-4 | | | 45 | 50 | 5 | | | 15000 | 1.7 |
| A-7 | MB-13 | MC-2 | MA-2 | MC-4 | | 40 | 20 | 30 | 10 | | 8000 | 1.5 |
| A-8 | MB-10 | MA-5 | | | | 40 | 60 | | | | 6000 | 1.4 |
| A-9 | MB-4 | MC-1 | MA-2 | MC-4 | | 40 | 20 | 30 | 10 | | 8000 | 1.5 |
| A-10 | MB-7 | MB-7 | MC-1 | | | 40 | 10 | 50 | | | 12000 | 1.6 |
| A-11 | MB-13 | MC-1 | MA-2 | MC-4 | | 40 | 20 | 30 | 10 | | 7000 | 1.5 |
| A-12 | MB-13 | MC-2 | MA-2 | MA-7 | MC-4 | 40 | 20 | 25 | 5 | 10 | 8000 | 1.5 |
| A-13 | MB-13 | MC-1 | MA-2 | MA-7 | MC-4 | 40 | 20 | 25 | 5 | 10 | 8000 | 1.5 |
| A-14 | MB-1 | MA-10 | | | | 45 | 55 | | | | 6000 | 1.4 |
| A-15 | MB-3 | MA-8 | MA-1 | | | 40 | 30 | 30 | | | 7000 | 1.5 |
| A-16 | MB-4 | MA-4 | MA-6 | | | 45 | 10 | 45 | | | 9000 | 1.5 |
| A-17 | MB-8 | MB-10 | MA-11 | MC-2 | | 33 | 22 | 40 | 5 | | 10000 | 1.6 |
| A-18 | MB-2 | MA-7 | MA-2 | | | 45 | 33 | 22 | | | 8000 | 1.5 |
| A-19 | MB-6 | MA-9 | MA-3 | | | 40 | 40 | 20 | | | 6000 | 1.4 |
| A-20 | MB-3 | MA-8 | MA-2 | | | 50 | 10 | 40 | | | 6000 | 1.4 |

Hereinbelow, the structure of each monomer shown in Table 15 will be shown.

MB-1

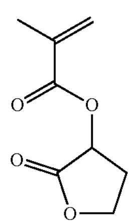

MB-2

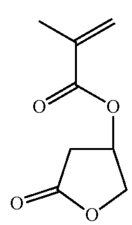

MB-3

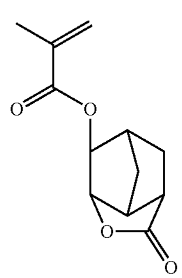

-continued

MB-4

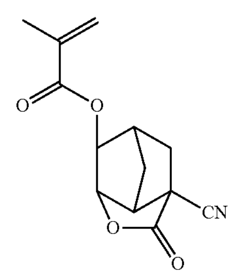

MB-6

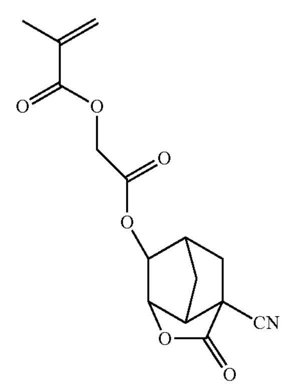

-continued
MB-7
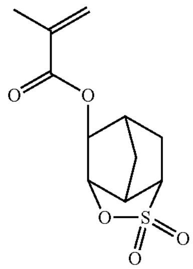
MB-8
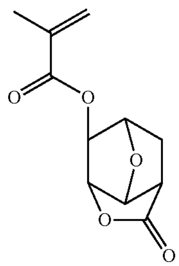
MB-10
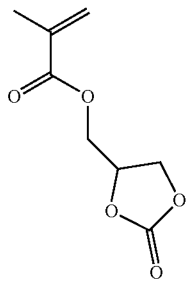
MB-13
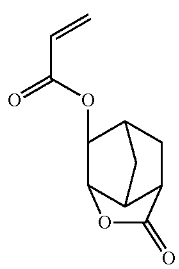
MC-1
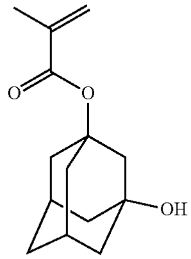
-continued
MC-2
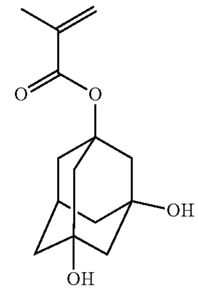
MC-4
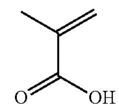
MA-1
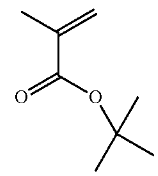
MA-2
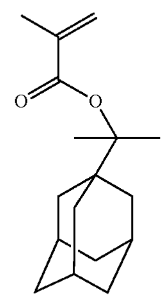
MA-3
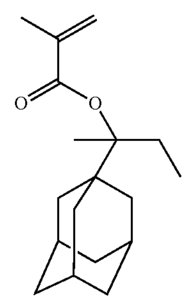
MA-4
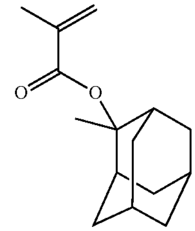

-continued
MA-5
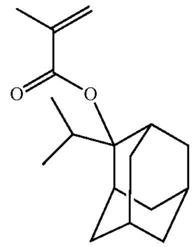
MA-6
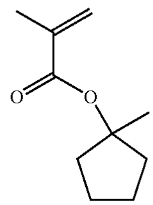
MA-7
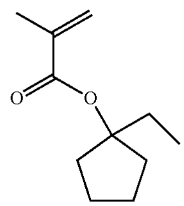
MA-8
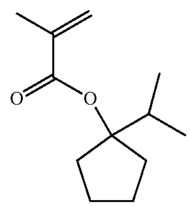
MA-10
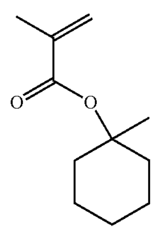
MA-11
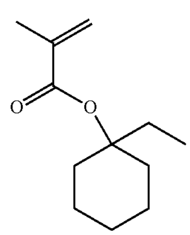
<Photoacid Generator>
The structures of the photoacid generators F-1 to F-18 shown in Tables 13 and 14 are shown below.
F-1
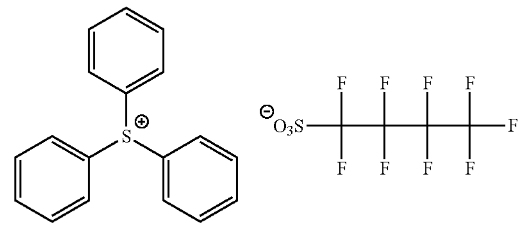
F-2
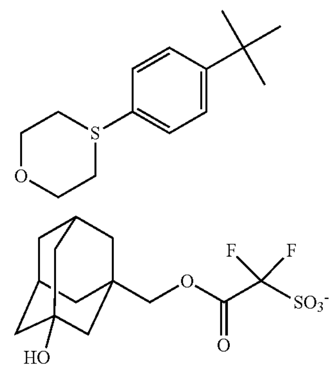
F-3
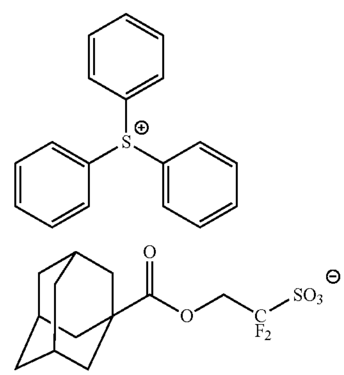
F-4
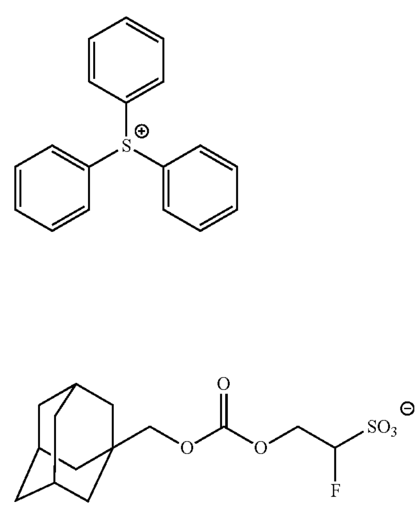

-continued
F-5
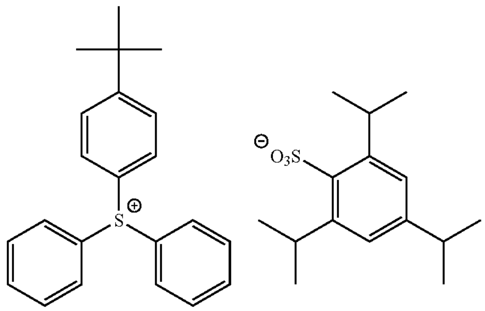
F-6
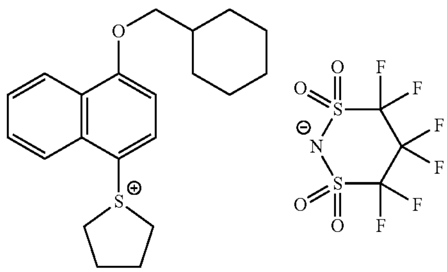
F-7
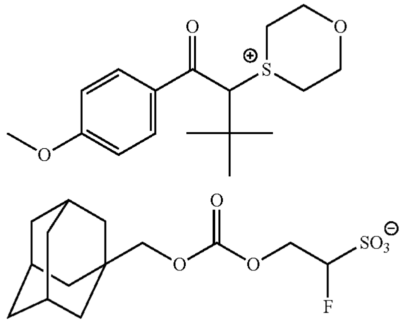
F-8
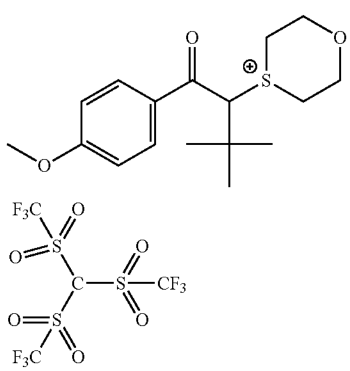
F-9
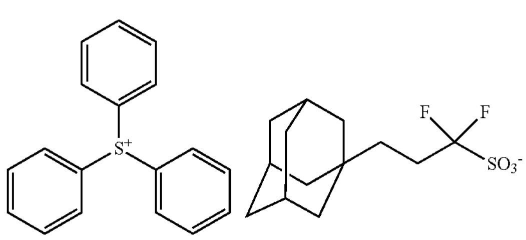
-continued
F-10
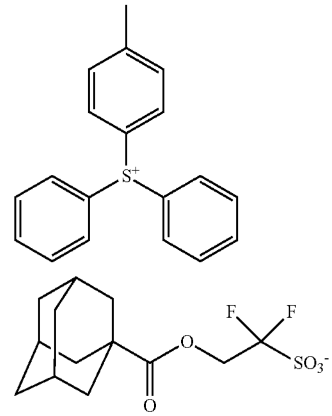
F-11
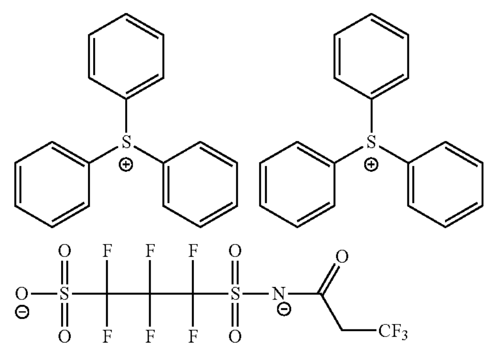
F-12
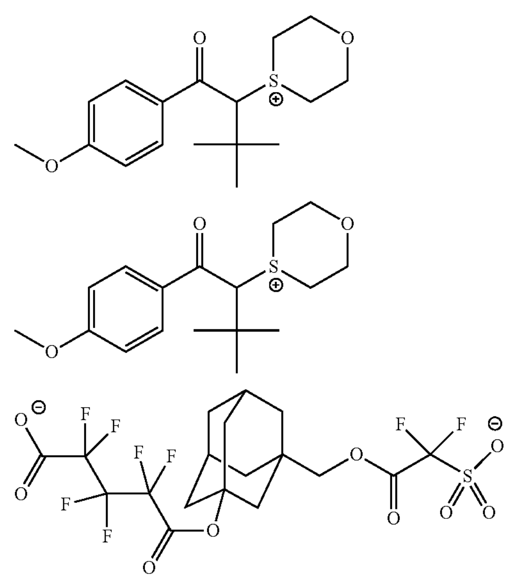
F-13
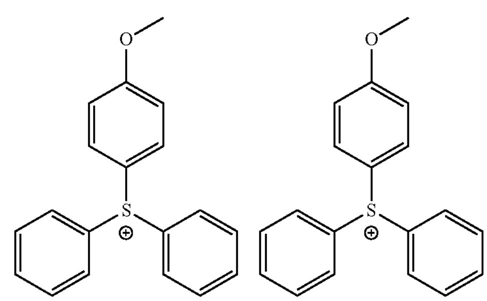

-continued
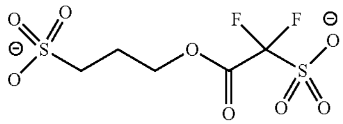
F-14
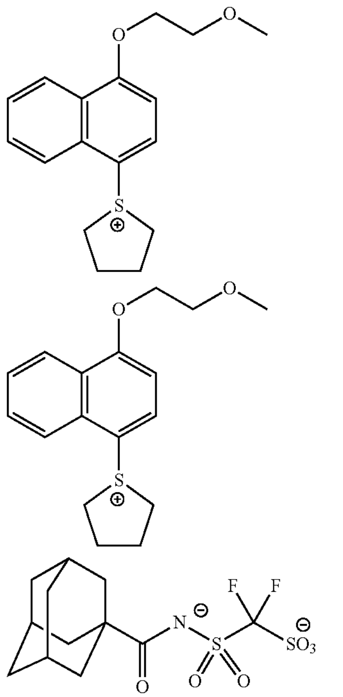
F-15
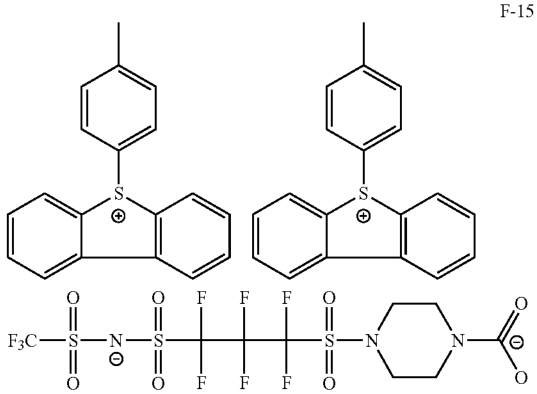
F-16
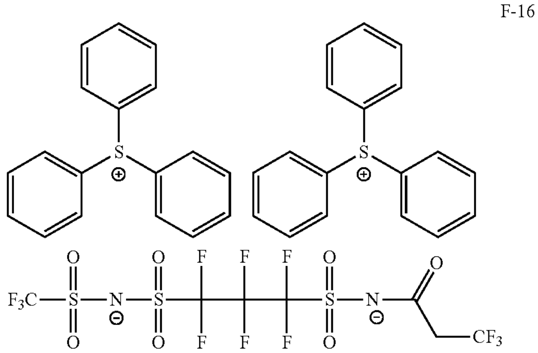
F-17
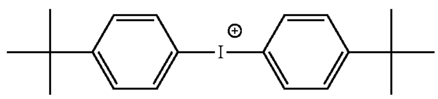
-continued
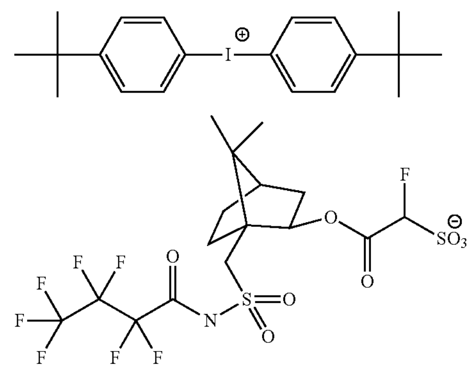
F-18
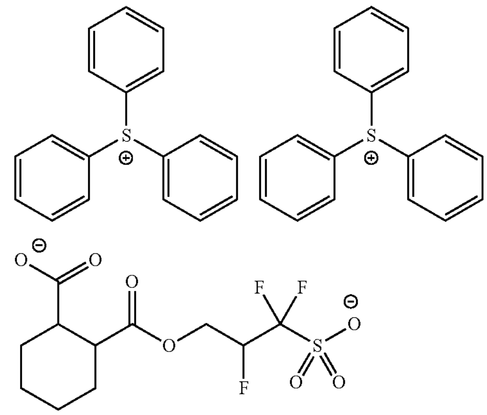
<Quencher>
The structures of the quenchers C-2 to C-11 shown in Tables 13 and 14 are shown below.
C-2
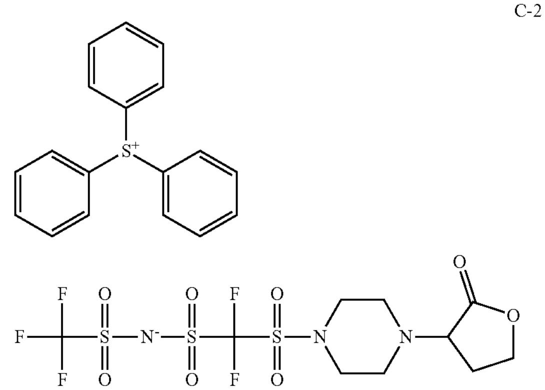
C-3
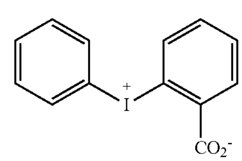

-continued

C-4

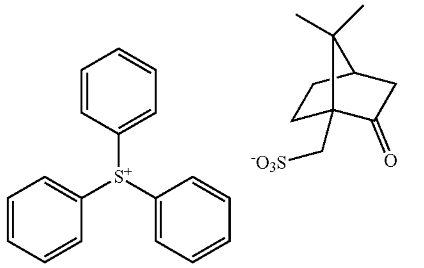

C-5

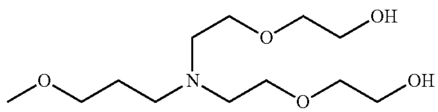

C-6

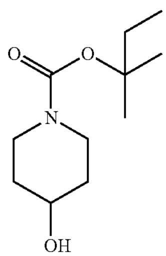

C-7

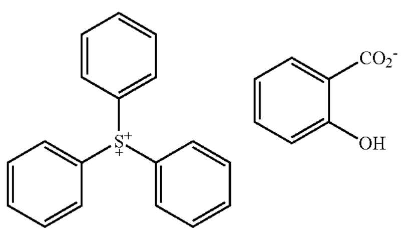

C-8

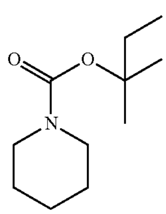

-continued

C-9

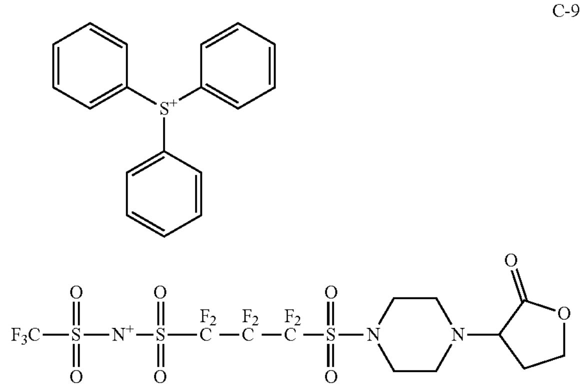

C-10

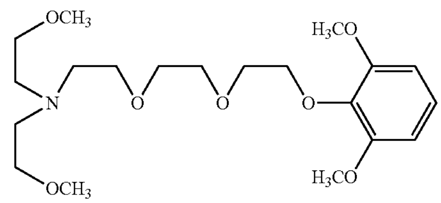

C-11

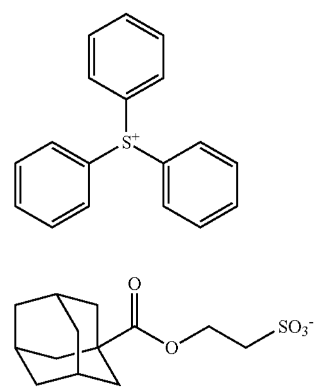

<Hydrophobic Resin>

The structures of the hydrophobic resins E-1 to E-15 shown in Tables 13 and 14 are shown below.

TABLE 13

| | Composition (Molar ratio (% by mole), weight-average molecular weight (Mw), and dispersity (Mw/Mn) of acid-decomposable resin | | | | | | | | | |
|---|---|---|---|---|---|---|---|---|---|---|
| | Repeating unit 1 | | Repeating unit 2 | | Repeating unit 3 | | Repeating unit 4 | | | |
| Table 16 | Monomer 1 | Molar ratio (% by mole) | Monomer 2 | Molar ratio (% by mole) | Monomer 3 | Molar ratio (% by mole) | Monomer 4 | Molar ratio (% by mole) | Mw | Mw/Mn |
| Resin E-1 | ME-3 | 60 | ME-4 | 40 | | | | | 10000 | 1.4 |
| Resin E-2 | ME-15 | 50 | ME-1 | 50 | | | | | 12000 | 1.5 |
| Resin E-3 | ME-2 | 40 | ME-13 | 50 | ME-9 | 5 | ME-20 | 5 | 6000 | 1.3 |
| Resin E-4 | ME-19 | 50 | ME-14 | 50 | | | | | 9000 | 1.5 |
| Resin E-5 | ME-10 | 50 | ME-2 | 50 | | | | | 15000 | 1.5 |
| Resin E-6 | ME-17 | 50 | ME-15 | 50 | | | | | 10000 | 1.5 |
| Resin E-7 | ME-7 | 100 | | | | | | | 23000 | 1.7 |
| Resin E-8 | ME-5 | 100 | | | | | | | 13000 | 1.5 |
| Resin E-9 | ME-6 | 50 | ME-16 | 50 | | | | | 10000 | 1.7 |
| Resin E-10 | ME-13 | 10 | ME-18 | 85 | ME-9 | 5 | | | 11000 | 1.4 |
| Resin E-11 | ME-8 | 80 | ME-11 | 20 | | | | | 13000 | 1.4 |
| Resin E-12 | ME-24 | 100 | | | | | | | 31000 | 2.0 |

TABLE 13-continued

| Table 16 | Composition (Molar ratio (% by mole), weight-average molecular weight (Mw), and dispersity (Mw/Mn) of acid-decomposable resin | | | | | | | | | |
|---|---|---|---|---|---|---|---|---|---|---|
| | Repeating unit 1 | | Repeating unit 2 | | Repeating unit 3 | | Repeating unit 4 | | | |
| | Monomer 1 | Molar ratio (% by mole) | Monomer 2 | Molar ratio (% by mole) | Monomer 3 | Molar ratio (% by mole) | Monomer 4 | Molar ratio (% by mole) | Mw | Mw/Mn |
| Resin E-13 | ME-1 | 30 | ME-21 | 65 | ME-12 | 5 | | | 7000 | 1.1 |
| Resin E-14 | ME-23 | 30 | ME-10 | 60 | ME-22 | 10 | | | 15000 | 1.5 |
| Resin E-15 | ME-23 | 40 | ME-3 | 20 | ME-24 | 40 | | | 10000 | 1.3 |

Hereinbelow, the structure of each monomer shown in Table 16 will be shown.

ME-1

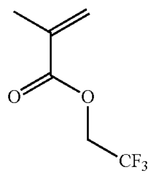

ME-2

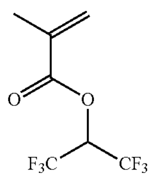

ME-3

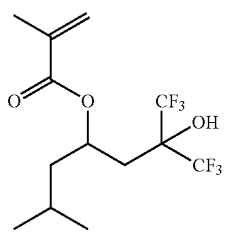

ME-4

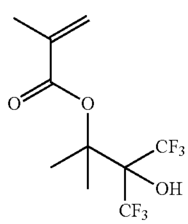

ME-5

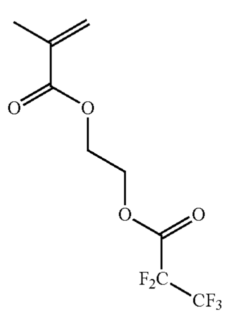

-continued

ME-6

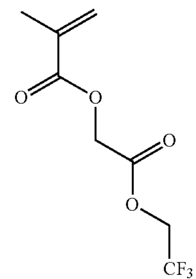

ME-7

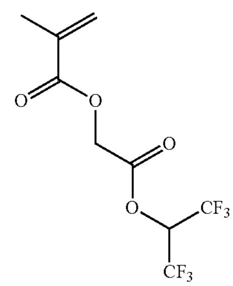

ME-8

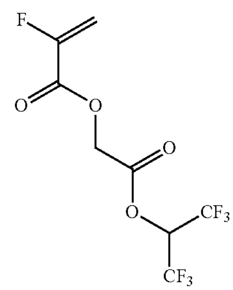

ME-9

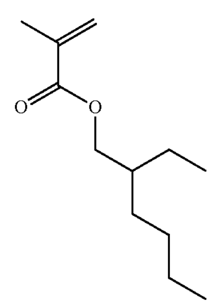

-continued
ME-10
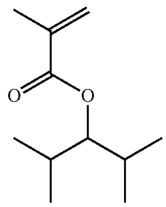
ME-11
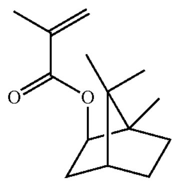
ME-12
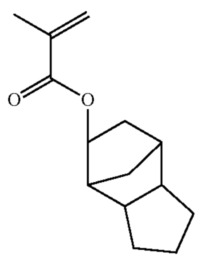
ME-13
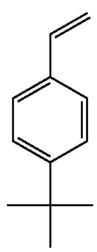
ME-14
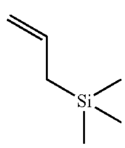
ME-15
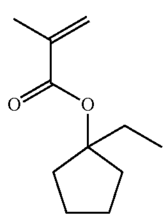
ME-16
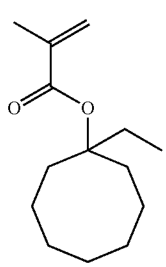
-continued
ME-17
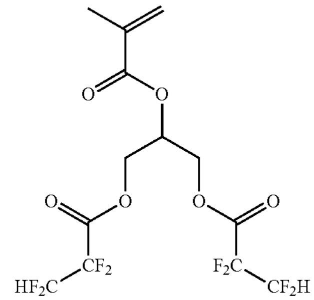
ME-18
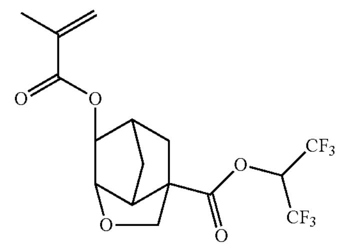
ME-19
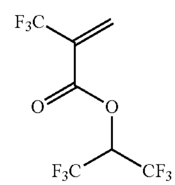
ME-20
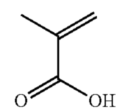
ME-21
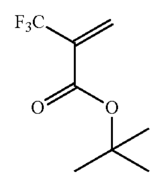
ME-22
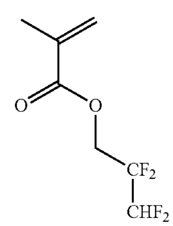
ME-23
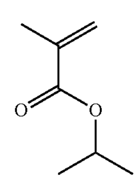

-continued

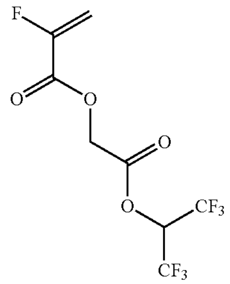

ME-24

<Surfactant>

The surfactants H-1 to H-5 shown in Tables 13 and 14 are shown below.

H-1: MEGAFACE F176 (manufactured by DIC Corporation, fluorine-based surfactant)

H-2: MEGAFACE R-41 (manufactured by DIC Corporation, fluorine-based surfactant)

H-3: MEGAFACE R08 (manufactured by DIC Corporation, fluorine- and silicon-based surfactant)

H-4: PF656 (manufactured by OMNOVA Solutions Inc., fluorine-based surfactant)

H-5: PF6320 (manufactured by OMNOVA Solutions Inc., fluorine-based surfactant)

<Solvent>

The solvents F-1 to F-8 shown in Tables 13 and 14 are shown below.

F-1: Propylene glycol monomethyl ether acetate (PGMEA)

F-2: Propylene glycol monomethyl ether (PGME)

F-3: Propylene glycol monoethyl ether (PGEE)

F-4: Cyclohexanone

F-5: Cyclopentanone

F-6: 2-Heptanone

F-7: Ethyl lactate

F-8: γ-Butyrolactone

[Filtration of Resist Solution]

In addition, three types of resist compositions, ArF—[N]A, ArF—[N]B, and ArF—[N]C, were prepared by subjecting the prepared resist compositions ArF—[N] (N: 2 to 47) to different three types of filtration treatments, as shown in the latter section.

That is, ArF-2A to ArF-47A, ArF-2B to ArF-47B, and ArF-2C to ArF-47C were prepared.

(Resist Composition ArF—[N]A)

12,000 g of the resist composition ArF—[N] was filtered through a polyethylene filter with a pore size of 10 nm, manufactured by Entegris, to obtain a resist composition ArF—[N]A.

(Resist Composition ArF—[N]B)

12,000 g of the resist composition ArF—[N] was filtered through the following two-stage filter to obtain a resist composition ArF—[N]B.

First stage: Nylon filter with a pore size of 5 nm, manufactured by PALL Corporation Second stage: Polyethylene filter with a pore size of 1 nm, manufactured by Entegris (Resist Composition ArF—[N]C)

12,000 g of the resist composition ArF—[N] was circulation-filtered 15 times with the following two-stage filter to obtain a resist composition ArF—[N]C (incidentally, the circulation filtration performed 15 times means that the flow rate was measured and the number of passages of an amount 15 times the input amount of 12,000 g was 15).

First stage: Nylon filter with a pore size of 5 nm, manufactured by PALL Corporation Second stage: Polyethylene filter with a pore size of 1 nm, manufactured by Entegris

[Inspection of Resist Composition: Examples 26 to 71]

Inspection of the resist compositions (Examples 26 to 71) and evaluation thereof were carried out by the same procedure as described in [Inspection of Resist Composition: Examples 1 to 11], except that in a case where the resist compositions ArF-1A to ArF-1C were changed to the resist compositions ArF—[N]A to ArF—[N]C and the film thickness of a resist film (coating film) formed in a case of carrying out [Formation of Resist Film (Corresponding to Step X1)] was changed to a film thickness shown in Table 14 (for example, in a case where the resist used is ArF-2, the film thickness of the resist film (coating film) in [Formation of Resist Film (Corresponding to Step X1)] of the filtered resist composition (ArF-2A, ArF-2B, or ArF-2C) derived from ArF-2 is 120 nm.). The results of [B: Defect count after the removal] are shown in Table 17 and the results of [A: Defect count of resist] are shown in Table 18. Furthermore, the removal solvents (nBA-A and nBA-B) shown in Examples 26 to 71 are the same as the removal solvents (nBA-A and nBA-B) described in [Inspection of Resist Composition: Examples 1 to 11] mentioned above, respectively.

TABLE 14

| Table 17-1 ([B: Defect count after removal]) | Resist used | Removal solvent (Removal solvent used in step X2) | ArF-[N]A [10 nm UPE] (Defect count (defects/cm$^2$)) | ArF-[N]B [5 nm N + 1 nm U] Defect count (defects/cm$^2$)) | ArF-[N]C [Circulation filtration performed 15 times] (Defect count (defects/cm$^2$)) |
|---|---|---|---|---|---|
| Example 26 | ArF-2 | nBA-A | 2.34 | 0.35 | 0.25 |
| Example 27 | ArF-3 | nBA-A | 2.49 | 0.52 | 0.31 |
| Example 28 | ArF-4 | nBA-A | 2.38 | 0.38 | 0.23 |
| Example 29 | ArF-5 | nBA-A | 2.89 | 0.61 | 0.36 |
| Example 30 | ArF-6 | nBA-A | 2.86 | 0.66 | 0.33 |
| Example 31 | ArF-7 | nBA-A | 2.49 | 0.45 | 0.22 |
| Example 32 | ArF-8 | nBA-A | 2.70 | 0.40 | 0.24 |
| Example 33 | ArF-9 | nBA-A | 2.46 | 0.44 | 0.27 |
| Example 34 | ArF-10 | nBA-A | 2.71 | 0.57 | 0.34 |
| Example 35 | ArF-11 | nBA-A | 3.03 | 0.45 | 0.27 |
| Example 36 | ArF-12 | nBA-A | 3.12 | 0.44 | 0.26 |
| Example 37 | ArF-13 | nBA-A | 2.48 | 0.75 | 0.37 |

TABLE 14-continued

| Table 17-1 ([B: Defect count after removal]) | Resist used | Removal solvent (Removal solvent used in step X2) | ArF-[N]A [10 nm UPE] (Defect count (defects/cm$^2$)) | ArF-[N]B [5 nm N + 1 nm U] Defect count (defects/cm$^2$)) | ArF-[N]C [Circulation filtration performed 15 times] (Defect count (defects/cm$^2$)) |
|---|---|---|---|---|---|
| Example 38 | ArF-14 | nBA-A | 2.06 | 0.47 | 0.28 |
| Example 39 | ArF-15 | nBA-A | 2.86 | 0.66 | 0.33 |
| Example 40 | ArF-16 | nBA-A | 2.70 | 0.40 | 0.24 |
| Example 41 | ArF-17 | nBA-A | 3.12 | 0.44 | 0.26 |
| Example 42 | ArF-18 | nBA-B | 4.56 | 3.19 | 3.51 |
| Example 43 | ArF-19 | nBA-B | 3.81 | 2.67 | 2.61 |
| Example 44 | ArF-20 | nBA-B | 6.23 | 3.74 | 4.11 |
| Example 45 | ArF-21 | nBA-B | 5.44 | 3.26 | 3.59 |
| Example 46 | ArF-22 | nBA-B | 5.87 | 3.52 | 3.88 |
| Example 47 | ArF-23 | nBA-B | 6.07 | 3.64 | 4.01 |
| Example 48 | ArF-24 | nBA-B | 4.63 | 2.78 | 2.64 |
| Example 49 | ArF-25 | nBA-B | 7.98 | 3.19 | 2.87 |
| Example 50 | ArF-26 | nBA-B | 8.94 | 4.47 | 4.92 |
| Example 51 | ArF-27 | nBA-B | 6.40 | 3.84 | 4.22 |
| Example 52 | ArF-28 | nBA-B | 8.22 | 4.11 | 3.70 |
| Example 53 | ArF-29 | nBA-B | 5.91 | 2.95 | 2.66 |
| Example 54 | ArF-30 | nBA-B | 6.91 | 3.45 | 3.80 |
| Example 55 | ArF-31 | nBA-B | 7.38 | 3.69 | 3.32 |
| Example 56 | ArF-32 | nBA-B | 5.91 | 3.54 | 3.90 |
| Example 57 | ArF-33 | nBA-B | 7.27 | 4.36 | 3.93 |
| Example 58 | ArF-34 | nBA-B | 6.83 | 4.10 | 4.51 |

TABLE 15

| Table 17-2 ([B: Defect count after removal]) | Resist used | Removal solvent (Removal solvent used in step X2) | ArF-[N]A [10 nm UPE] Defect count (defects/cm$^2$)) | ArF-[N]B [5 nm N + 1 nm U] Defect count (defects/cm$^2$)) | ArF-[N]C [Circulation filtration performed 15 times] (Defect count (defects/cm$^2$)) |
|---|---|---|---|---|---|
| Example 59 | ArF-35 | nBA-B | 7.98 | 3.19 | 2.87 |
| Example 60 | ArF-36 | nBA-B | 8.94 | 4.47 | 4.92 |
| Example 61 | ArF-37 | nBA-B | 6.07 | 3.64 | 4.01 |
| Example 62 | ArF-38 | nBA-A | 2.43 | 0.73 | 0.29 |
| Example 63 | ArF-39 | nBA-A | 2.55 | 0.77 | 0.38 |
| Example 64 | ArF-40 | nBA-A | 2.71 | 1.08 | 0.43 |
| Example 65 | ArF-41 | nBA-A | 3.18 | 0.95 | 0.29 |
| Example 66 | ArF-42 | nBA-A | 2.85 | 1.14 | 0.51 |
| Example 67 | ArF-43 | nBA-B | 4.33 | 3.03 | 3.34 |
| Example 68 | ArF-44 | nBA-B | 6.40 | 4.48 | 3.58 |
| Example 69 | ArF-45 | nBA-B | 5.39 | 4.85 | 4.95 |
| Example 70 | ArF-46 | nBA-B | 4.77 | 3.82 | 4.20 |
| Example 71 | ArF-47 | nBA-B | 6.16 | 4.93 | 3.94 |

TABLE 16

| Table 18-1 ([A: Defect count of resist]) | Removal solvent (Removal solvent used in step X2) | Target to be measured | ArF-[N]A [10 nm UPE] (Defect count (defects/cm$^2$)) | ArF-[N]B [5 nm N + 1 nm U] (Defect count (defects/cm$^2$)) | ArF-[N]C [Circulation filtration performed 15 times] (Defect count (defects/cm$^2$)) | Evaluation |
|---|---|---|---|---|---|---|
| Example 26 | nBA-A | 19 nm Defects | 2.17 | 0.18 | 0.07 | A |
| Example 27 | nBA-A | 19 nm Defects | 2.32 | 0.35 | 0.14 | A |
| Example 28 | nBA-A | 19 nm Defects | 2.21 | 0.21 | 0.06 | A |
| Example 29 | nBA-A | 19 nm Defects | 2.72 | 0.43 | 0.19 | A |
| Example 30 | nBA-A | 19 nm Defects | 2.69 | 0.49 | 0.16 | A |
| Example 31 | nBA-A | 19 nm Defects | 2.32 | 0.28 | 0.05 | A |
| Example 32 | nBA-A | 19 nm Defects | 2.53 | 0.23 | 0.07 | A |

TABLE 16-continued

| Table 18-1 ([A: Defect count of resist]) | Removal solvent (Removal solvent used in step X2) | Target to be measured | ArF-[N]A [10 nm UPE] (Defect count (defects/cm$^2$)) | ArF-[N]B [5 nm N + 1 nm U] (Defect count (defects/cm$^2$)) | ArF-[N]C [Circulation filtration performed 15 times] (Defect count (defects/cm$^2$)) | Evaluation |
|---|---|---|---|---|---|---|
| Example 33 | nBA-A | 19 nm Defects | 2.29 | 0.27 | 0.09 | A |
| Example 34 | nBA-A | 19 nm Defects | 2.54 | 0.40 | 0.17 | A |
| Example 35 | nBA-A | 19 nm Defects | 2.86 | 0.28 | 0.10 | A |
| Example 36 | nBA-A | 19 nm Defects | 2.95 | 0.27 | 0.09 | A |
| Example 37 | nBA-A | 19 nm Defects | 2.31 | 0.57 | 0.20 | A |
| Example 38 | nBA-A | 19 nm Defects | 1.89 | 0.30 | 0.11 | A |
| Example 39 | nBA-A | 19 nm Defects | 2.69 | 0.49 | 0.16 | A |
| Example 40 | nBA-A | 19 nm Defects | 2.53 | 0.23 | 0.07 | A |
| Example 41 | nBA-A | 19 nm Defects | 2.95 | 0.27 | 0.09 | A |
| Example 42 | nBA-B | 19 nm Defects | 2.29 | 0.92 | 1.24 | C |
| Example 43 | nBA-B | 19 nm Defects | 1.53 | 0.39 | 0.34 | B |
| Example 44 | nBA-B | 19 nm Defects | 3.96 | 1.46 | 1.84 | C |
| Example 45 | nBA-B | 19 nm Defects | 3.16 | 0.99 | 1.32 | C |
| Example 46 | nBA-B | 19 nm Defects | 3.60 | 1.25 | 1.60 | C |
| Example 47 | nBA-B | 19 nm Defects | 3.80 | 1.37 | 1.73 | C |
| Example 48 | nBA-B | 19 nm Defects | 2.35 | 0.50 | 0.36 | B |
| Example 49 | nBA-B | 19 nm Defects | 5.71 | 0.92 | 0.60 | B |
| Example 50 | nBA-B | 19 nm Defects | 6.67 | 2.20 | 2.64 | C |
| Example 51 | nBA-B | 19 nm Defects | 4.12 | 1.57 | 1.95 | C |
| Example 52 | nBA-B | 19 nm Defects | 5.94 | 1.83 | 1.42 | B |
| Example 53 | nBA-B | 19 nm Defects | 3.64 | 0.68 | 0.39 | B |
| Example 54 | nBA-B | 19 nm Defects | 4.64 | 1.18 | 1.53 | C |
| Example 55 | nBA-B | 19 nm Defects | 5.11 | 1.42 | 1.05 | B |
| Example 56 | nBA-B | 19 nm Defects | 3.63 | 1.27 | 1.63 | C |
| Example 57 | nBA-B | 19 nm Defects | 5.00 | 2.09 | 1.65 | B |
| Example 58 | nBA-B | 19 nm Defects | 4.56 | 1.83 | 2.24 | C |

TABLE 17

| Table 18-2 ([A: Defect count of resist]) | Removal solvent (Removal solvent used in step X2) | Target to be measured | ArF-[N]A [10 nm UPE] (Defect count (defects/cm$^2$)) | ArF-[N]B [5 nm N + 1 nm U] (Defect count (defects/cm$^2$)) | ArF-[N]C [Circulation filtration performed 15 times] (Defect count (defects/cm$^2$)) | Evaluation |
|---|---|---|---|---|---|---|
| Example 59 | nBA-B | 19 nm Defects | 5.71 | 0.92 | 0.60 | B |
| Example 60 | nBA-B | 19 nm Defects | 6.67 | 2.20 | 2.64 | C |
| Example 61 | nBA-B | 19 nm Defects | 3.80 | 1.37 | 1.73 | C |
| Example 62 | nBA-A | 19 nm Defects | 2.26 | 0.56 | 0.12 | A |
| Example 63 | nBA-A | 19 nm Defects | 2.38 | 0.59 | 0.21 | A |
| Example 64 | nBA-A | 19 nm Defects | 2.54 | 0.91 | 0.26 | A |
| Example 65 | nBA-A | 19 nm Defects | 3.01 | 0.78 | 0.12 | A |
| Example 66 | nBA-A | 19 nm Defects | 2.68 | 0.97 | 0.34 | A |
| Example 67 | nBA-B | 19 nm Defects | 2.06 | 0.76 | 1.06 | C |
| Example 68 | nBA-B | 19 nm Defects | 4.12 | 2.21 | 1.31 | B |
| Example 69 | nBA-B | 19 nm Defects | 3.12 | 2.58 | 2.68 | C |
| Example 70 | nBA-B | 19 nm Defects | 2.50 | 1.55 | 1.93 | C |
| Example 71 | nBA-B | 19 nm Defects | 3.89 | 2.66 | 1.67 | B |

From the results in Tables 17 and 18, it is clear that the present inspection method can also be applied to various resist compositions for ArF exposure applications.

[Preparation of Resist Composition (for EUV)]

[Preparation of Resist Composition EUV-[N]]

As the resist composition, the following resist composition EUV-[N] was prepared. Here, [N] represents a number from 2 to 21. That is, it is intended that the resist compositions EUV-2 to EUV-21 were prepared.

In addition, three types of resist compositions, EUV-[N] A, EUV-[N]B, and EUV-[N]C, were prepared by subjecting the prepared resist composition EUV-[N] prepared by the following procedure to different three types of filtration treatments, as shown in the latter section.

Therefore, for example, in a case where [N] is 2, it is intended to subject the resist composition EUV-2 to different filtration treatments to prepare three different types of resist compositions, EUV-2A, EUV-2B, and EUV-2C.

The compositions of the resist composition EUV-[N] ([N]: 2 to 21) are shown in Tables 19 and 20. The type of each component constituting the resist composition EUV-[N] ([N]: 2 to 21) is shown in Table 19, and the content (% by mass) of each component shown in Table 19 in the composition is shown in Table 20. Furthermore, in Table 20, the content of a component other than the solvent is intended to be a content (% by mass) with respect to the total solid content of the composition. In addition, the "Concentration (% by mass) of solid contents" in Table 20 is intended to be a content of a component other than the solvent with respect to the total mass of the composition. In addition, the numerical values in the "Solvent (mass ratio)" column in Table 20 correspond in order from the left of the solvents listed in the "Solvent" column in Table 19. Moreover, the film thickness (nm) in Table 20 indicates a film thickness of a resist film (coating film) formed in a case of carrying out [Formation of Resist Film (Corresponding to Step X1)] in the inspection on the resist composition in Examples 72 to 91 which will be described later.

TABLE 18

| | Blended components in resist composition EUV-[N] | | | | |
|---|---|---|---|---|---|
| Table 19 | Acid-decomposable resin | Photoacid generator | Quencher | Hydrophobic resin | Surfactant |
| EUV-2 | E-2 | F-22/F-23 | C-14 | E-9 | F-1/F-2 |
| EUV-3 | E-3 | F-29 | C-15 | | F-1/F-8 |
| EUV-4 | E-4 | F-25 | C-13 | | F-1/F-2 |
| EUV-5 | E-5 | F-26 | C-14 | E-1 | F-1/F-2 |
| EUV-6 | E-6 | F-19 | C-12 | | F-1/F-2 |
| EUV-7 | E-7 | F-30 | C-20 | | F-1/F-2 |
| EUV-8 | E-8 | F-32/F-36 | | E-10 | F-1/F-2/F-8 |
| EUV-9 | E-9 | F-34 | C-19 | | F-1/F-2/F-7 |
| EUV-10 | E-10 | F-36/F-37 | C-16 | | F-1/F-2 |
| EUV-11 | E-11 | F-21 | C-12 | | F-1/F-2/F-7 |
| EUV-12 | E-12 | F-20 | C-17 | | F-1/F-2 |
| EUV-13 | E-13 | | C-14 | | F-1/F-4 |
| EUV-14 | E-14 | F-31/F-35 | C-18 | | F-1/F-2/F-8 |
| EUV-15 | E-15 | F-28 | C-13 | | F-1/F-2/F-8 |
| EUV-16 | E-16 | F-27 | C-16 | | F-1/F-2 |
| EUV-17 | E-17 | F-30 | C-18 | E-7 | F-1/F-2/F-7 |
| EUV-18 | E-18 | F-33 | | | F-1/F-2 |
| EUV-19 | E-19 | F-38 | C-20 | | F-1/F-8 |
| EUV-20 | E-20 | F-21 | C-12 | | F-1/F-2 |
| EUV-21 | E-21 | F-24 | C-14 | | F-1/F-2 |

[Each Component in Tables 19 and 20]

Hereinafter, each component in Tables 19 and 20 will be shown.

<Acid-Decomposable Resin>

The structures of the acid-decomposable resins E-2 to E-21 shown in Tables 19 and 20 are shown below. In addition, the compositional ratio (molar ratio %; corresponding in order from the left), the weight-average molecular weight (Mw), and the dispersity (Mw/Mn) of each repeating unit of the resins E-2 to E-21 are shown in Table 21.

E-2

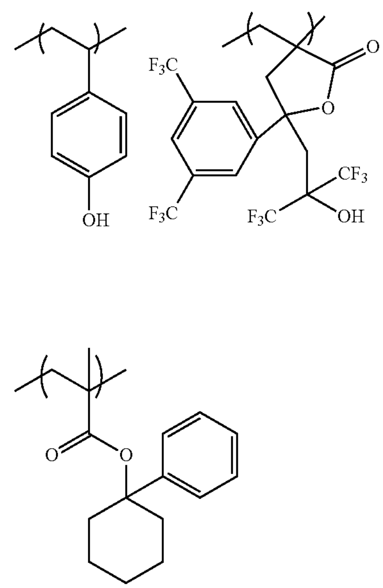

TABLE 19

| | Concentration | Content (% by mass) with respect to total solid contents | | | | | Film |
|---|---|---|---|---|---|---|---|
| Table 20 | (% by mass) of solid contents | Acid-decomposable resin | Photoacid generator | Quencher | Hydrophobic resin | Solvent (mass ratio) | thickness (nm) |
| EUV-2 | 2.5 | 69.0 | 10.0/10.0 | 10.0 | 1.0 | 60/40 | 50 |
| EUV-3 | 2.0 | 85.0 | 10.0 | 5.0 | | 90/10 | 40 |
| EUV-4 | 2.5 | 75.0 | 20.0 | 5.0 | | 80/20 | 50 |
| EUV-5 | 2.0 | 74.1 | 20.0 | 5.0 | 0.9 | 70/30 | 40 |
| EUV-6 | 3.0 | 77.0 | 15.0 | 8.0 | | 60/40 | 60 |
| EUV-7 | 2.0 | 82.0 | 12.0 | 6.0 | | 60/40 | 40 |
| EUV-8 | 2.5 | 58.5 | 15.0/25.0 | | 1.5 | 72/25/3 | 50 |
| EUV-9 | 1.5 | 75.0 | 20.0 | 5.0 | | 60/20/20 | 30 |
| EUV-10 | 2.0 | 68.0 | 15.0/15.0 | 2.0 | | 60/40 | 40 |
| EUV-11 | 1.5 | 71.0 | 24.0 | 5.0 | | 25/25/50 | 30 |
| EUV-12 | 2.5 | 82.0 | 15.0 | 3.0 | | 60/40 | 50 |
| EUV-13 | 2.5 | 96.0 | | 4.0 | | 60/40 | 50 |
| EUV-14 | 2.0 | 70.0 | 8.0/20.0 | 2.0 | | 80/10/10 | 40 |
| EUV-15 | 2.5 | 70.0 | 25.0 | 5.0 | | 80/10/10 | 50 |
| EUV-16 | 2.0 | 76.0 | 20.0 | 4.0 | | 80/20 | 40 |
| EUV-17 | 1.8 | 72.8 | 17.0 | 8.0 | 2.2 | 20/20/60 | 35 |
| EUV-18 | 3.0 | 80.0 | 20.0 | | | 60/40 | 60 |
| EUV-19 | 2.5 | 67.0 | 30.0 | 3.0 | | 95/5 | 50 |
| EUV-20 | 1.8 | 72.0 | 20.0 | 8.0 | | 80/20 | 35 |
| EUV-21 | 1.5 | 70.0 | 25.0 | 5.0 | | 70/30 | 30 |

-continued
E-3
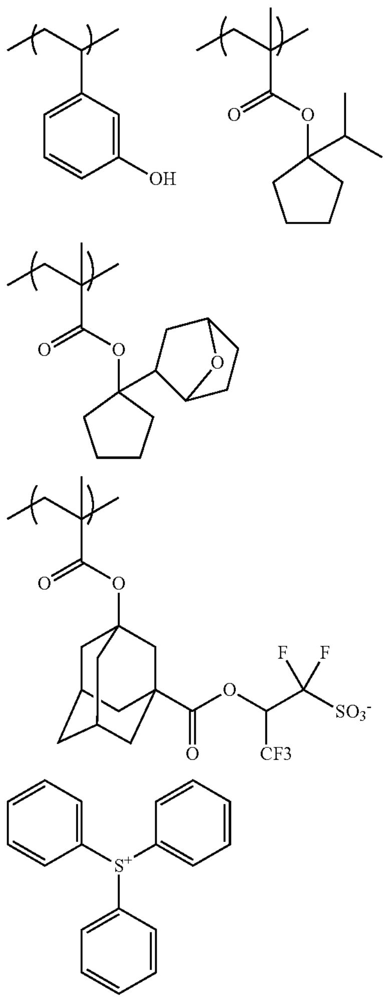
E-4
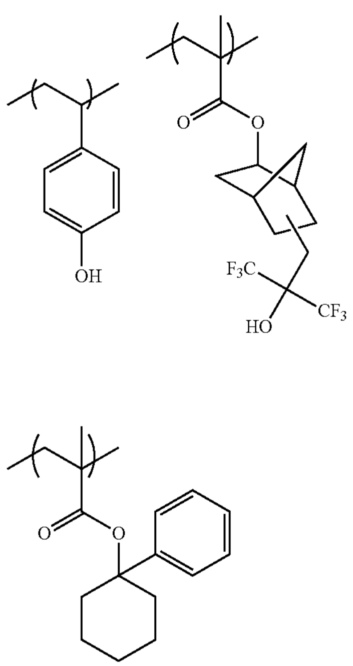
-continued
E-5
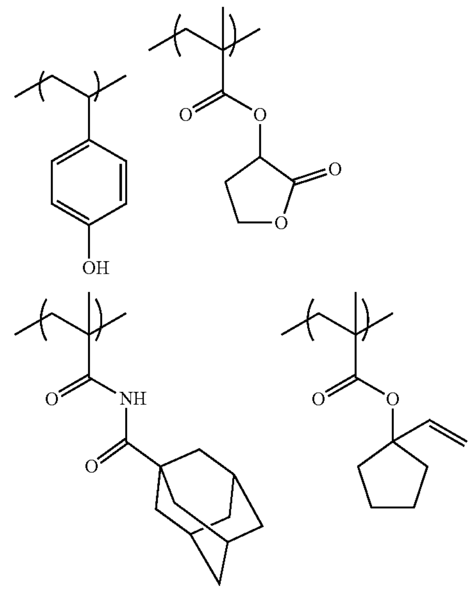
E-6
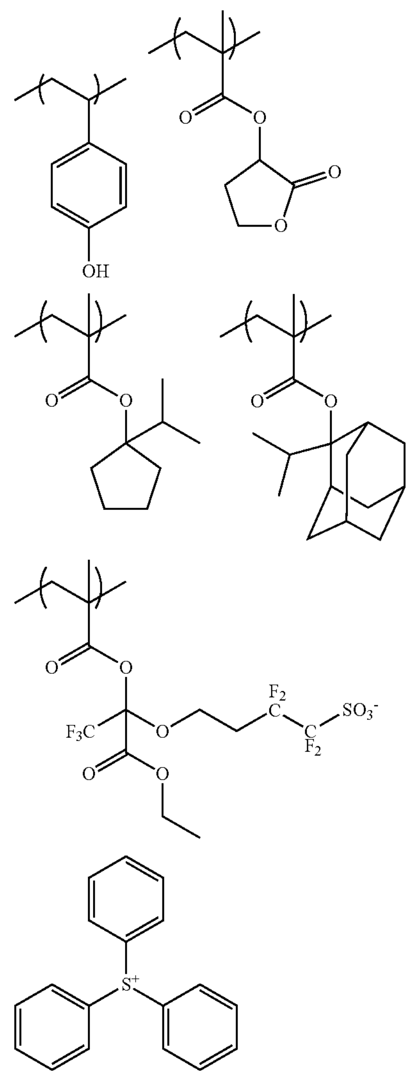

-continued
E-7
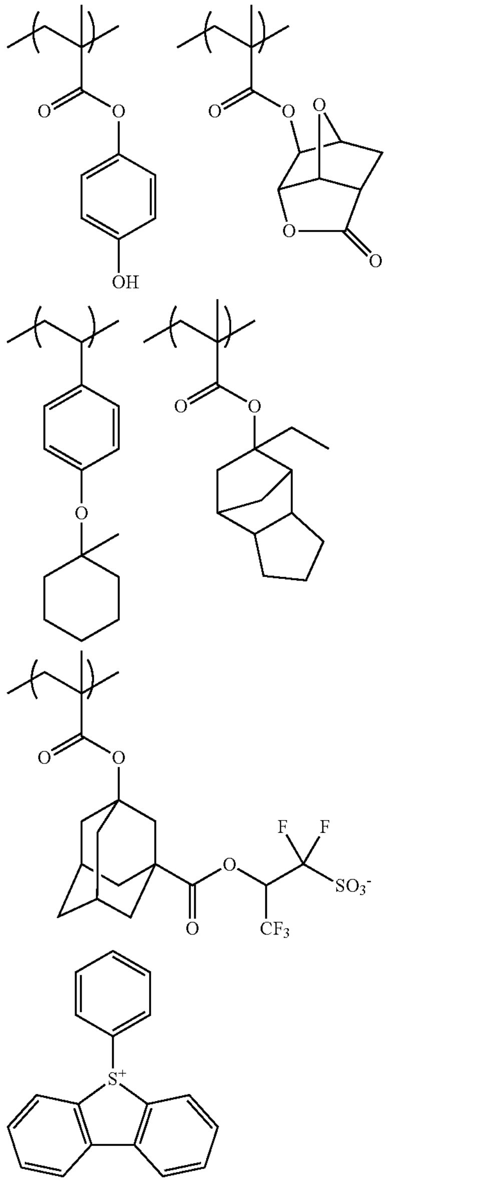
E-8
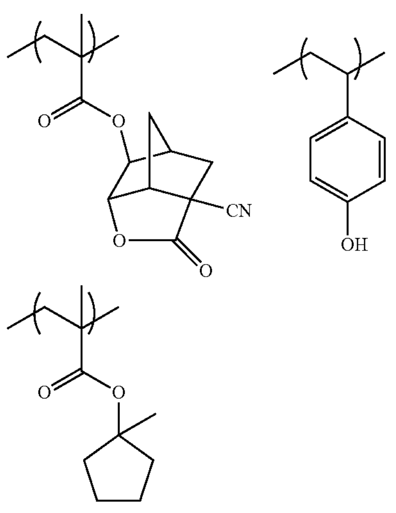
-continued
E-9
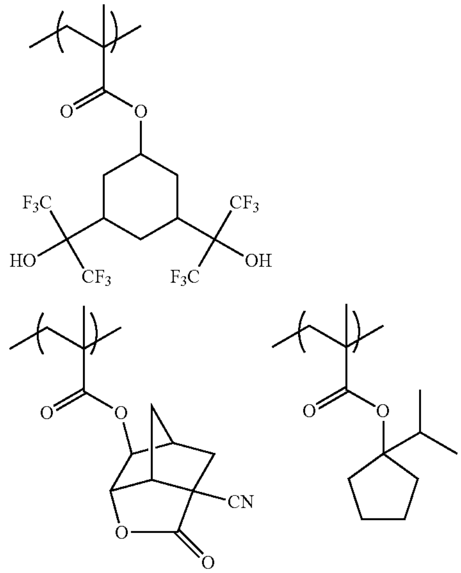
E-10
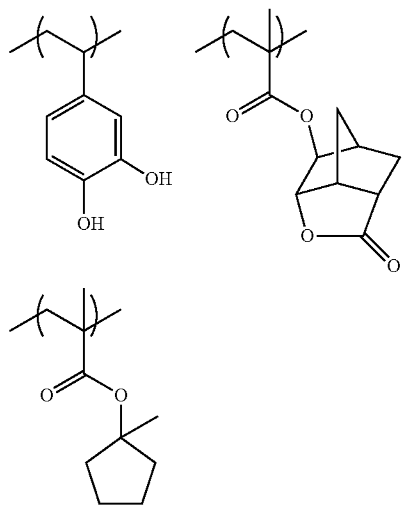
E-11
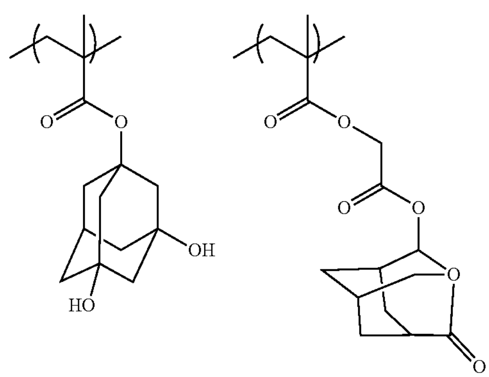

-continued
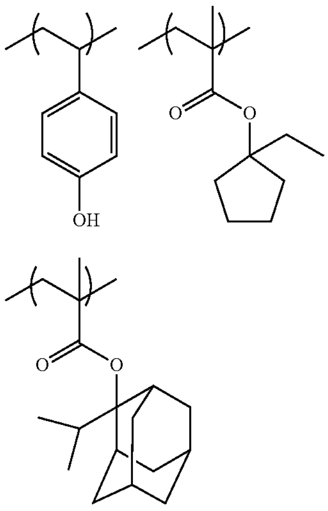
E-12
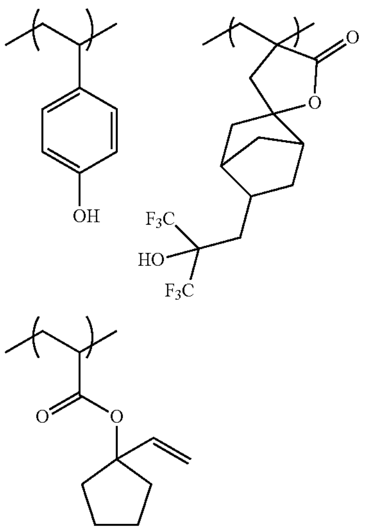
E-13
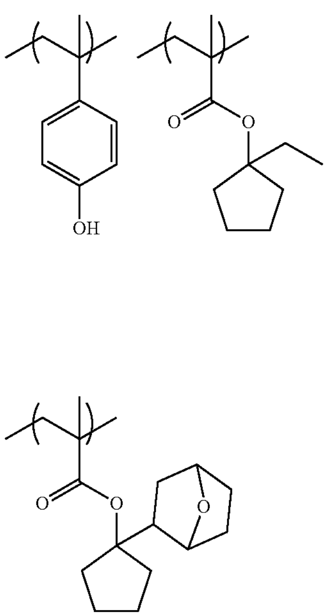
-continued
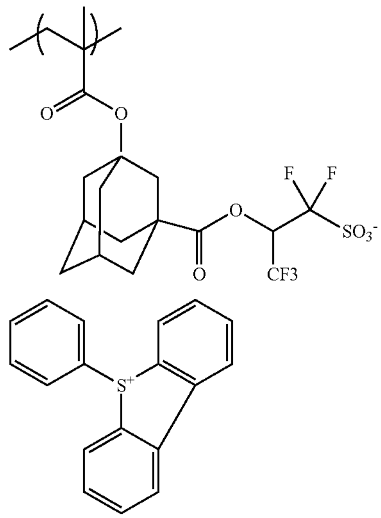
E-14
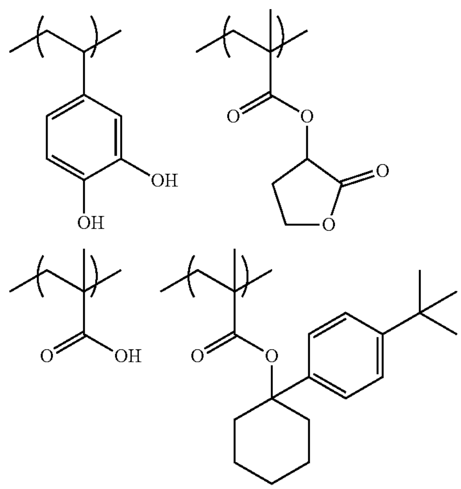
E-15
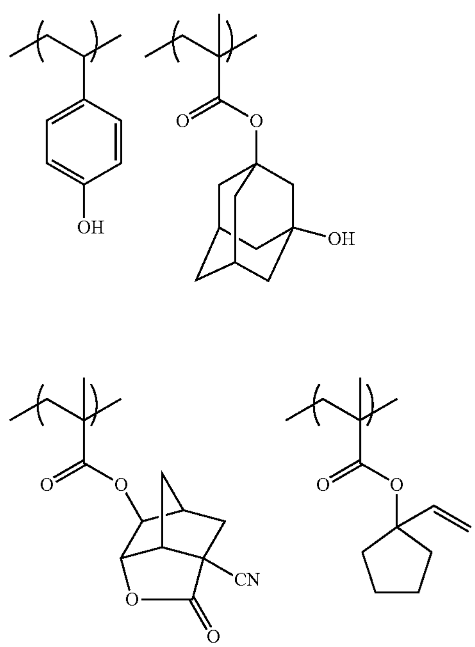

-continued
E-16
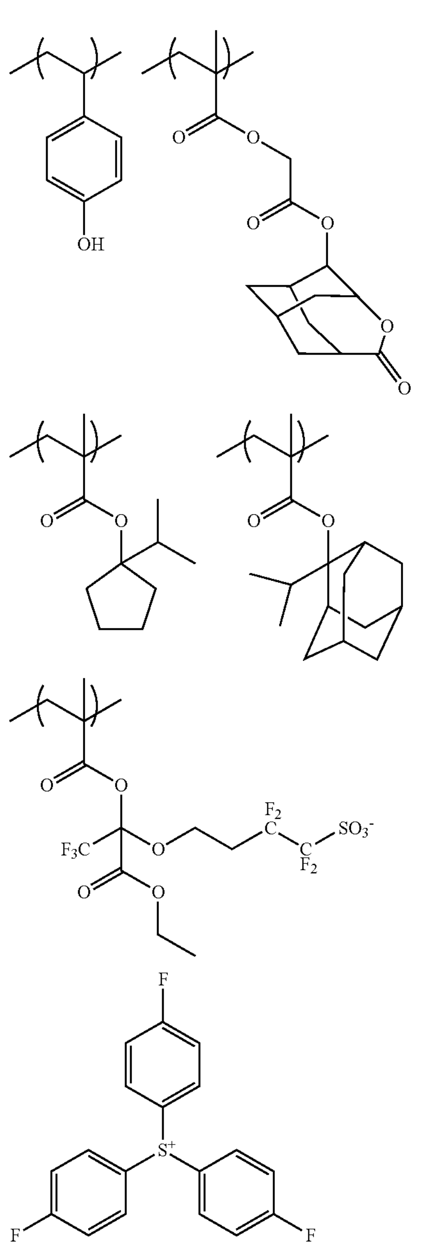
E-17
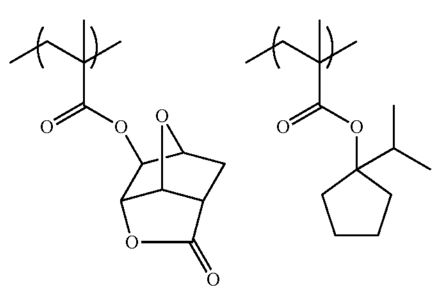
-continued
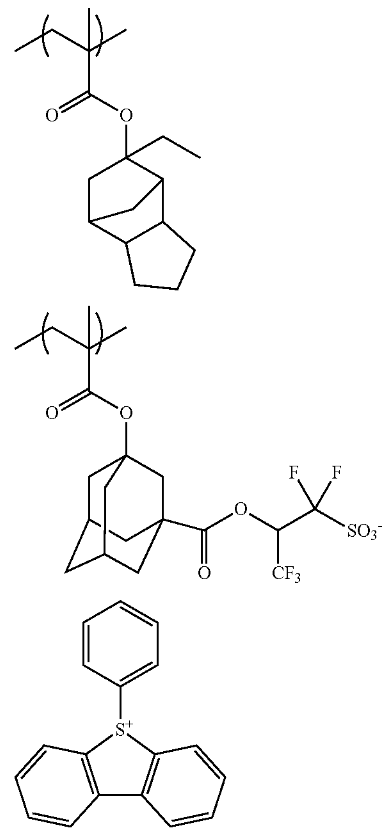
E-18
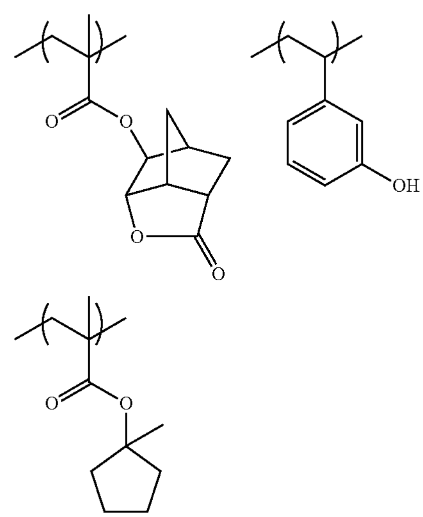
E-19
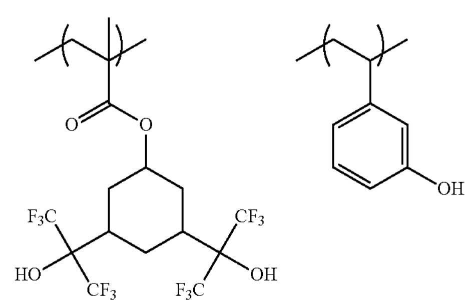

-continued
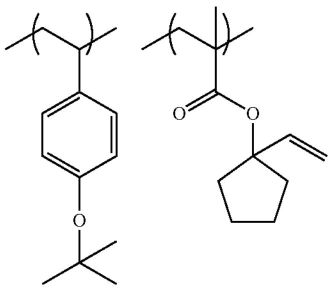
E-20
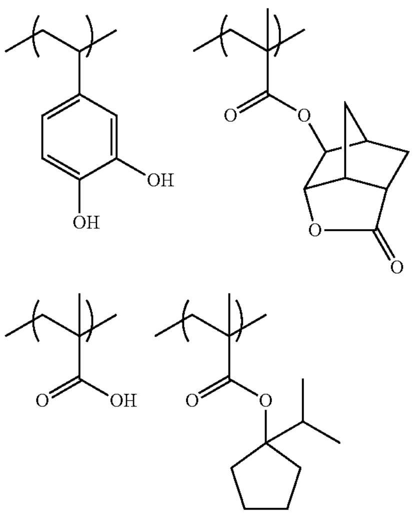
E-21
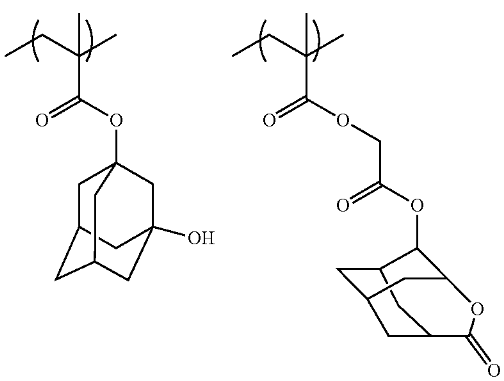
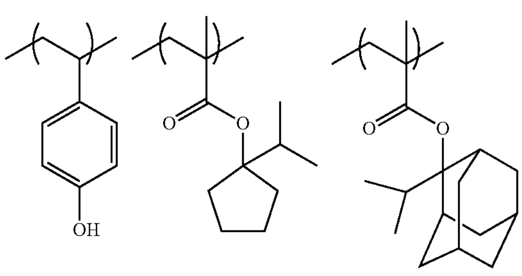
TABLE 20
| Table 21 | | | |
|---|---|---|---|
| Resin | Composition (% by mole) | Weight-average molecular weight (Mw) | Dispersity |
| E-2 | 30/20/50 | 8000 | 1.6 |
| E-3 | 40/30/25/5 | 6500 | 1.5 |
| E-4 | 25/20/55 | 5500 | 1.4 |
| E-5 | 20/30/5/45 | 6000 | 1.5 |
| E-6 | 25/15/15/40/5 | 8000 | 1.7 |
| E-7 | 15/20/25/35/5 | 12000 | 1.8 |
| E-8 | 20/20/60 | 6000 | 1.4 |
| E-9 | 20/30/50 | 4500 | 1.4 |
| E-10 | 20/20/60 | 8000 | 1.5 |
| E-11 | 5/15/25/25/30 | 12000 | 1.7 |
| E-12 | 20/20/60 | 6000 | 1.5 |
| E-13 | 30/20/45/5 | 6000 | 1.5 |
| E-14 | 20/20/10/50 | 9000 | 1.6 |
| E-15 | 35/5/10/50 | 12000 | 1.8 |
| E-16 | 20/20/30/27/3 | 6000 | 1.4 |
| E-17 | 40/30/25/5 | 4500 | 1.4 |
| E-18 | 20/35/45 | 8000 | 1.5 |
| E-19 | 10/30/30/30 | 12000 | 1.7 |
| E-20 | 15/15/10/60 | 6000 | 1.5 |
| E-21 | 10/20/10/30/30 | 9000 | 1.6 |
<Photoacid Generator>
The structures of the photoacid generators F-19 to F-38 shown in Tables 19 and 20 are shown below.
F-19
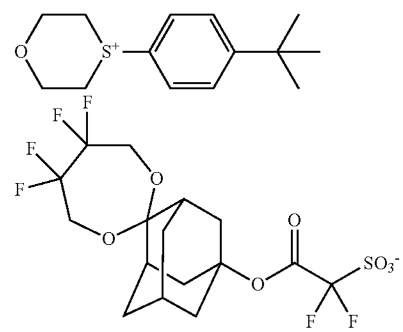
F-20
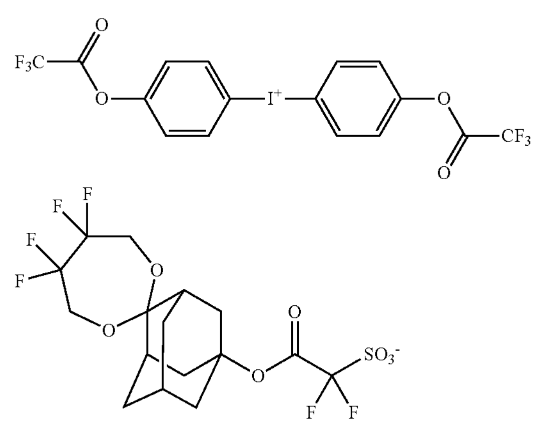

-continued
F-21
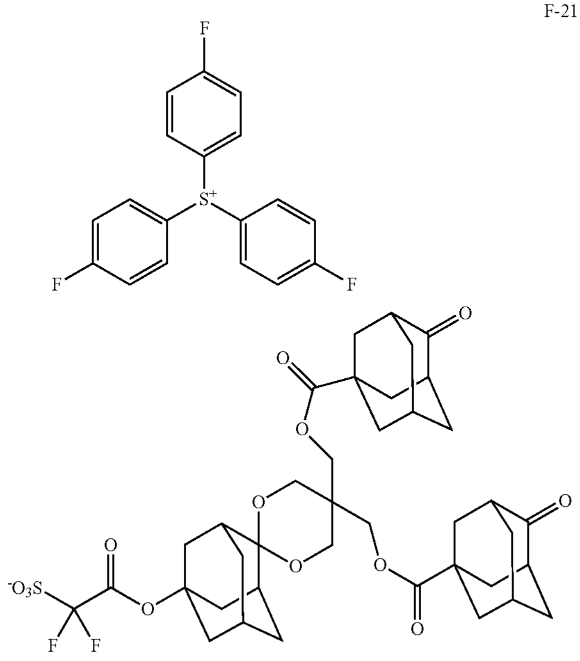
F-22
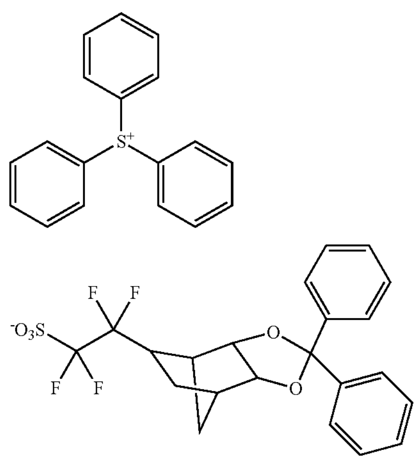
F-23
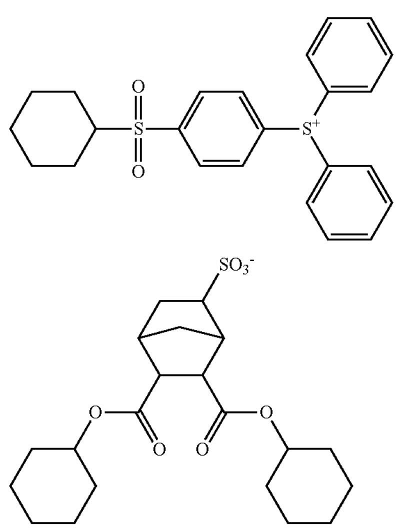
-continued
F-24
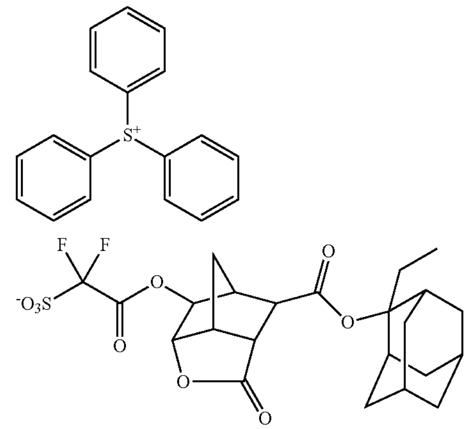
F-25
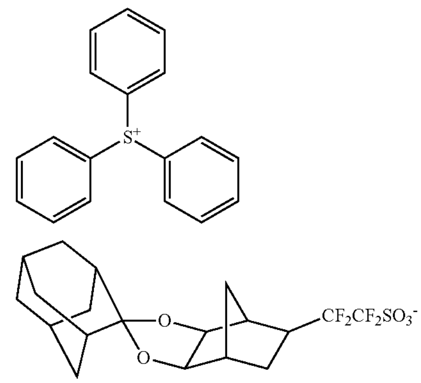
F-26
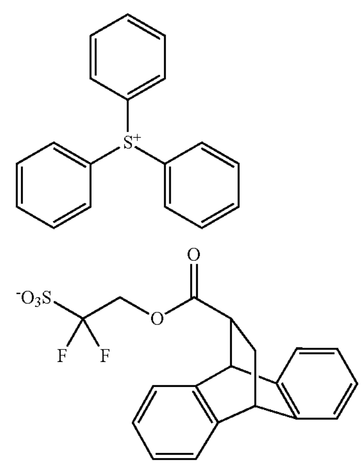
F-27
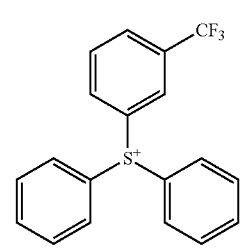

-continued
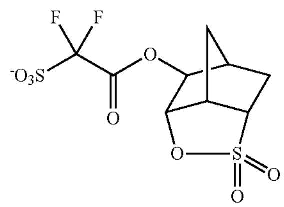
F-28
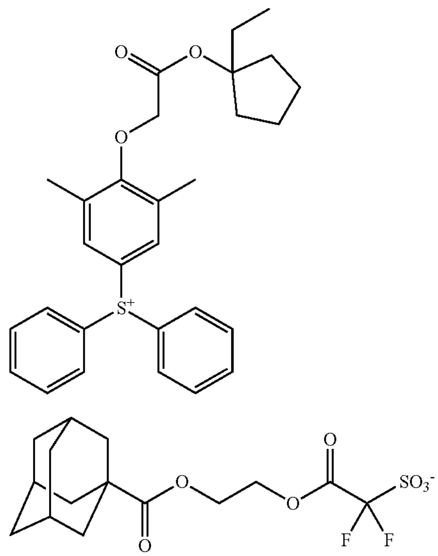
F-29
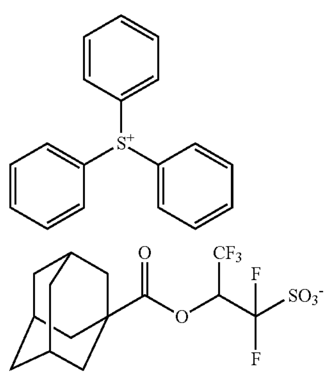
F-30
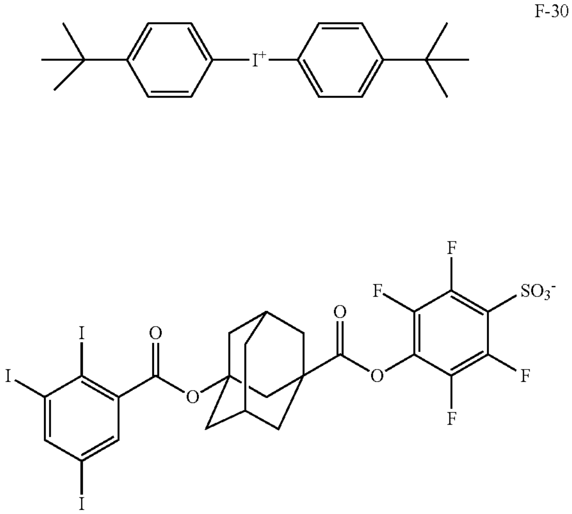
-continued
F-31
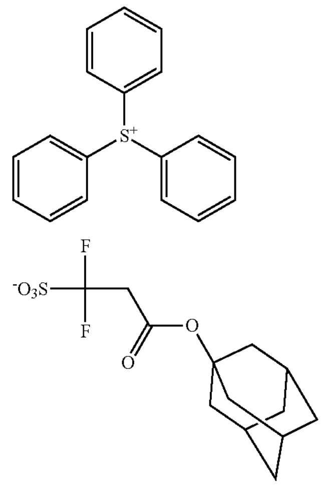
F-32
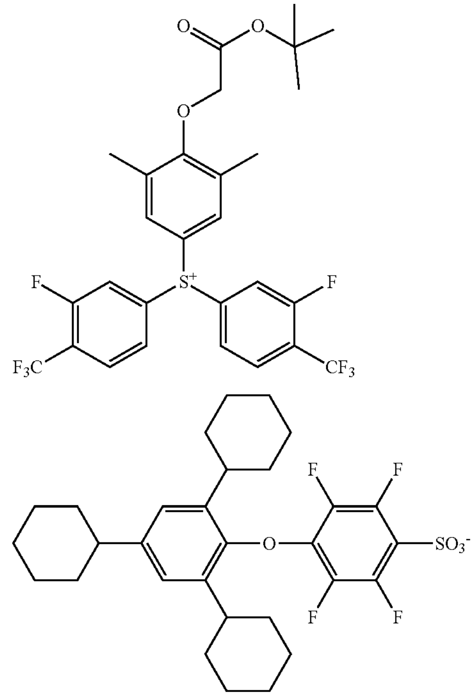
F-33
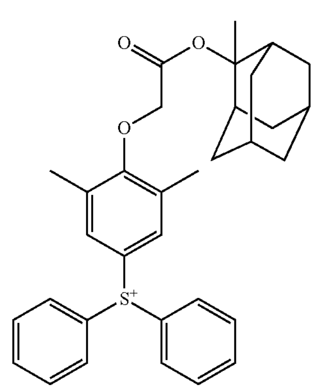

-continued
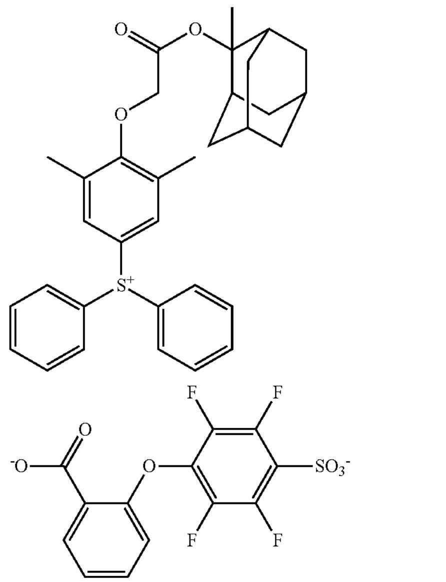
F-34
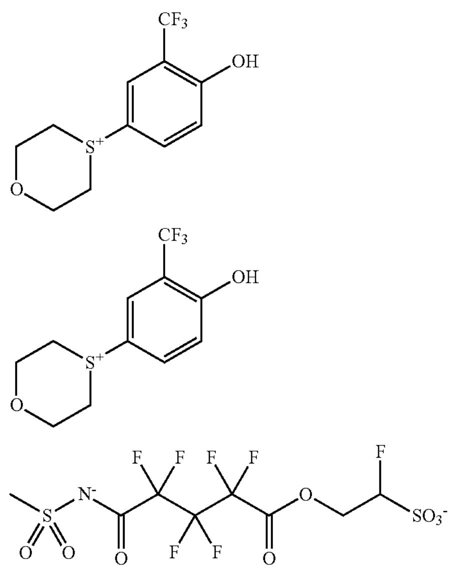
F-35
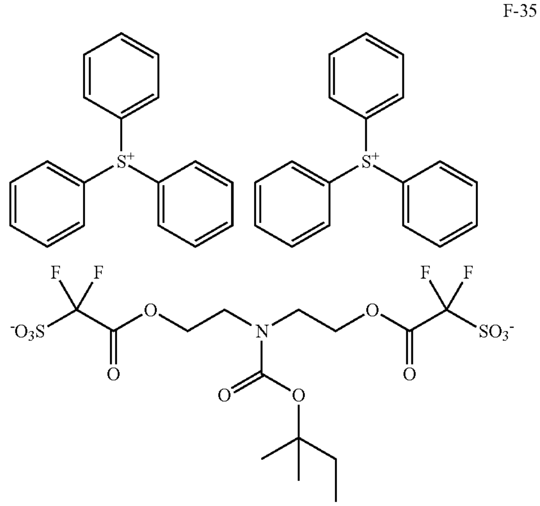
-continued
F-36
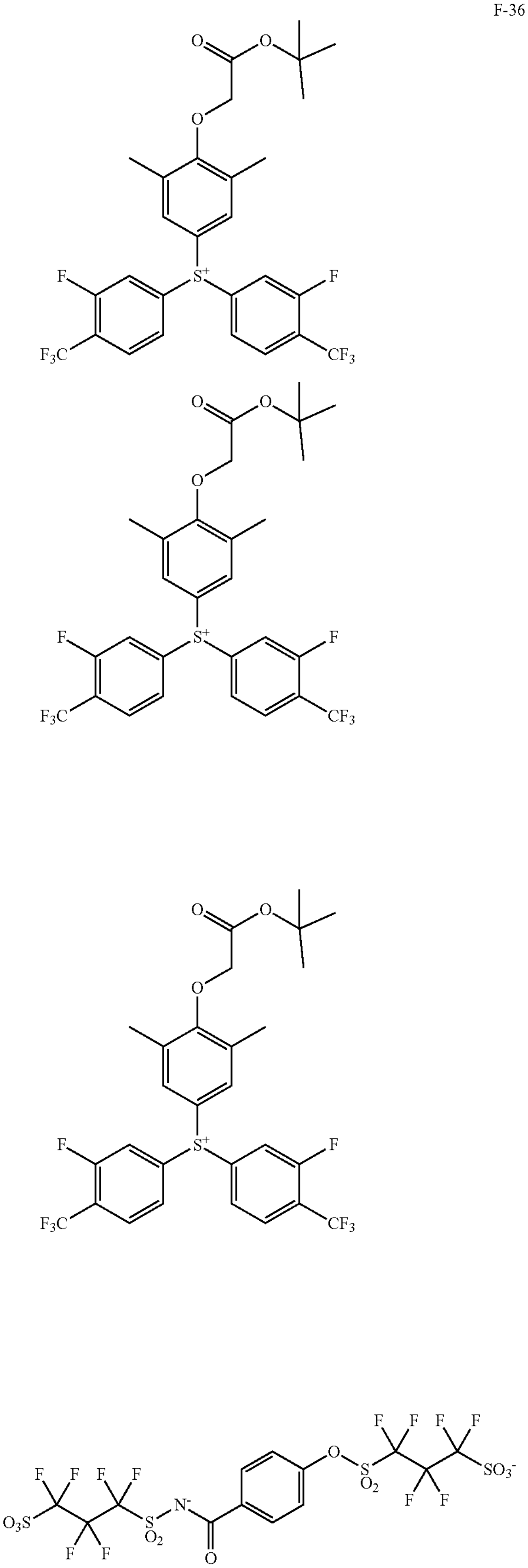

-continued
F-37
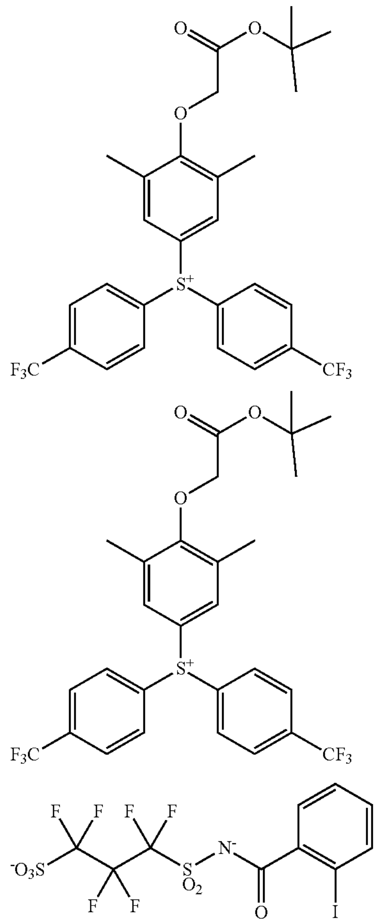
F-38
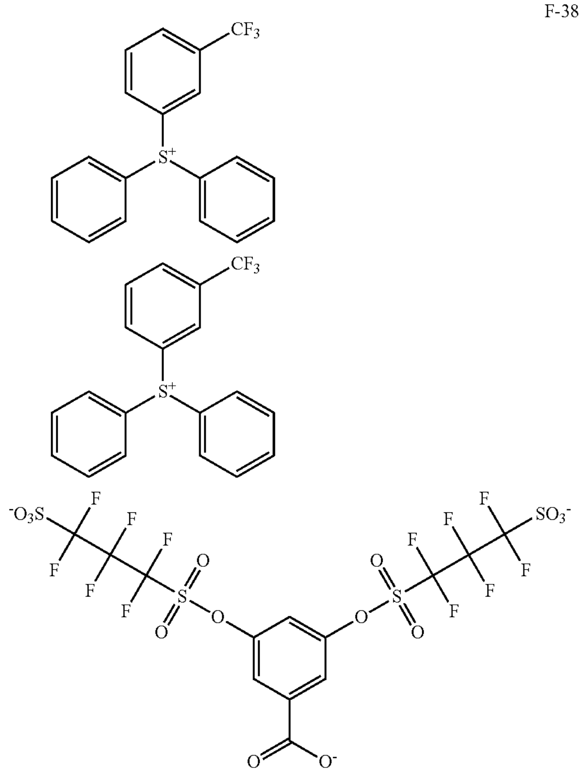
-continued
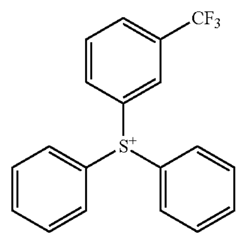
<Quencher>
The structures of the quenchers C-12 to C-20 shown in Tables 19 and 20 are shown below.
C-12
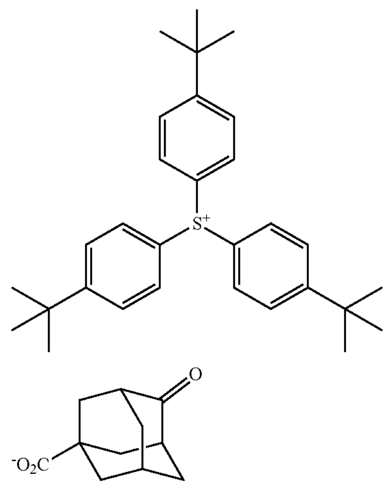
C-13
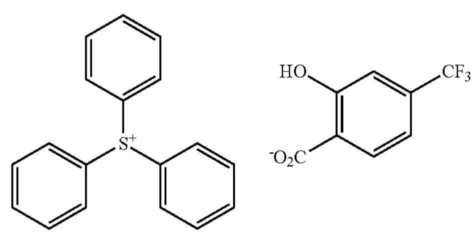
C-14
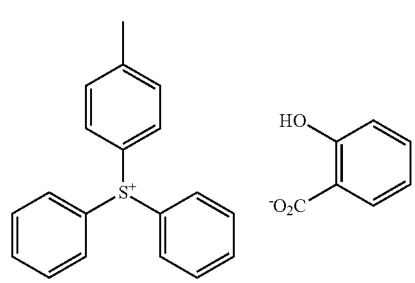
C-15
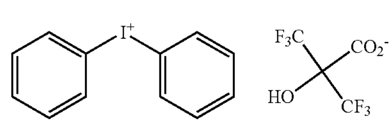

-continued

C-16

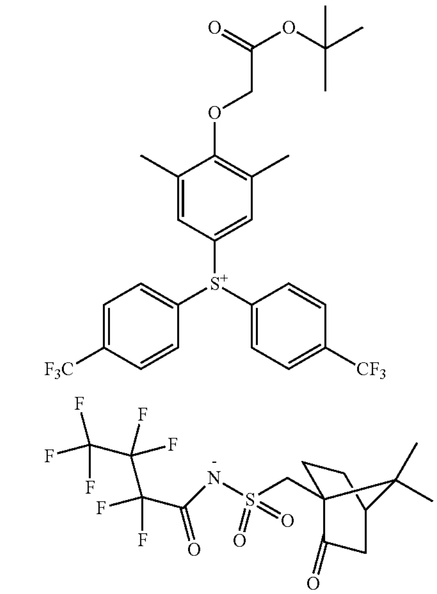

C-17

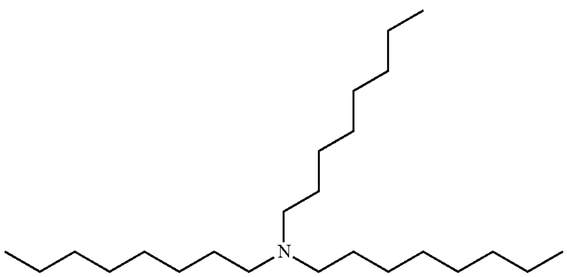

C-18

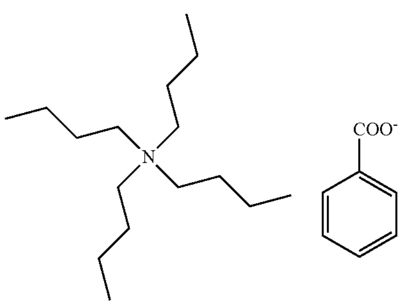

C-19

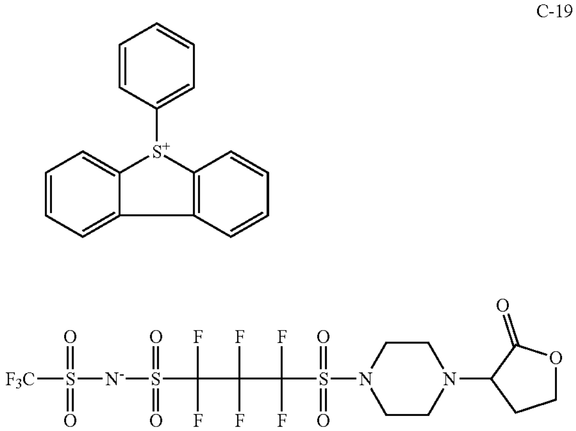

-continued

C-20

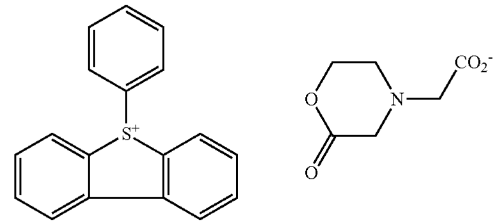

<Hydrophobic Resin>

The structures of the hydrophobic resins shown in Tables 19 and 20 are shown in Table 16 described above.

<Solvent>

The solvents F-1, F-2, F-4, F-7, and F-8 shown in Tables 19 and 20 are shown below.

F-1: Propylene glycol monomethyl ether acetate (PGMEA)

F-2: Propylene glycol monomethyl ether (PGME)

F-4: Cyclohexanone

F-7: Ethyl lactate

F-8: γ-Butyrolactone

[Filtration of Resist Solution]

In addition, three types of resist compositions, EUV-[N]A, EUV-[N]B, and EUV-[N]C, were prepared by subjecting the prepared resist composition EUV-[N] (N: 2 to 21) to different three types of filtration treatments shown below.

That is, EUV-2A to EUV-21A, EUV-2B to EUV-21B, and EUV-2C to EUV-21C were prepared.

(Resist Composition EUV-[N]A)

12,000 g of the resist composition EUV-[N] was filtered through a nylon filter with a pore size of 20 nm, manufactured by PALL Corporation, to obtain a resist composition EUV-[N]A.

(Resist Composition EUV-[N]B)

12,000 g of the resist composition EUV-[N] was filtered through the following two-stage filter to obtain a resist composition EUV-[N]B.

First stage: Azora photochemical filter manufactured by Entegris

Second stage: Polyethylene filter with a pore size of 1 nm, manufactured by Entegris (Resist Composition EUV-[N]C)

12,000 g of the resist composition EUV-[N] was circulation-filtered 30 times with the following three-stage filter to obtain a resist composition EUV-[N]C (incidentally, the circulation filtration performed 30 times means that the flow rate was measured and the number of passages of an amount 30 times the input amount of 12,000 g was 30).

First stage: Nylon filter with a pore size of 2 nm, manufactured by PALL Corporation Second stage: Azora photochemical filter manufactured by Entegris Third stage: Pore size 1 nm, manufactured by Entegris

[Inspection of Resist Composition: Examples 72 to 91]

Inspection of the resist compositions (Examples 72 to 91) and evaluation thereof were carried out by the same procedure as described in [Inspection of Resist Composition: Examples 17 to 23], except that in a case where the resist compositions EUV-1A to EUV-1C were changed to the resist compositions EUV-[N]A to EUV-[N]C and the film thickness of a resist film (coating film) formed in a case of carrying out [Formation of Resist Film (Corresponding to Step X1)] was changed to a film thickness shown in Table 20 (for example, in a case where the resist used is EUV-2, the film thickness of the resist film (coating film) in [Formation of Resist Film (Corresponding to Step X1)] of a filtered resist composition (EUV-2A, EUV-2B, or EUV-2C) derived from EUV-2 is 50 nm.). The results of [B: Defect count after the removal] are shown in Table 22 and the results of [A: Defect count of resist] are shown in Table 23. In addition, the removal solvents (PGMEA-A, CyHx-A, PP3/7-A, and nBA-A) shown in Examples 72 to 91 were the same as the removal solvent (PGMEA-A, CyHx-A, PP3/7-A, and nBA-A) described in [Inspection of Resist Composition: Examples 1 to 11] mentioned above, respectively.

TABLE 21

| Table 22 ([B: Defect count after removal]) | Resist used | Removal solvent (Removal solvent used in step X2) | EUV-[N]A [20 nm Nylon] (Defect count (defects/cm$^2$)) | EUV-[N]B [Azora + 1 nm U] (Defect count (defects/cm$^2$)) | EUV-[N]C [Circulation filtration performed 30 times] (Defect count (defects/cm$^2$)) |
|---|---|---|---|---|---|
| Example 72 | EUV-2 | PGMEA-A | 2.42 | 0.36 | 0.25 |
| Example 73 | EUV-3 | CyHx-A | 2.05 | 0.43 | 0.26 |
| Example 74 | EUV-4 | PP3/7-A | 2.73 | 0.44 | 0.26 |
| Example 75 | EUV-5 | CyHx-A | 2.88 | 0.60 | 0.36 |
| Example 76 | EUV-6 | CyHx-A | 2.80 | 0.64 | 0.32 |
| Example 77 | EUV-7 | CyHx-A | 2.50 | 0.45 | 0.23 |
| Example 78 | EUV-8 | PGMEA-A | 2.58 | 0.59 | 0.36 |
| Example 79 | EUV-9 | PGMEA-A | 2.42 | 0.44 | 0.26 |
| Example 80 | EUV-10 | nBA-A | 2.73 | 0.57 | 0.34 |
| Example 81 | EUV-11 | nBA-A | 3.03 | 0.45 | 0.27 |
| Example 82 | EUV-12 | PP3/7-A | 3.03 | 0.42 | 0.25 |
| Example 83 | EUV-13 | PP3/7-A | 2.73 | 0.82 | 0.41 |
| Example 84 | EUV-14 | PP3/7-A | 2.42 | 0.56 | 0.33 |
| Example 85 | EUV-15 | CyHx-A | 2.27 | 0.52 | 0.26 |
| Example 86 | EUV-16 | CyHx-A | 2.73 | 0.41 | 0.25 |
| Example 87 | EUV-17 | PGMEA-A | 2.88 | 0.40 | 0.24 |
| Example 88 | EUV-18 | PGMEA-A | 3.03 | 0.61 | 0.30 |
| Example 89 | EUV-19 | nBA-A | 3.03 | 0.61 | 0.30 |
| Example 90 | EUV-20 | nBA-A | 2.27 | 0.45 | 0.23 |
| Example 91 | EUV-21 | nBA-A | 2.65 | 0.40 | 0.20 |

TABLE 22

| Table 23 ([A: Defect count of resist) | Removal solvent (Removal solvent used in step X2) | Target to be measured | EUV-[N]A [20 nm Nylon] (Defect count (defects/cm$^2$)) | EUV-[N]B [Azora + 1 nm U] (Defect count (defects/cm$^2$)) | EUV-[N]C [Circulation filtration performed 30 times] (Defect count (defects/cm$^2$)) | Evaluation |
|---|---|---|---|---|---|---|
| Example 72 | PGMEA-A | 19 nm Defects | 2.20 | 0.14 | 0.03 | A |
| Example 73 | CyHx-A | 19 nm Defects | 1.89 | 0.27 | 0.10 | A |
| Example 74 | PP3/7-A | 19 nm Defects | 2.52 | 0.23 | 0.05 | A |
| Example 75 | CyHx-A | 19 nm Defects | 2.72 | 0.45 | 0.20 | A |
| Example 76 | CyHx-A | 19 nm Defects | 2.64 | 0.49 | 0.16 | A |
| Example 77 | CyHx-A | 19 nm Defects | 2.34 | 0.29 | 0.07 | A |
| Example 78 | PGMEA-A | 19 nm Defects | 2.35 | 0.37 | 0.13 | A |
| Example 79 | PGMEA-A | 19 nm Defects | 2.20 | 0.22 | 0.04 | A |
| Example 80 | nBA-A | 19 nm Defects | 2.56 | 0.40 | 0.17 | A |
| Example 81 | nBA-A | 19 nm Defects | 2.86 | 0.28 | 0.10 | A |
| Example 82 | PP3/7-A | 19 nm Defects | 2.82 | 0.21 | 0.04 | A |
| Example 83 | PP3/7-A | 19 nm Defects | 2.52 | 0.61 | 0.20 | A |
| Example 84 | PP3/7-A | 19 nm Defects | 2.21 | 0.35 | 0.12 | A |
| Example 85 | CyHx-A | 19 nm Defects | 2.11 | 0.36 | 0.10 | A |
| Example 86 | CyHx-A | 19 nm Defects | 2.57 | 0.25 | 0.09 | A |
| Example 87 | PGMEA-A | 19 nm Defects | 2.66 | 0.18 | 0.02 | A |
| Example 88 | PGMEA-A | 19 nm Defects | 2.81 | 0.38 | 0.08 | A |
| Example 89 | nBA-A | 19 nm Defects | 2.86 | 0.43 | 0.13 | A |
| Example 90 | nBA-A | 19 nm Defects | 2.10 | 0.28 | 0.06 | A |
| Example 91 | nBA-A | 19 nm Defects | 2.48 | 0.23 | 0.03 | A |

From the results in Tables 22 and 23, it is clear that the present inspection method can be applied to various resist compositions for EUV exposure applications.

What is claimed is:

1. An inspection method for a composition selected from the group consisting of an actinic ray-sensitive or radiation-sensitive composition and a thermosetting composition, the inspection method comprising:

a step X1 of applying the composition onto a substrate X to form a coating film;

a step X2 of removing the coating film from the substrate X using a removal solvent including an organic solvent; and a step X3 of measuring the number of defects on the substrate X after the removal of the coating film, using a defect inspection device, wherein in a case where the composition is the actinic ray-sensitive or radiation-sensitive composition, the step X2 is applied in a state where the coating film has not been subjected to an exposure treatment by irradiation with actinic rays or radiation, in a case where the composition is the thermosetting composition, the step X2 is applied in a state where the coating film has not been subjected to a thermosetting treatment, and the number of defects with a size of 19 nm or more derived from the removal solvent, calculated in the following defect inspection R1, is 1.50 defects/cm2 or less and greater than 0 defects/cm2, defect inspection R1:

the defect inspection R1 has the following steps ZA1 to ZA4, step ZA1: a step of measuring the number of defects with a size of 19 nm or more on a substrate ZA using the defect inspection device, step ZA2: a step of applying the removal solvent onto the substrate ZA, step ZA3: a step of measuring the number of defects with a size of 19 nm or more on the substrate ZA onto which the removal solvent has been applied, using the defect inspection device, and step ZA4: a step of calculating the number of defects with a size of 19 nm or more derived from the removal solvent by subtracting the number of the defects measured in the step ZA1 from the number of the defects measured in the step ZA3.

2. The inspection method according to claim 1, further comprising a step Y1 before the step X1, wherein the step Y1 is a step of measuring the number of defects on the substrate X using the defect inspection device with respect to the substrate X used in the step X1.

3. The inspection method according to claim 2, wherein the substrate X is a silicon wafer and the number of defects measured in the step Y1 is 0.75 defects/$cm^2$ or less.

4. The inspection method according to claim 2, wherein the substrate X is a silicon wafer and the number of defects with a size of 19 nm or more on the substrate X, measured in the step Y1, is 0.75 defects/$cm^2$ or less.

5. The inspection method according to claim 4, wherein the number of defects with a size of 19 nm or more is 0.15 defects/$cm^2$ or less.

6. The inspection method according to claim 1, further comprising:

a step Z1 of applying the removal solvent onto a substrate Z; and a step Z2 of measuring the number of defects on the substrate Z onto which the removal solvent has been applied, using the defect inspection device.

7. The inspection method according to claim 6, further comprising:

a step Z3 of measuring the number of defects on the substrate Z using the defect inspection device with respect to the substrate Z before the step Z1; and a step Z4 of calculating the number of defects derived from the removal solvent used in the step X2 by subtracting the number of the defects measured in the step Z3 from the number of the defects measured in the step Z2.

8. The inspection method according to claim 1, wherein the number of defects with a size of 19 nm or more is 0.75 defects/$cm^2$ or less.

9. The inspection method according to claim 1, wherein the organic solvent includes one or more selected from the group consisting of an ester-based organic solvent, an alcohol-based organic solvent, and a ketone-based organic solvent.

10. The inspection method according to claim 1, wherein the organic solvent includes one or more selected from the group consisting of propylene glycol monomethyl ether acetate, propylene glycol monomethyl ether, methyl amyl ketone, cyclohexanone, ethyl lactate, butyl acetate, and γ-butyrolactone.

11. The inspection method according to claim 1, wherein a removal time of the removal treatment using the removal solvent is 300 seconds or less in the step X2.

12. The inspection method according to claim 11, wherein the removal time is 60 seconds or less.

13. The inspection method according to claim 1, wherein the removal solvent includes two or more organic solvents in the step X2.

14. The inspection method for a composition selected from the group consisting of an actinic ray-sensitive or radiation-sensitive composition and a thermosetting composition according to claim 1, the inspection method comprising:

the step X1 of applying the composition onto a substrate X to form a coating film;

the step X2 of removing the coating film from the substrate X using a removal solvent including an organic solvent;

a step X3A of measuring the number of defects on the substrate X after the removal of the coating film, using the defect inspection device;

a step Y1 and a step ZX before the step X1; and a step X3E for calculating the number of defects derived from the composition, wherein in a case where the composition is the actinic ray-sensitive or radiation-sensitive composition, the step X2 is applied in a state where the coating film has not been subjected to an exposure treatment by irradiation with actinic rays or radiation, in a case where the composition is the thermosetting composition, the step X2 is applied in a state where the coating film has not been subjected to a thermosetting treatment, the step Y1 is a step of measuring the number of defects on the substrate X using the defect inspection device with respect to the substrate X, the step ZX has a step Z1 of applying the removal solvent onto a substrate ZX, a step Z2 of measuring the number of defects on the substrate ZX onto which the removal solvent has been applied, using the defect inspection device, a step Z3 of measuring the number of defects on the substrate ZX using the defect inspection device with respect to the substrate ZX, a step Z4 of calculating the number of defects derived from the removal solvent by subtracting the number of the defects measured in the step Z3 from the number of the defects measured in the step Z2, and the step X3E is carried out by subtracting the number of the defects measured in the step Y1 and the number of defects calculated in the step Z4 from the number of the defects measured in the step X3A.

15. A method for verifying a composition, including the inspection method according to claim 14, the method comprising:

a step of acquiring the number of defects derived from the composition by the inspection method; and a step of comparing the number of acquired defects with reference data to determine whether or not the number of the defects is within an acceptable range.

16. A method for producing a composition, comprising:

a step of preparing a composition selected from the group consisting of an actinic ray-sensitive or radiation-sensitive composition and a thermosetting composition; and a step of carrying out the inspection method according to claim 1.

17. The method for producing a composition according to claim 16, wherein the composition is the actinic ray-sensitive or radiation-sensitive composition.

18. A method for verifying a composition, including the inspection method according to claim 1, the method comprising:

a step of acquiring the number of defects on the substrate after the removal of the coating film by the inspection method; and a step of comparing the number of acquired defects with reference data to determine whether or not the number of the defects is within an acceptable range.

19. The method for verifying a composition according to claim 18, wherein a reference value based on the reference data is 0.75 defects/$cm^2$ or less.

20. A method for producing a composition, comprising:

a step of preparing a composition selected from the group consisting of an actinic ray-sensitive or radiation-sensitive composition and a thermosetting composition; and a step of carrying out the verifying method according to claim 18.

21. An inspection method for a composition selected from the group consisting of an actinic ray-sensitive or radiation-sensitive composition and a thermosetting composition, the inspection method comprising:

a step X1 of applying the composition onto a substrate X to form a coating film;

a step X2 of removing the coating film from the substrate X using a removal solvent including an organic solvent; and a step X3 of measuring the number of defects on the substrate X after the removal of the coating film, using a defect inspection device, wherein in a case where the composition is the actinic ray-sensitive or radiation-sensitive composition, the step X2 is applied in a state where the coating film has not been subjected to an exposure treatment by irradiation with actinic rays or radiation, in a case where the composition is the thermosetting composition, the step X2 is applied in a state where the coating film has not been subjected to a thermosetting treatment, the organic solvent includes one or more selected from the group consisting of propylene glycol monomethyl ether acetate, propylene glycol monomethyl ether, methyl amyl ketone, cyclohexanone, ethyl lactate, butyl acetate, and γ-butyrolactone, and the number of defects with a size of 19 nm or more derived from the removal solvent, calculated in the following defect inspection R1, is 1.50 defects/cm2 or less and greater than 0 defects/cm2, defect inspection R1:

the defect inspection R1 has the following steps ZA1 to ZA4, step ZA1: a step of measuring the number of defects with a size of 19 nm or more on a substrate ZA using the defect inspection device, step ZA2: a step of applying the removal solvent onto the substrate ZA, step ZA3: a step of measuring the number of defects with a size of 19 nm or more on the substrate ZA onto which the removal solvent has been applied, using the defect inspection device, and step ZA4: a step of calculating the number of defects with a size of 19 nm or more derived from the removal solvent by subtracting the number of the defects measured in the step ZA1 from the number of the defects measured in the step ZA3.

* * * * *